(12) United States Patent
Li et al.

(10) Patent No.: US 9,475,695 B2
(45) Date of Patent: Oct. 25, 2016

(54) PRINTABLE INKS WITH SILICON/GERMANIUM BASED NANOPARTICLES WITH HIGH VISCOSITY ALCOHOL SOLVENTS

(71) Applicant: NanoGram Corporation, Milpitas, CA (US)

(72) Inventors: Weidong Li, San Jose, CA (US); Masaya Soeda, San Jose, CA (US); Gina Elizabeth Pengra-Leung, San Jose, CA (US); Shivkumar Chiruvolu, San Jose, CA (US)

(73) Assignee: NanoGram Corporation, Milpitas, CA (US)

(*) Notice: Subject to any disclaimer, the term of this patent is extended or adjusted under 35 U.S.C. 154(b) by 56 days.

(21) Appl. No.: 14/282,216

(22) Filed: May 20, 2014

(65) Prior Publication Data
US 2014/0346436 A1 Nov. 27, 2014

Related U.S. Application Data

(60) Provisional application No. 61/827,340, filed on May 24, 2013.

(51) Int. Cl.
*H01B 1/20* (2006.01)
*B82Y 30/00* (2011.01)
*H01B 1/24* (2006.01)
*H01L 21/02* (2006.01)
*H01L 29/06* (2006.01)
*H01L 21/22* (2006.01)
*H01L 21/228* (2006.01)
*H01L 31/068* (2012.01)
*H01L 31/18* (2006.01)
*C09D 11/037* (2014.01)
*C09D 11/52* (2014.01)
*H01L 21/268* (2006.01)

(52) U.S. Cl.
CPC ............ *B82Y 30/00* (2013.01); *C09D 11/037* (2013.01); *C09D 11/52* (2013.01); *H01B 1/20* (2013.01); *H01B 1/24* (2013.01); *H01L 21/02532* (2013.01); *H01L 21/02601* (2013.01); *H01L 21/02625* (2013.01); *H01L 21/228* (2013.01); *H01L 21/2225* (2013.01); *H01L 29/0665* (2013.01); *H01L 31/0682* (2013.01); *H01L 31/1804* (2013.01); *H01L 21/268* (2013.01); *Y02E 10/547* (2013.01); *Y02P 70/521* (2015.11)

(58) Field of Classification Search
CPC .......... H01B 1/20; H01B 1/24; B82Y 30/00; C09D 11/30; C09D 11/52
USPC .............. 252/521.3; 106/31.12, 31.92
See application file for complete search history.

(56) References Cited

U.S. PATENT DOCUMENTS

| | | |
|---|---|---|
| 3,499,937 A | 3/1970 | Dorsky et al. |
| 3,645,939 A | 2/1972 | Gaylord |
| 4,061,686 A | 12/1977 | Hall et al. |
| 4,071,494 A | 1/1978 | Gaylord |
| 4,119,575 A | 10/1978 | Bloomfield et al. |
| 4,317,762 A | 3/1982 | Kratel et al. |
| 4,330,358 A | 5/1982 | Grabmaier et al. |
| 4,390,743 A | 6/1983 | Dahlberg |
| 4,425,384 A | 1/1984 | Brownscombe |
| 4,450,101 A | 5/1984 | Sprecker et al. |
| 4,478,963 A | 10/1984 | McGarry |
| 4,582,945 A | 4/1986 | Brunke et al. |
| 4,595,749 A | 6/1986 | Hoxmeier |
| 4,604,488 A | 8/1986 | Fujikura et al. |
| 4,693,844 A | 9/1987 | Inoue et al. |
| 4,786,477 A | 11/1988 | Yoon et al. |
| 4,828,695 A | 5/1989 | Yamamura et al. |
| 4,947,219 A | 8/1990 | Boehm |
| 4,972,008 A | 11/1990 | Lee et al. |
| 5,132,248 A | 7/1992 | Drummond et al. |
| 5,179,185 A | 1/1993 | Yamamoto et al. |
| 5,262,357 A | 11/1993 | Alivisatos et al. |
| 5,372,749 A | 12/1994 | Li et al. |
| 5,374,413 A | 12/1994 | Kim et al. |
| 5,429,708 A | 7/1995 | Linford et al. |
| 5,489,449 A | 2/1996 | Umeya et al. |
| 5,491,114 A | 2/1996 | Goldstein |
| 5,559,057 A | 9/1996 | Goldstein |
| 5,565,188 A | 10/1996 | Wong et al. |

(Continued)

FOREIGN PATENT DOCUMENTS

| | | |
|---|---|---|
| CH | 423058 | 10/1966 |
| CN | 101197259 A | 6/2008 |

(Continued)

OTHER PUBLICATIONS

Machine translation of JP 2012256500, 2015.*

(Continued)

*Primary Examiner* — Khanh Tuan Nguyen
*Assistant Examiner* — Haidung Nguyen
(74) *Attorney, Agent, or Firm* — Dardi & Herbert, PLLC; Peter S. Dardi

(57) ABSTRACT

Silicon based nanoparticle inks are formulated with viscous polycyclic alcohols to control the rheology of the inks. The inks can be formulated into pastes with non-Newtonian rheology and good screen printing properties. The inks can have low metal contamination such that they are suitable for forming semiconductor structures. The silicon based nanoparticles can be elemental silicon particles with or without dopant.

17 Claims, 15 Drawing Sheets

(56) References Cited

U.S. PATENT DOCUMENTS

| | | |
|---|---|---|
| 5,576,248 A | 11/1996 | Goldstein |
| 5,695,617 A | 12/1997 | Graiver et al. |
| 5,801,108 A | 9/1998 | Huang et al. |
| 5,811,030 A | 9/1998 | Aoki |
| 5,850,064 A | 12/1998 | Goldstein |
| 5,866,471 A | 2/1999 | Beppu et al. |
| 5,958,348 A | 9/1999 | Bi et al. |
| 5,990,479 A | 11/1999 | Weiss et al. |
| 6,005,707 A | 12/1999 | Berggren et al. |
| 6,007,869 A | 12/1999 | Schreieder et al. |
| 6,086,945 A | 7/2000 | Kamata et al. |
| 6,100,464 A | 8/2000 | Priesemuth |
| 6,136,905 A | 10/2000 | Suzuki et al. |
| 6,268,041 B1 | 7/2001 | Goldstein |
| 6,270,732 B1 | 8/2001 | Gardner et al. |
| 6,281,427 B1 | 8/2001 | Mitsuhiro et al. |
| 6,287,925 B1 | 9/2001 | Yu |
| 6,348,295 B1 | 2/2002 | Griffith et al. |
| 6,403,382 B1 | 6/2002 | Zhu et al. |
| 6,416,721 B1 | 7/2002 | Sanjurjo et al. |
| 6,476,098 B1 | 11/2002 | Arakawa et al. |
| 6,531,191 B1 | 3/2003 | Notenboom |
| 6,552,405 B2 | 4/2003 | Sugawara et al. |
| 6,585,947 B1 | 7/2003 | Nayfeh et al. |
| 6,586,785 B2 | 7/2003 | Flagan et al. |
| 6,599,631 B2 | 7/2003 | Kambe et al. |
| 6,712,999 B2 | 3/2004 | Haering et al. |
| 6,727,645 B2 | 4/2004 | Tsujimura et al. |
| 6,752,979 B1 | 6/2004 | Talbot et al. |
| 6,759,711 B2 | 7/2004 | Powell |
| 6,761,816 B1 | 7/2004 | Blackburn et al. |
| 6,793,724 B2 | 9/2004 | Satoh et al. |
| 6,794,265 B2 | 9/2004 | Lee et al. |
| 6,808,577 B2 | 10/2004 | Miyazaki et al. |
| 6,821,329 B2 | 11/2004 | Choy |
| 6,846,565 B2 | 1/2005 | Korgel et al. |
| 6,849,334 B2 | 2/2005 | Horne et al. |
| 6,878,184 B1 | 4/2005 | Rockenberger et al. |
| 6,881,490 B2 | 4/2005 | Kambe et al. |
| 6,902,781 B2 | 6/2005 | Endo et al. |
| 6,911,385 B1 | 6/2005 | Haubrich et al. |
| 6,918,946 B2 | 7/2005 | Korgel et al. |
| 6,998,288 B1 | 2/2006 | Smith et al. |
| 7,001,578 B2 | 2/2006 | Nayfeh et al. |
| 7,029,632 B1 | 4/2006 | Weidhaus et al. |
| 7,038,655 B2 | 5/2006 | Herb et al. |
| 7,045,851 B2 | 5/2006 | Black et al. |
| 7,057,206 B2 | 6/2006 | Halik et al. |
| 7,067,069 B2 | 6/2006 | Shiho et al. |
| 7,067,337 B2 | 6/2006 | Yudasaka et al. |
| 7,078,276 B1 | 7/2006 | Zurcher et al. |
| 7,135,350 B1 | 11/2006 | Smith et al. |
| 7,173,180 B2 | 2/2007 | Shiho et al. |
| 7,229,859 B2 | 6/2007 | Yudasaka et al. |
| 7,267,721 B2 | 9/2007 | Kauzlarich et al. |
| 7,384,680 B2 | 6/2008 | Bi et al. |
| 7,473,443 B2 | 1/2009 | Matsuki et al. |
| 7,521,340 B2 | 4/2009 | Lemmi et al. |
| 7,575,784 B1 | 8/2009 | Bi et al. |
| 7,615,393 B1 | 11/2009 | Shah et al. |
| 7,718,707 B2 | 5/2010 | Kelman et al. |
| 7,767,032 B2 | 8/2010 | Sheng et al. |
| 7,852,435 B2 | 12/2010 | Fujisawa et al. |
| 7,892,872 B2 | 2/2011 | Hieslmair et al. |
| 8,188,991 B2 | 5/2012 | Ohhashi et al. |
| 8,314,176 B2 | 11/2012 | Du et al. |
| 8,348,134 B2 | 1/2013 | Komatsu |
| 8,404,771 B2 | 3/2013 | Du et al. |
| 8,409,976 B2 | 4/2013 | Hieslmair |
| 8,435,477 B2 | 5/2013 | Kambe et al. |
| 8,623,951 B2 | 1/2014 | Kambe |
| 8,632,702 B2 | 1/2014 | Hieslmair et al. |
| 9,006,720 B2 | 4/2015 | Chiruvolu et al. |
| 9,175,174 B2 | 11/2015 | Kambe |
| 2001/0051118 A1 | 12/2001 | Mosso et al. |
| 2002/0074547 A1 | 6/2002 | Yudasaka et al. |
| 2002/0137260 A1 | 9/2002 | Leung et al. |
| 2003/0003300 A1 | 1/2003 | Korgel et al. |
| 2003/0031438 A1 | 2/2003 | Kambe et al. |
| 2003/0045632 A1 | 3/2003 | Shiho et al. |
| 2003/0091647 A1 | 5/2003 | Lewis et al. |
| 2003/0190763 A1 | 10/2003 | Cok et al. |
| 2003/0222315 A1 | 12/2003 | Amundson et al. |
| 2005/0008880 A1 | 1/2005 | Kunze et al. |
| 2005/0145163 A1 | 7/2005 | Matsuki et al. |
| 2005/0170192 A1 | 8/2005 | Kambe et al. |
| 2005/0200036 A1 | 9/2005 | Mosso et al. |
| 2006/0094189 A1 | 5/2006 | Zurcher et al. |
| 2006/0137567 A1 | 6/2006 | Yadav |
| 2006/0157677 A1 | 7/2006 | Kunze et al. |
| 2006/0237719 A1 | 10/2006 | Colfer et al. |
| 2006/0267776 A1 | 11/2006 | Taki et al. |
| 2007/0003694 A1 | 1/2007 | Chiruvolu et al. |
| 2007/0094757 A1 | 4/2007 | Pridohl et al. |
| 2007/0212510 A1 | 9/2007 | Hieslmair et al. |
| 2007/0295957 A1 | 12/2007 | Lee et al. |
| 2008/0083926 A1 | 4/2008 | Ostergard |
| 2008/0138966 A1 | 6/2008 | Rogojina et al. |
| 2008/0152938 A1 | 6/2008 | Kelman et al. |
| 2008/0160265 A1 | 7/2008 | Hieslmair et al. |
| 2008/0171425 A1 | 7/2008 | Poplavskyy et al. |
| 2008/0191193 A1 | 8/2008 | Li et al. |
| 2008/0202576 A1 | 8/2008 | Hieslmair |
| 2008/0220175 A1 | 9/2008 | Mangolini et al. |
| 2008/0305619 A1 | 12/2008 | Lemmi et al. |
| 2009/0020411 A1 | 1/2009 | Holunga et al. |
| 2009/0026421 A1 | 1/2009 | Li et al. |
| 2009/0071539 A1 | 3/2009 | Choi et al. |
| 2009/0263977 A1 | 10/2009 | Rogojina et al. |
| 2009/0269913 A1 | 10/2009 | Terry et al. |
| 2010/0007025 A1 | 1/2010 | Nakagawa et al. |
| 2010/0062338 A1 | 3/2010 | Golightly et al. |
| 2010/0136771 A1 | 6/2010 | Kim et al. |
| 2010/0216299 A1 | 8/2010 | Poplavskyy et al. |
| 2010/0294349 A1 | 11/2010 | Srinivasan et al. |
| 2011/0012066 A1 | 1/2011 | Kim et al. |
| 2011/0120537 A1 | 5/2011 | Liu et al. |
| 2011/0135928 A1 | 6/2011 | Ravilisetty et al. |
| 2011/0318905 A1 | 12/2011 | Chiruvolu et al. |
| 2012/0012032 A1 | 1/2012 | Bi et al. |
| 2012/0193769 A1 | 8/2012 | Liu et al. |
| 2012/0318168 A1 | 12/2012 | Hieslmair et al. |
| 2013/0012636 A1 | 1/2013 | Kambe et al. |
| 2013/0105806 A1 | 5/2013 | Liu et al. |
| 2013/0189831 A1 | 7/2013 | Li et al. |

FOREIGN PATENT DOCUMENTS

| | | |
|---|---|---|
| EP | 1054035 A2 | 11/2000 |
| EP | 2267055 A1 | 12/2010 |
| GB | 1084235 | 9/1997 |
| JP | 64-026640 | 1/1989 |
| JP | 03-095269 | 4/1991 |
| JP | 05-254883 | 10/1993 |
| JP | 05-261267 | 10/1993 |
| JP | 06-091162 | 4/1994 |
| JP | 06-142496 | 5/1994 |
| JP | 07-008792 | 1/1995 |
| JP | 09-272706 | 10/1997 |
| JP | 10-45409 A | 2/1998 |
| JP | 11-171947 | 6/1999 |
| JP | 2000-026692 | 1/2000 |
| JP | 2000-219901 | 8/2000 |
| JP | 2000-279817 | 10/2000 |
| JP | 2000-282222 | 10/2000 |
| JP | 2001-011119 | 1/2001 |
| JP | 2002-270546 A | 9/2002 |
| JP | 2003-096338 A | 4/2003 |
| JP | 2005-093307 A | 4/2005 |
| JP | 2005-203360 A | 7/2005 |
| JP | 2005-328030 | 11/2005 |
| JP | 2006-321876 A | 11/2006 |
| JP | 2009-246213 | 10/2009 |
| JP | 2010-109352 | 5/2010 |

(56) References Cited

FOREIGN PATENT DOCUMENTS

| | | |
|---|---|---|
| JP | 2012256500 | * 12/2012 |
| KR | 10-2011-0057844 | 6/2011 |
| WO | 01/32799 A | 5/2001 |
| WO | 2005/013337 | 2/2005 |
| WO | 2005/049492 | 6/2005 |
| WO | 2006/009881 | 1/2006 |
| WO | 2007/023362 | 3/2007 |
| WO | 2007/072162 | 6/2007 |
| WO | 2007/117265 | 10/2007 |
| WO | 2008/030966 | 3/2008 |
| WO | 2008/039757 | 4/2008 |
| WO | 2008/061131 | 5/2008 |
| WO | 2008/073763 | 6/2008 |
| WO | 2008/091393 | 7/2008 |
| WO | 2008/118865 | 10/2008 |
| WO | 2008/137738 | 11/2008 |
| WO | 2008/143716 | 11/2008 |
| WO | 2008/152272 | 12/2008 |
| WO | 2009/032359 | 3/2009 |
| WO | 2009/090355 | 7/2009 |
| WO | 2009/114026 | 9/2009 |
| WO | 2009/117007 | 9/2009 |
| WO | 2012/172414 | 12/2012 |

OTHER PUBLICATIONS

Search Report and Written Opinion for so-pending interenational application PCT/US2014/038721, dated Oct. 23, 2014 (17 pages).

Brunauer et al., "Absorption of Gases in Multimolecular Layers," J. Am. Chem. Soc. vol. 60, p. 309-319 (1938).

Cannon et al, "Sinterable Ceramic Powders from Laser-Driven Reactions: I, Process Description and Modeling," J Am. Ceramic Society 65 (7):324-329 (1982).

Cannon et al, "Sinterable Ceramic Powders from Laser-Driven Reactions: II, Powder Characteristics and Process Variables," J. Am. Ceramic Society 65(7):330-335 (1982).

Goldstein et al., "Observation of Melting in 30 Å Diameter CdS Nanocrystals", Mat. Res. Soc. Symp. Proc., 206:271-274 (1991).

Hoornstra et al, "The Importance of Paste Rheology in Improving Fine Line, Thick Film Screen Printing of Front Side Metallization," Netherlands Energy Research Foundation ECN, 4 pages (1997).

Koglin, "Assessment of the Degree of Agglomeration in Suspensions," Powder Technology 17(2):219-227 (Jul. 1, 1977).

Ostraat et al., "The Feasibility of Inert Colloidal Processing of Silicon Nanoparticles," J. of Colloidal and Interface Science, 283:414-421 (2005).

Thomas, "The Determination of Log Normal Particle Size Distributions by Dynamic Light Scattering", Journal of Colloid and Interface Science, 117(1):187-192 (May 1987).

Erogbogbo et al., "Creating Ligand-Free Silicon Germanium Alloy Nanocrystal Inks," ACS Nano, 5(10):7950-7959, ( Oct. 2011).

Holman et al, "Nanocrystal inks without ligands : Stable colloids of bare germanium nanocrystals," Nano Letters, 11(5):2133-2136, (May 2011).

Kwon et al., "Screen printed phosphorus diffusion for low-cost and simplified industrial mono-crystalline silicon solar cells," Solar Energy Materials and Solar Cells, 95(1):14-17, (Jan. 2011).

* cited by examiner

Fig. 10     Fig. 11
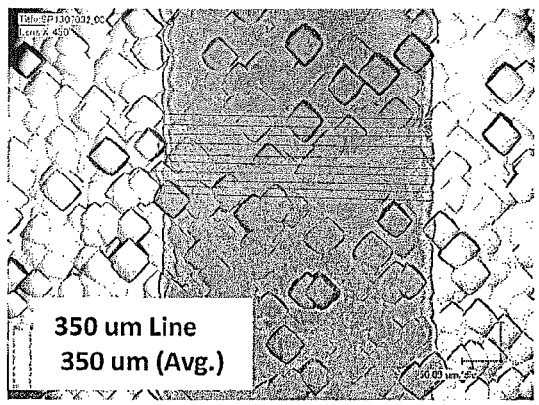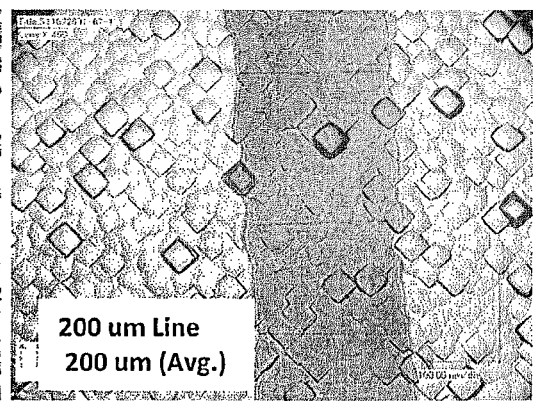
Fig. 12     Fig. 13
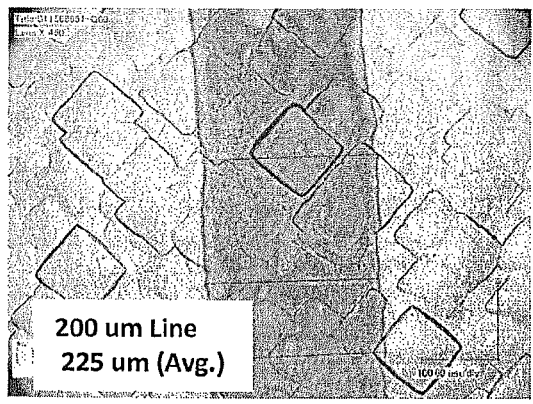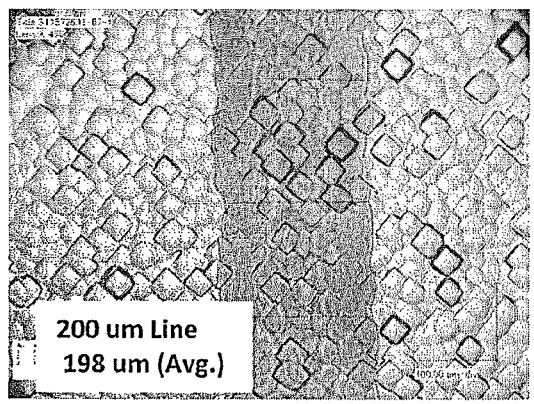

PRINTABLE INKS WITH SILICON/GERMANIUM BASED NANOPARTICLES WITH HIGH VISCOSITY ALCOHOL SOLVENTS

CROSS REFERENCE TO RELATED APPLICATIONS

This application claims priority to copending U.S. provisional patent application 61/827.340 filed May 24, 2013 to Li et al., entitled "Printable Inks With Silicon/Germanium Based Nanoparticles With High Viscosity Alcohol Solvents," incorporated herein by reference.

FIELD OF THE INVENTION

The invention relates to silicon/germanium based nanoparticle inks with desirable formulations for printing. The invention further relates to methods for forming and using such ink. The inks can have a very low metal impurity level.

BACKGROUND OF THE INVENTION

Silicon-based materials are important commercial materials. In particular, elemental silicon is a widely used semiconductor material for electronic and solar cell applications. The semiconducting properties and electron mobilities of silicon can be altered using dopants. The formation of semiconductor devices generally involves the formation of regions of the device with selectively doped silicon in which the dopants alter the electrical conduction properties or other desired properties. Through the selected doping process different domains of the device can be formed that provide functionalities for particular device to exploit the semiconductor properties, such as a diode junction formed with separate materials with a p-type dopant and an n-type dopant. For example, n-type dopants provide excess electrons that can populate the conduction bands, and the resulting materials are referred to as n-type semiconductors. P-type dopants provide electron deficiencies or holes and are used to form p-type semiconductors. Through appropriate doping, a wide range of devices can be formed, such as transistors, diodes and the like. Silicon oxides, silicon nitrides and silicon oxynitrides can be used as dielectric materials, and these materials can be particularly desirable for use along with silicon semiconductors for their compatibility and lack of metals that can migrate to a silicon semiconductor.

In general, processing costs are a significant consideration for commercial applications. It can be desirable to use printing approaches for moderate resolution applications since commercial printing equipment is available and processing costs can be reasonable. Screen printing is a widely used printing technique commercially. Screen printing is generally performed with a paste with a range of acceptable rheological properties consistent with the screen printer. Other commercially compatible deposition approached include, for example, inkjet printing, spin coating, spray coating, knife edge coating and the like.

The wide ranges of semiconductor applications generate commercial relevance for silicon materials in many forms. For example, the formation of large area thin film transistors or the like generates a demand for alternative semiconductor processing approaches. Also, with increasing energy costs and increasing demand for energy, the market for solar cells has been correspondingly increasing. A majority of commercial solar cells comprise photoconducting silicon semiconductors, and differential doping of the semiconductor facilitates harvesting of the photocurrent. Some solar cells have patterning of silicon doping for the formation of doped contacts along the horizontal plane of the device. Thin film silicon solar cells can have dopant variation in a vertical orientation relative to the plane of the device. With increasing performance demands, there are pressures to keep costs down so that improvements in material processing is very desirable as an approach to address performance issues while keeping costs at acceptable levels. Germanium is a semiconducting material that can be an alternative to silicon with similar semiconducting properties. Also, silicon and germanium can form semiconducting alloys with each other.

SUMMARY OF THE INVENTION

In a first aspect, the invention pertains to a nanoparticle ink comprising at least 0.001 weight percent silicon/germanium based nanoparticles, at least about 10 weight percent of a viscous polycyclic alcohol, wherein the viscous polycyclic alcohol has a boiling point of no more than about 450° C.

In a further aspect, the invention pertains to a nanoparticle paste comprising from about 0.05 to about 10 weight percent silicon/germanium based nanoparticles, having no more than about 0.1 weight percent polymer, having a viscosity of at least about 1 Pa·s at a shear of 2 s$^{-1}$ and non-Newtonian rheology.

In additional aspects, the invention pertains to a method of depositing silicon/germanium nanoparticles on a substrate surface. In some embodiments, the method comprises screen printing a paste comprising silicon/germanium based nanoparticles and no more than about 1 weight percent polymer, onto a surface of the substrate, and heating the screen printed substrate to a temperature of no more than about 450° C. in a substantially oxygen free atmosphere to form a deposit, which in some embodiments may have no more than a 5 atomic percent carbon. In some embodiments, the method can further comprise heating the substrate with the deposit to a temperature from about 750° C. to about 1200° C. to drive dopant into the substrate surface. The deposit can be covered when heated, such as with a capping layer. In additional or alternative embodiments, the method can comprise irradiating a laser onto the substrate to strike the deposit and drive dopant into the substrate surface.

In other aspects, the invention pertains to a coated substrate comprising an elemental silicon/germanium nanoparticle deposit on as surface of the substrate having no more than about 5 atomic percent carbon and having a sheet resistance of no more than about 200 ohms/sq.

BRIEF DESCRIPTION OF THE DRAWINGS

FIG. 10 is an optical image of an average 350 micron (um) width line formed by screen printing a boron doped silicon nanoparticle paste onto a silicon substrate with a 350 um screen line opening.

FIG. 11 is an optical image of an average 200 um width line formed by screen printing a boron doped silicon nanoparticle paste onto a silicon substrate with a 200 um screen line opening.

FIG. 12 is an optical image of an average of 225 um width line formed by screen printing a boron doped silicon nanoparticle paste onto a silicon substrate with a 200 um screen line opening.

FIG. 13 is an optical image of an average of 198 um width line formed by screen printing a boron doped silicon nanoparticle paste onto a silicon substrate with a 200 um screen line opening.

DETAILED DESCRIPTION

Figure 1:
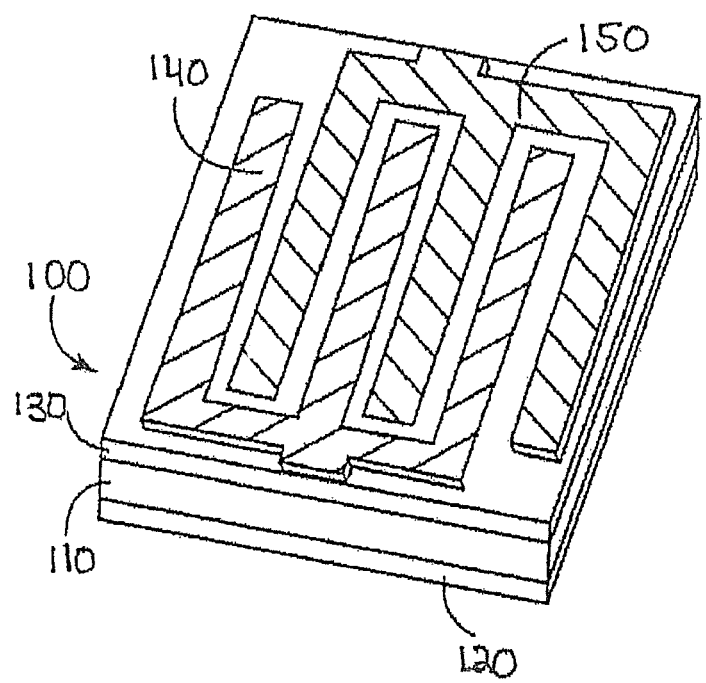
FIG. 1 is a bottom perspective view of a back contact photovoltaic cell.

Viscous silicon based nanoparticle ink compositions can achieve desirable printing properties, e.g., non-Newtonian rheology, through the inclusion of a viscous polycyclic alcohol. The deposition of silicon based nanoparticles using printable inks, e.g., pastes, can involve the engineering of the inks to result in a desirable nanoparticle deposit. In some embodiments, a very low metal contamination is desired, and the use of certain viscous polycyclic alcohols can be used to control ink properties without introduction of significant metal contamination. Nanoparticle pastes for screen printing are generally desired to be non-Newtonian fluids so that the paste is stable in the printer and following printing, but can be delivered through the application of shear through the screen without significant clogging. Viscous polycyclic alcohols can provide appropriate non-Newtonian fluid behavior, with a suitably low boiling point so that the viscous alcohols can be efficiently and effectively removed. The new ink formulations provide for the formation of thin and uniform nanoparticle deposits that can be consolidated into a low sheet resistance material. Very good properties can be obtained with dopant drive in and incorporation of the fused nanoparticles as part of a doped contact region.

Silicon based materials for semiconductor and similar applications may be processed to form a material with low levels of carbon, so if the material is delivered with a carbon based material, it can be desirable to remove the carbon based composition during processing to leave low residual carbon contamination. It has been found that viscous non-Newtonian alcohols, such as polycyclic alcohols, can serve this function and desirable inks can be formulated with little or no polymers, which have been used to provide screen printing pastes with desirable rheological properties. For screen printing, silicon nanoparticle pastes can be formulated without polymers that exhibit good printing characteristics, low spread of the printed paste and little if any screen clogging. Based on the new formulations for the inks, inks can be formed that can be produced in a readily scalable fashion, with very low contamination with metals in the parts per billion range and with convenient design of the deposit characteristics. The viscous polycyclic alcohol based inks are particularly desirable for semiconductor applications, such as printed circuits and solar cells.

The inks generally comprise selected quantities of silicon based nanoparticles, for example, elemental silicon nanoparticles, silicon oxide nanoparticles, silicon nitride nanoparticles or combinations thereof. The nanoparticles may or may not be doped. The nanoparticles can be amorphous, crystalline or polycrystalline. In some embodiments, the inks may be formulated essentially for the delivery of the silicon based nanoparticles along a substrate surface, and other components of the ink can be removed following deposition to leave the nanoparticles as a deposit on the surface. The nanoparticles generally have an average particle size of no more than about 100 nanometers (nm). In general, the inks comprise from about 0.05 weight percent to about 25 weight percent nanoparticles. Additional ink components are generally selected to provide desired characteristics of the inks to provide for printing, coating or other delivery approaches.

The inks described herein incorporating viscous polycyclic alcohols provide desirable features with respect to ink formation, ink design and properties, characteristics of the nanoparticle deposits and processing of the nanoparticle deposits for device formation. In terms of formulating the inks, e.g., pastes, the viscous alcohols blend readily with nanoparticle dispersions. For screen printing pastes, the viscous alcohols provide for good ink rheology at low nanoparticle concentrations if desired. In general, the rheology of the inks can be selected flexibly with the viscous polycyclic alcohols so that ink properties can be adjusted over desirable ranges. Pastes formed with the viscous alcohols can be dried to form dense nanoparticle deposits. Since the viscous alcohols can be selected with modest boiling points consistent with desirable rheological properties, the alcohols can be removed effectively at relatively low temperatures, e.g., no more than about 450° C. Thus, the viscous alcohols can be effectively removed in an oxygen free environment to leave deposits with low carbon contamination. The viscous alcohols can be provided with low metal contamination so that the nanoparticle inks can be processing into structures with both low metal contamination and low carbon contamination. The viscous alcohols can provide a convenient and efficient alternative to polymer additives to control viscosity to form structures with very low metal contamination and effective removal of organic components.

The nanoparticle inks of particular interest generally comprises silicon/germanium-based nanoparticles, a solvent, which can comprise a blend of solvent compounds, and a viscous polycyclic alcohol, e.g. a non-Newtonian liquid, which can be selected in an amount to adjust the paste properties. Generally, the nanoparticles are selected based on desired properties for the nanoparticle deposit and the corresponding ink properties. Solvent refers to a liquid(s) in the inks distinct from the viscous polycyclic alcohol, and the solvents are generally Newtonian fluids. The viscous polycyclic alcohol can be a liquid or solid at room temperature, and solids at room temperature generally melt at temperatures modestly above room temperature. Also, viscous polycyclic alcohols are generally miscible in the solvent, so that the blend is a liquid at room temperature even if the viscous polycyclic alcohol is a solid at room temperature. The metal contamination of the various components as well as the processing of the inks are each important to achieve the objectives of the ink with an extremely low metal contamination level. In general, the solvent properties can be selected based on compatibility with the other ink components, rheology properties of the ink, printing properties, compatibility with printer components, and post printing processing conditions and target properties. For example, in some paste formulations, a lower boiling solvent is combined with a higher boiling solvent so that the lower boiling solvent can evaporate at least partially in the printing process or thereafter to stabilize the printed paste and to limit spreading of the printed paste.

The nanoparticles generally have an average diameter of no more than about 100 nm and smaller average particle sizes can be desirable as described further below. In some embodiments, the nanoparticles can be highly uniform with respect to size and/or composition, although blends of nanoparticles can be desirable for some embodiments. Also, the nanoparticles can be highly dispersible in an appropriate solvent such that the nanoparticles can have a desirable secondary particle size in the dispersion. Properly formed nanoparticle dispersions can be incorporated into a paste or other nanoparticle inks to obtain desirable paste uniformity and printability.

Silicon/germanium refers herein, including the claims, to elemental silicon, elemental germanium, alloys thereof or mixtures thereof. Similarly, the use of silica or germania nanoparticles are described in some embodiments, and silica/germania refers herein, including the claims, to silica (silicon oxide), germania (germanium oxide), combinations thereof and mixtures thereof. The discussion of silica herein generally can correspondingly apply to germania based on the similarities of the compositions. In addition, silicon/germanium nitrides and silicon/germanium oxynitrides correspondingly refer to silicon nitrides, silicon oxynitrides, germanium nitrides, germanium oxynitrides, combinations thereof and mixtures thereof. While the discussion below focuses on silicon based nanoparticles, the analogous processing of and compositions with germanium and alloys of silicon and germanium follows from the discussion based on the similar chemistries of the elements. To simplify the discussion, elemental germanium, germanium compounds and alloys of germanium with silicon are generally not explicitly discussed, and references to silicon based compounds generally apply similarly to germanium based compounds.

The silicon based nanoparticles can be synthesized by any appropriate technique. For example, silicon oxide nanoparticles can be synthesized by sol-gel processes, flame pyrolysis, and thermal pyrolysis. Also, elemental silicon nanoparticles can be synthesized by plasma techniques such as described in U.S. Pat. No. 7,718,707 to Kelman et al., entitled "Method for Preparing Nanoparticle Thin Films," incorporated herein by reference.

Laser pyrolysis is a desirable approach for the synthesis of silicon based nanoparticles with a desired composition and extremely low metal contamination. In particular, laser pyrolysis can be useful for the synthesis of silicon based nanoparticles with desired stoichiometry as well as a desired doping including high doping levels. Laser pyrolysis uses an intense light beam to drive a reaction that can be designed to form highly uniform silicon based nanoparticles with desirable characteristics. The particles are synthesized in a flow that initiates at a reactant nozzle and ends at a collection system. Dopant levels can be adjusted using dopant precursors within the reactant stream. Particle sizes can be adjusted by correspondingly adjusting the synthesis conditions during laser pyrolysis. For the formation of high quality inks, it is generally desirable to synthesize nanoparticles having an average primary particle size of no more than about 100 nm. Laser pyrolysis can be used to form very uniform primary particle sizes, optionally with a desired dopant level. The uniform nanoparticles can be well dispersed in the inks at relatively high concentrations, and the properties of the inks can be controlled to be suitable for a selected deposition process.

In the laser pyrolysis process, to obtain incorporation of the dopant element into the product particles, the dopant elements can be delivered into the reactant stream as a suitable precursor composition along with the silicon precursor. In general, the reactant stream can comprise vapor precursors and/or aerosol precursors, although for silicon materials highly pure gaseous precursors can be desirable to achieve high purity of the product particles. Laser pyrolysis can be used to form doped silicon particles with a wide range of selected dopants or combinations of dopants, and high dopant levels can be achieved. The ability to achieve high dopant levels make the corresponding inks particularly desirable for applications where dopants are transferred to a semiconducting material or for the formation of devices with these high dopant levels. The high dopant levels can be achieved while also having control of average particle sizes, low impurity levels and while achieving dispersible particle with good uniformity. For the doping of semiconductor substrates, desirable dopants include, for example, B, P, Al, Ga, As, Sb and combinations thereof. The general use of laser pyrolysis for the formation of a range of materials is described in published U.S. Pat. No. 7,384,680 to Bi et al., entitled "Nanoparticle-Based Power Coatings and Corresponding Structures," incorporated herein by reference.

The dispersions of the silicon based nanoparticles can be formed at high concentrations, and the properties of the dispersions can be engineered over desirable ranges based on particular applications. The characteristics of the dispersion can be evaluated through an examination of secondary particle properties, such as Z-average particle size and particle size distribution, measured in the dispersion using generally light scattering, which are measures of the size of the dispersed particles in the liquid. In particular, good dispersions can be characterized with respect to the secondary particle sizes and distributions. Also, it has been found that rheology properties can provide further information on the ink properties that do not seem to be reflected in the secondary particle size measurements.

Also, silicon oxide nanoparticles can be stably dispersed at relatively high concentrations. The silicon oxide nanoparticles can be optionally surface modified with a suitable composition to facilitate dispersion. The dispersion of silicon oxide nanoparticles is described further in U.S. Pat. No. 7,892,872 to Hieslmair et al., entitled "Silicon/Germanium Oxide Particle Inks, Inkjet Printing and Processes for Doping Semiconductor Substrates," incorporated herein by reference. The dispersion of silicon nitride nanoparticles is described in published PCT patent application WO 01/32799A to Reitz et al., entitled "Particle Dispersions," incorporated herein by reference.

An initial good dispersion can be formed with the silicon based nanoparticles in an appropriate solvent to form the good dispersion, and the solvent or solvent blend can be manipulated to form an overall ink, i.e., a dispersion formulated for a particular deposition process, with selected properties while maintaining the good dispersion or stable ink with the nanoparticles. Specifically, techniques have been developed for versatile exchange of solvents or formation of solvent blends such that a desirable solvent system can be selected for a particular printing approach. Particle concentrations can be correspondingly adjusted to desired values. With the ability to provide highly uniform silicon based nanoparticles in high concentration dispersions with selected solvents, inks can be formulated that can be printed using desirable approaches.

To further remove contaminants in the formation of the silicon based nanoparticle dispersions, centrifugation can be used to remove contaminants from the dispersions with the silicon based nanoparticles remaining disbursed in the liquid. Thus, for example, in nanoparticle dispersions with relatively high particle concentrations most metal concentrations can be reduced to levels of no more than about 20 parts per billion by weight (ppb) for inks with about 10 weight percent particle concentration, and total metal contamination can be reduced to levels of no more than about 100 ppb by weight dispersion.

The engineering of a desired silicon ink can involve several parameters. A starting point for ink formulations can involve the formation of well dispersed silicon-based nanoparticles. Once the particles are well dispersed, the resulting dispersion can be appropriately modified to form a selected ink. Solvent can be removed by evaporation to increase the particle concentration, and/or solvent or solvents can be added to form a solvent blend or a lower concentration of the particles in the dispersion. A good dispersion is characterized by the nanoparticles remaining suspended, with no significant particle settling, for at least an hour without application of additional mixing, although generally dispersions of interest are stable for extended period of time.

It has been found that appropriate characterization of dispersions generally involves several properties to provide sufficient information to evaluate the significant functional characteristics of the inks. In particular, measurements of dispersed secondary particle sizes do not correlate fully with the printing properties once the quality of the ink has achieved a relatively good level. But rheology measurements can provide further information relating to the handling of the inks in a deposition context. As is conventional in the art, references to viscosity without explicit indication of a shear rate imply that the viscosity measurements are at a low shear limit, which can be effectively expressed as a shear of $2\ s^{-1}$. Also unless indicated otherwise, viscosity measurements are made at room temperature, e.g., 20-25° C. Thus, appropriate rheology measurements can be effectively used to provide further significant characteristics of the inks along with primary particles size measurements, secondary particle size measurements, and compositions of the inks.

The design of a silicon based nanoparticle ink can balance several objectives. The selected deposition technique can provide boundaries on the parameters of the ink properties. For some silicon ink formulations, the inks can have a relatively large nanoparticle concentration, but lower concentrations can be desirable of a lower amount of nanoparticle coverage from the deposition is desired. Also, the quality of the resulting silicon nanoparticle deposit, such as the uniformity, smoothness and the like, can also be dependent on the subtle aspects of the ink characteristics. The rheology of the ink can be tested to help to estimate the quality of the ink with respect to resulting deposition. With improved processing techniques and ink formulations described herein, the inks can be formulated with high silicon based particle concentrations and with desirable rheological properties.

Suitable inks are described for coating deposition or printing, which generally involves a patterning during deposition. Suitable printing inks can be formulated for inkjet printing, gravure printing and screen printing. Suitable coating techniques include, for example, spin coatings, spray coating, knife edge coating and the like. Other inks can be similarly formulated based on this teaching. To obtain desired thickness of deposited inks, a coating or printing process can be repeated to form multiple layers of the ink with a corresponding greater thickness.

The discussion herein focuses on the formation of inks with viscous polycyclic alcohols added to adjust the ink properties. In particular, highly pure inks, such as screen printing pastes, can be formed with very low metal contamination, in which the inks have appropriate amounts of viscous alcohols to influence the rheology. In particular, screen printing pastes are generally non-Newtonian fluids. However, the techniques herein to provide extremely low metal contaminations can be adapted for other types of inks that may have lesser amounts of viscous polycyclic alcohols suitable for the corresponding particular printing of coating process.

The properties of an ink can be designed around the Newtonian composition of the solvent, the viscous polycyclic alcohol, the nanoparticles, any additional composition and their concentrations. In other words, while certain features of an ink may be set by the particular application, any remaining parameters can be adjusted to achieve a target ink property. Generally, the desired ink properties are selected to meet desired processing and functional targets. For example, the rheology depends on the concentrations and compositions of the various components of the ink, and the rheology can be targeted within certain parameter ranges to be compatible with a desired deposition approach, such as spin coating, inkjet printing or screen printing. Furthermore, the compositions generally are selected to exhibit desired processing following deposition. In particular, the particle properties, such as composition and average primary particle size, are generally significant for the further processing to form a desired structure.

The viscous polycyclic alcohol composition and concentrations are generally selected in particular to alter the deposition properties of the ink. Specifically, the viscous alcohol can be used to increase the ink viscosity without necessarily correspondingly increasing the particle concentration and in some embodiments to provide desirable non-Newtonian behavior to the ink. The post deposition properties of the inks are generally also very significant. For example, the viscous polycyclic alcohol compositions can be selected to be eliminated upon heating through evaporation/boiling.

The achievement of the low contaminant levels for silicon based pastes and other inks described herein involves the simultaneous combination of several significant considerations. Generally, the formation of nanoparticle pastes with the extremely low contamination levels described herein involves the use of components to form the inks having correspondingly low metal contamination levels. Specifically, to obtain an ink with the desired low metal contamination, silicon-based nanoparticles can have extremely low metal contamination, and solvents, as well as the viscous polycyclic alcohols, can have extremely low metal contamination. The synthesis and collection of nanoparticles with low metal contamination has been achieved, and semiconductor grade solvents can be used to form silicon-based inks with extremely low metal contamination as described herein. A viscous polycyclic alcohol can be provided with an appropriate low metal contamination. Correspondingly, the handling of the materials has been designed to also not introduce metal contamination beyond acceptable amounts. An important achievement described herein is obtaining desired rheological properties while maintaining the low metal contamination levels, generally with little or no polymer. Based on the teachings herein such ink production can be performed at reasonable costs such that the resulting inks are suitable for commercial use for moderate cost applications.

Silicon nanoparticle inks can be deposited using a selected method. In particular, the viscous polycyclic alcohols have been found to be particularly desirable for the formation of silicon based nanoparticle paste that has excellent screen printing properties. After printing, the inks can provide elements useful to form components of semiconductor devices or as a dopant source to be driven into an underlying semiconductor material. In particular, silicon inks can be used for forming components of solar cells or of electronic devices, such as thin film transistors. In some embodiments, the particles can be incorporated directly into a component of an ultimate product.

In general, the ink properties are designed around the delivery of a desired material and the ink properties that provide for the printing by a selected approach and appropriate deposition characteristics consistent with the desired printed material. Thus, the two major objectives are correlated in the design of the ink. For example, the nanoparticle concentration correlates with the thickness of the deposited nanoparticles as well as the viscosity, and the rheological properties of the ink generally correlate with the size and edge sharpness achievable with the printed ink. The inks described herein can have highly viscous alcohols that can also have a low enough boiling point so that the alcohols can be effectively removed during processing without pyrolyzing the material. For these alcohols then, oxygen does not have to be introduced into a processing chamber to remove carbon since pyrolysis is not performed. Similarly, ultimate carbon contamination can be low since the removal of the alcohol can leave little or no residue. In general, the inks can have no polymer or in some embodiments no more than about 0.01 weight percent polymer or other non-volatile organic compositions that do not boil off at temperatures of no more than 450° C. in an oxygen free environment.

The resulting inks have been demonstrated to have good printing properties by screen printing. The printed pastes can be processed into annealed structures while providing for appropriate dopant drive in into an underlying substrate. To facilitate dopant drive in, a capping layer, such as amorphous silicon, can be deposited over the printed doped structures. The annealed structures can exhibit desirably low sheet resistances with either p-type or n-type dopants. The annealed structures can be useful to form devices, such as doped contacts for a solar cell in which the annealed structures can be incorporated into the structure of the device. Other devices can be similarly formed, such as printed electronic devices.

Silicon Based Nanoparticles

The desirable silicon-based nanoparticle dispersions described herein are based in part on the ability to form high quality nanoparticles with or without dopants. As described above, laser pyrolysis is a particularly suitable approach for the synthesis of highly uniform silicon submicron particles or nanoparticles. Also, laser pyrolysis is a versatile approach for the introduction of desired dopants at a selected concentration, such as high dopant concentrations. Also, the surface properties of the nanoparticles can be influenced by the laser pyrolysis process, although the surface properties can be further manipulated after synthesis to form desired dispersions. Small and uniform silicon-based particles can provide processing advantages with respect to forming dispersions/inks.

In some embodiments, the particles have an average diameter of no more than about one micron, and in further embodiments it is desirable to have particles with smaller particle sizes to introduce desired properties. For example, nanoparticles with a small enough average particle size are observed to melt at lower temperatures than bulk material, which can be advantageous in some contexts. Also, the small particle sizes provide for the formation of inks with desirable properties, which can be particularly advantageous for a range of coating and/or printing processes since small uniform silicon-based particles can be advantageous for the formation of inks with desirable rheological properties. Generally, the dopants and the dopant concentration are selected based on the desired properties of the subsequently fused material or to provide a desired degree of dopant migration to an adjacent substrate. The dopant concentrations can influence the particle properties also.

In particular, laser pyrolysis is useful in the formation of particles that are highly uniform in composition, crystallinity, and size. A collection of submicron/nanoscale particles may have an average diameter for the primary particles of no more than about 500 nm, in some embodiments from about 2 nm to about 100 nm, alternatively from about 2 nm to about 75 nm, in further embodiments from about 2 nm to about 50 nm, in additional embodiments from about 2 nm to about 40 nm, and in other embodiments from about 2 nm to about 35 nm. A person of ordinary skill in the art will recognize that other ranges within these specific ranges are covered by the disclosure herein. In particular, for some applications, smaller average particle diameters can be particularly desirable. Particle diameters and primary particle diameters are evaluated by transmission electron microscopy. Primary particles are the small visible particulate units visible in the micrograph without reference to the separability of the primary particles. If the particles are not spherical, the diameter can be evaluated as averages of length measurements along the principle axes of the particle.

As used herein, the term "particles" without qualification refers to physical particles, which are unfused, so that any fused primary particles are considered as an aggregate, i.e. a physical particle. For particles formed by laser pyrolysis, if quenching is applied, elemental silicon particles can have a size roughly of the same order of magnitude as the primary particles, i.e., the primary structural element within the material. Thus, the ranges of average primary particle sizes above can also be used with respect to the particle sizes to the extent that fusing is negligible. If there is hard fusing of some primary particles, these hard fused primary particles form correspondingly larger physical particles, and some noteworthy fusing is observed for very small elemental silicon particles with an average primary particle size of less than about 10 nm. The primary particles can have a roughly spherical gross appearance, or they can have non-spherical shapes. Upon closer examination, crystalline particles may have facets corresponding to the underlying crystal lattice. Amorphous particles generally have a spherical aspect.

Because of their small size, the particles tend to form loose agglomerates due to van der Waals and other electromagnetic forces between nearby particles. Even though the particles may form loose agglomerates, the nanometer scale of the particles is clearly observable in transmission electron micrographs of the particles. The particles generally have a surface area corresponding to particles on a nanometer scale as observed in the micrographs. Furthermore, the particles can manifest unique properties due to their small size and large surface area per weight of material. These loose agglomerates can be dispersed in a liquid to a significant degree and in some embodiments approximately completely to form dispersed particles.

The particles can have a high degree of uniformity in size. Laser pyrolysis generally results in particles having a very narrow range of particle diameters. As determined from examination of transmission electron micrographs, the primary particles generally have a distribution in sizes such that at least about 95 percent, and in some embodiments 99 percent, of the particles have a diameter greater than about 35 percent of the average diameter and less than about 280 percent of the average diameter. In additional embodiments, the particles generally have a distribution in sizes such that at least about 95 percent, and in some embodiments 99 percent, of the primary particles have a diameter greater than about 40 percent of the average diameter and less than about 250 percent of the average diameter. In further embodiments, the primary particles have a distribution of diameters such that at least about 95 percent, and in some embodiments 99 percent, of the primary particles have a diameter greater than about 60 percent of the average diameter and less than about 200 percent of the average diameter. A person of ordinary skill in the art will recognize that other ranges of uniformity within these specific ranges are contemplated and are within the present disclosure.

Furthermore, in some embodiments essentially no primary particles have an average diameter greater than about 5 times the average diameter, in other embodiments about 4 times the average diameter, in further embodiments 3 times the average diameter, and in additional embodiments 2 times the average diameter. In other words, the primary particle size distribution effectively does not have a tail indicative of a small number of particles with significantly larger sizes. This is a result of the small reaction region to form the inorganic particles and corresponding rapid quench of the inorganic particles. An effective cut off in the tail of the size distribution indicates that there are less than about 1 particle in $10^6$ has a diameter greater than a specified cut off value above the average diameter. High primary particle uniformity can be exploited in a variety of applications.

High quality particles can be produced that are substantially unfused. However, for the production of very small primary particle sizes, e.g., less than 10 nm average diameter, at higher production rates, the primary silicon particles can involve substantial fusing into a nanostructured material. These particles can still be dispersed into a liquid to produce desired ranges of secondary particle size. Even though the particles with very small primary particle diameters may have significant fusing, these particles may still be desirable for applications in which the small primary particle size and corresponding high surface areas can facilitate dopant delivery and/or fusing of the deposited inks into corresponding structures.

The silicon based nanoparticles can further be characterized by BET surface areas. The surface area measurements are based on gas adsorption onto the particle surfaces. The BET surface area evaluation cannot directly distinguish small particle sizes from highly porous particles, but the surface area measurements nevertheless provide useful characterization of the particles. BET surface area measurements are an established approach in the field, and for silicon particles the BET surface area can be determined with an $N_2$ gas absorbate. The BET surface area can be measured with commercial instruments, such as a Micromeritics Tristar 3000™ instrument. The silicon based nanoparticles described herein can have BET surface areas ranging from about 100 m$^2$/g to about 1500 m$^2$/g and in further embodiments, from about 200 m$^2$/g to about 1250 m$^2$/g. A person of ordinary skill in the art will recognize that additional ranges within the explicit ranges above are contemplated and are within the present disclosure. The particle diameters can be estimated from the BET surface areas based on the assumption that the particles are non-porous, non-agglomerated spheres.

X-ray diffraction can be use to evaluate the crystallinity of the particles. Furthermore, crystalline nanoparticles produced by laser pyrolysis can have a high degree of crystallinity. For laser pyrolysis synthesis of crystalline silicon particles, it is generally believed that the primary particles correspond with a crystallite. However, x-ray diffraction can also be used to evaluate the crystallite size. In particular, for submicron particles, the diffraction peaks are broadened due to truncation of the crystal lattice at the particle surface. The degree of broadening of the x-ray diffraction peaks can be used to evaluate an estimate of the average crystallite size. While strain in the particles and instrument effects can also contribute to broadening of the diffraction peaks, if the particles are assumed to be essentially spherical, the Scherrer equation, which is well known in the art, can be used to provide a lower limit on the average particle size. Meaningful broadening is only observed for crystallite sizes less than about 100 nm. If the particle sizes from TEM evaluation of primary particle diameters, particle size estimates from the BET surface areas and the particle sizes from the Scherrer equation are roughly equal, this determination provides significant evidence that the fusing of the particles is not excessive and that the primary particles are effectively single crystals. Amorphous or glass particles have very broad x-ray diffraction spectra indicative of a lack of long range order.

The silicon based particles can comprise elemental silicon, silicon oxides, silicon nitrides, silicon oxynitrides and mixtures thereof. In general, silicon oxides can comprise silicon dioxide ($SiO_2$) or oxygen deficient silicon oxides, e.g., $SiO_x$, $0<x<2$. Silicon nitrides can be $Si_3N_4$ or silicon enriched silicon nitride, such as $SiN_x$, $0<x<4/3$. Silicon oxynitrides can comprise $SiN_xO_y$, $x<4/3$ and $y<2$ with $3x+2y \leq$ about 4. A collection of silicon-based nanoparticles can comprise a blend of these silicon-based particles in desired proportions.

The general use of laser pyrolysis for the formation of a range of materials is described in published U.S. Pat. No. 7,384,680 to Bi et al., entitled "Nanoparticle-Based Power Coatings and Corresponding Structures," incorporated herein by reference. The synthesis of uniform dispersible silicon nanoparticles is described further in published U.S. patent application 2008/0160265, now U.S. Pat. No. 8,632,702, to Hieslmair et al., entitled "Silicon/Germanium Particle Inks, Doped Particles, Also, the synthesis of highly dispersible, uniform silicon oxide nanoparticles by laser pyrolysis with an optional dopant is described in U.S. Pat. No. 7,892,872 to Hieslmair et al., entitled "Silicon/Germanium Oxide Particle Inks, Inkjet Printing, and Processes for Doping Semiconductor Substrates," incorporated herein by reference. The synthesis of silicon nitride ($Si_3N_4$) nanoparticles by laser pyrolysis is described in published U.S. patent application 2011/0135928 to Ravilisetty et al., entitled "Metal Silicon Nitride or Metal Silicon Oxynitride Submicron Phosphor Particles and Methods for Synthesizing These Phosphors," incorporated herein by reference. Silicon oxynitride nanoparticles can be synthesized using laser pyrolysis through the controlled introduction of a blend of ammonia ($NH_3$) and an oxygen source, such as $N_2O$ or $CO_2$, as a secondary reactant with silane ($SiH_4$) or other silicon source based on the teachings in these references. Alternatively, silicon oxynitride particles can be formed by the partial reduction of silicon oxide nanoparticles with $NH_3$ or the oxidation of silicon nitride nanoparticles with an oxidizing agent, such as $O_2$ or $O_3$.

In addition, the submicron particles may have a very high purity level. Silicon-based particles can be produced with very low levels of metal impurities using laser pyrolysis with appropriate particle handling procedures. Low metal impurity levels are very desirable from the perspective of semiconductor processing. The contaminant levels can be evaluated by ICP-MS analysis (inductively coupled plasma-mass spectrometry).

In some embodiments, the submicron silicon-based particles can be found to have no more than about 1 parts per million by weight (ppm) of metal contaminants, in further embodiments no more than about 900 parts per billion by weight (ppb) and in additional embodiments no more than about 700 ppb of total metal contaminants. For semiconductor applications, iron can be a contaminant of particular concern. With improved particle synthesis, handling and contaminant removal procedures, particles can be dispersed with no more than about 200 ppb of iron, in further embodiments, no more than about 100 ppb and in additional embodiments from about 15 ppb to about 75 ppb of iron contaminants with respect to the particle weight. A person of ordinary skill in the art will recognize that additional ranges of contaminant levels within the explicit ranges above are contemplated and are within the present disclosure. The low contaminant levels allows for the production of particles with low dopant levels of dopants, such as boron or phosphorous, in which the low dopant levels can be effective of tuning the electronic properties of particles in a meaningful way that cannot be achieved at higher contaminant levels.

To achieve the very low contaminant levels, the particles can be synthesized in a laser pyrolysis apparatus sealed from the ambient atmosphere and appropriately cleaned and purged prior to the synthesis. Highly pure gaseous reactants can be used for the silicon precursors as well as for the dopant precursors. Similarly, pure oxygen or ammonia can be introduced as secondary reactants to form silicon oxides or silicon nitrides respectively. The particles can be collected and handled in a glove box to keep the particles free from contaminants from the ambient atmosphere. Very clean polymer containers, such as polyfluoroethylene containers, can be used for placement of the particles. For the formation of inks, the particles can be dispersed in very pure solvents within clean vessels within a glove box or clean room. With meticulous attention to all aspects of the process, the high purity levels described herein have been and generally can be achieved. The production of silicon particles with clean handling procedures is described further in published U.S. patent application number 2011/0318905 to Chiruvolu et al. (the '905 application), entitled "Silicon/Germanium Nanoparticle Inks, Laser Pyrolysis Reactors for the Synthesis of Nanoparticles and Associated Methods," incorporated herein by reference.

The size of the dispersed particles in a liquid can be referred to as the secondary particle size. The primary particle size is roughly the lower limit of the secondary particle size for a particular collection of particles, so that the average secondary particle size can be approximately the average primary particle size if the primary particles are substantially unfused and if the particles are effectively completely dispersed in the liquid, which involves solvation forces that successfully overcome the inter-particle forces. The secondary particle size may depend on the subsequent processing of the particles following their initial formation and the composition and structure of the particles. In particular, the particle surface chemistry, properties of the dispersant, the application of disruptive forces, such as shear or sonic forces, and the like can influence the efficiency of fully dispersing the particles. The secondary particle size of the dispersed nanoparticles is described further below.

Dopants can be introduced to vary properties of the resulting particles and/or to provide a dopant source supplied by the nanoparticles for migration into adjacent elemental silicon as well as other silicon based materials. In general, any reasonable element can be introduced as a dopant to achieve desired properties. For example, dopants can be introduced to change the electrical properties of the particles, especially silicon. In particular, As, Sb and/or P dopants can be introduced into the elemental silicon particles to form n-type semiconducting materials in which the dopant provide excess electrons to populate the conduction bands, and B, Al, Ga and/or In can be introduced to form p-type semiconducting materials in which the dopants supply holes. In silicon oxides, silicon nitrides and silicon oxynitrides, the dopant elements can be a dopant source for transfer to an adjacent material, such as a silicon wafer. P and B can be provided with respective suitable precursor compounds, such as diborane ($B_2H_6$) or phosphine ($PH_3$), which can be provided in very pure gas forms.

In some embodiments, one or more dopants can be introduced into the silicon-based particles, e.g. elemental silicon particles, silica particles, silicon nitride particles and/or silicon oxynitride particles, in concentrations from about $1.0\times10^{-7}$ to about 15 atomic percent relative to the silicon atoms, in further embodiments from about $1.0\times10^{-5}$ to about 5.0 atomic percent and in further embodiments from about $1\times10^{-4}$ to about 3.0 atomic percent relative to the silicon atoms. Both the low dopant levels and the high dopant levels are of interest in appropriate contexts. For the low dopant levels to be of particular usefulness, the particles should be pure with respect to low contamination levels. For small particles, the low dopant levels essentially can correspond with less than one dopant atom per particle on average. In combination with the high purity that has been achieved for the particles, low dopant levels from about $1.0\times10^{-7}$ to about $5.0\times10^{-3}$ correspond with potentially useful materials. In some embodiments, high dopant levels are of particular interest, and the highly doped particles can have a dopant concentration from about 0.1 atomic percent to about 15 atomic percent, in other embodiments from about 0.25 atomic percent to about 12 atomic percent, and in further embodiments from about 0.5 atomic percent to about 10 atomic percent. A person of ordinary skill in the art will recognize that additional ranges within the explicit dopant level ranges are contemplated and are within the present disclosure.

Ink Compositions and Properties

Desirable silicon based nanoparticle inks are formed by processing initial stable dispersions of nanoparticles to adjust the properties to be appropriate for a selected deposition approach. It has been found that viscous polycyclic alcohols can be conveniently used to adjust rheological properties of the nanoparticle inks. Thus, dispersions of particular interest comprise a dispersing liquid or solvent and silicon based nanoparticles dispersed within the liquid, which can comprise a viscous polycyclic alcohol. Through the use of a viscous polycyclic alcohol, good printing properties can be obtained, for example, for screen printing pastes, without necessarily using a polymer to adjust the ink properties. The use of the viscous polycyclic alcohols in place of a polymer can result in processing advantages and desirable produce properties in some embodiments. In appropriate embodiments, silicon based nanoparticles from laser pyrolysis are collected as a powder, and dispersed in a solvent or solvent blend by mixing, although suitable silicon nanoparticles from other sources can be used if of sufficient purity. The dispersion can be stable with respect to avoidance of settling over a reasonable period of time, generally at least an hour or longer, without further mixing. A dispersion can be used as an ink, and the properties of the ink can be adjusted based on the particular deposition method. For example, in some embodiments, the viscosity of the ink is adjusted for the use in a particular coating or printing application, and particle concentrations and additives can provide some additional parameters to adjust the viscosity and other ink properties.

Screen printing pastes with non-Newtonian rheology are of particular interest, but other inks that incorporate a viscous polycyclic alcohol to adjust the ink properties are also of interest. In some embodiments, the particles can be formed into concentrated dispersions with desirable fluid properties without surface modifying the particles with organic compounds. As used herein, the lack of surface modification with organic compounds excludes references to solvent-based interactions. In general, the solvents may interact with the particle surfaces with varying degrees of interactions that are distinct from the inclusion of distinct surface modifying agents that form strong and effectively durable chemical modification of the particle surfaces. The availability to form stable dispersions with small secondary particle sizes provides the ability to form certain inks that are not otherwise possible.

Furthermore, it can be desirable for the silicon based nanoparticles to be uniform with respect to particle size and other properties. The formation of a good dispersion with a small secondary particle size can be facilitated through the matching of the surface chemistry of the particles with the properties of the dispersing liquid. The surface chemistry of particles can be influenced during synthesis of the particles as well as following collection of the particles.

Suitable approaches have been found to disperse dry silicon based nanoparticle powders and to form high quality silicon based inks and the like for deposition. In some embodiments, the particle can be surface modified with an organic compound to change the surface properties of the particles in a dispersion, but in further embodiments, the particles are not covalently surface modified with an organic compound since the lack of surface modification can provide advantages with respect to properties for certain applications and potentially to processing simplification. Thus, for some embodiments, significant advantages are obtained by forming dispersions of particles without surface modification. Using one or more of the processing approaches described herein, inks can be formed that can be deposited using convenient coating and printing approaches based on established commercial parameters. Thus, the advantages of vapor-based particle synthesis can be combined with desirable solution based processing approaches with highly dispersed particles to obtain desirable dispersions and inks, which can be formed with doped particles. Suitable particle size analyzers include, for example, a Microtrac UPA instrument from Honeywell based on dynamic light scattering, a Horiba Particle Size Analyzer from Horiba, Japan and ZetaSizer Series of instruments from Malvern based on Photon Correlation Spectroscopy. The principles of dynamic light scattering for particle size measurements in liquids are well established.

With respect to silicon based nanoparticle dispersions, the dispersions can have nanoparticle concentrations from low concentrations to about 30 weight percent. In general, the secondary particles size can be expressed as a cumulant mean, or Z-average particle size, as measured with dynamic light scattering (DLS). Measurements of secondary particle size are more accurate in dilute samples, so to evaluate higher concentrations, the dispersions can be diluted after a good dispersion is formed at the higher concentration to perform the secondary particle size measurements. The Z-average particle size is based on a scattering intensity weighted distribution as a function of particle size. The scattering intensity is a function of the particle size to the 6th power so that larger particles scatter much more intensely. Evaluation of this distribution is prescribed in ISO International Standard 13321, Methods for Determination of Particle Size Distribution Part 8: Photon Correlation Spectroscopy, 1996, incorporated herein by reference. However, small particles scatter light with less intensity relative to their volume contribution to the dispersion. The intensity weighted distribution can be converted to a volume-weighted distribution, if desired. For nanoscale particles, the volume-based distribution can be evaluated from the intensity distribution using Mie Theory. The volume-average particle size can be evaluated from the volume-based particle size distribution. Further description of the manipulation of the secondary particle size distributions can be found in Malvern Instruments-DLS Technical Note MRK656-01, incorporated herein by reference. As a general matter, due to the scaling of volume average particle sizes by the cube of the particle diameter and the scattering intensity average (Z-average) by the sixth power of the average particle size, these measurements can significantly provide emphasis to larger particles over smaller particles.

In some embodiments, the Z-average particle size is no more than about 1 micron, in further embodiments no more than about 250 nm, in additional embodiments no more than about 200 nm, in some embodiments from about 40 nm to about 150 nm, in other embodiments from about 45 nm to about 125 nm, in further embodiments from about 50 nm to about 100 nm. In particular, for some printing applications, it is observed that good printing properties are generally correlated with Z-average particle sizes of no more than about 200 nm. For primary particles that exhibit some fusing, the absolute value of the Z-average dispersed particle size is still very significant for the processing properties of the silicon based nanoparticle distributions. A person of ordinary skill in the art will recognize that additional ranges of secondary particle sizes within the explicit ranges above are contemplated and are within the present disclosure.

With respect to the particle size distribution, in some embodiment, essentially all of the secondary particles can have a size distribution from scattering results with effectively no intensity corresponding to more than 5 times the Z-average secondary particle size, in further embodiments no more than about 4 times the Z-average particle size and in other embodiments no more than about 3 times the Z-average particle size. Furthermore, the DLS light scattering particle size distribution can have in some embodiments a full width at half-height of no more than about 50 percent of the Z-average particle size. Also, the secondary particles can have a distribution in sizes such that at least about 95 percent of the particles have a diameter greater than about 40 percent of the Z-average particle size and less than about 250 percent of the Z-average particle size. In further embodiments, the secondary particles can have a distribution of particle sizes such that at least about 95 percent of the particles have a particle size greater than about 60 percent of the Z-average particle size and less than about 200 percent of the Z-average particle size. A person of ordinary skill in the art will recognize that additional ranges of particle sizes and distributions within the explicit ranges above are contemplated and are within the present disclosure.

Furthermore, it has been discovered that measurements of dispersion or ink properties, such as through light scattering measurements, of the static dispersion alone does not seem to provide adequate characterization of printing characteristics of the inks. Specifically, rheological measurements also provide significant information related to the deposition characteristics of the inks which can correspond to print quality. Rheology relates to the flow properties of a liquid. Thus, in principle, the rheological measurements provide additional information that is not obtained from the light scattering measurements of a static particle dispersion.

Rheological measurements include measurements of viscosity. Viscosity is a measure of a fluid's resistance to shear stress. In general, the rate at which a fluid deforms (i.e. sheer rate) in response to an applied force (i.e. shear stress) determines the viscosity of the fluid being studied. For Newtonian fluids, the viscosity is constant such that the shear rate scales with the shear stress. For non-Newtonian fluids, the viscosity varies non-linearly with the shear stress, e.g., shear thinning, a decrease in viscosity with increasing shear. An ink's viscosity can be measured using a rheometer. In some embodiments of a rheometer, the liquid to be studied is placed in the annulus between a drive cylinder and a free cylinder. A shear stress is then applied to the ink by rotating the drive cylinder. The moving ink in the annulus, in response to the applied shear stress, causes the free cylinder to begin rotating. The shear rate and, therefore the viscosity of the fluid, can then be calculated from the rotational frequency of the free cylinder. Furthermore, because the applied shear stress can be adjusted by adjusting the rotational frequency of the drive cylinder, a rheometer can be used to obtain the viscosity of fluids over a wide range of shear stresses. Rheometers are widely available from commercial sources such as Brookfield Engineering Laboratories, Inc. (Middleboro, Mass.).

In general, the surface chemistry of the particles influences the process of forming the dispersion. In particular, it is easier to disperse the particles to form smaller secondary particle sizes if the dispersing liquid and the particle surfaces are compatible chemically, although other parameters such as density, particle surface charge, solvent molecular structure and the like also directly influence dispersability. In some embodiments, the liquid may be selected to be appropriate for the particular use of the dispersion, such as for a printing process. For silicon synthesized using silanes, the resulting silicon generally is partially hydrogenated, i.e., the silicon includes some small amount of hydrogen in the material. It is generally unclear if this hydrogen or a portion of the hydrogen is at the surface as Si—H bonds. However, the presence of a small amount of hydrogen does not presently seem particularly significant. In some embodiments, elemental silicon nanoparticles can become surface oxidized, for example through exposure to air. For these embodiments, the surface can have bridging oxygen atoms in Si—O—Si structures or Si—O—H groups if hydrogen is available during the oxidation process. By preventing exposure to the ambient atmosphere, surface oxidation of the particles can be substantially reduced, e.g., to no more than about 2 weight percent in the particles. Even without significant oxidation, it is found that elemental silicon nanoparticles formed by laser pyrolysis are suitable for forming good dispersions in appropriately selected solvents without modifying the particles with chemically bonded organic compounds.

In some embodiments, the surface properties of the particles can be modified through surface modification of the particles with a surface modifying composition chemically bonded to the particle surfaces. However, in some embodiments of particular interest, the particles are not surface modified so that unmodified particles are deposited for further processing. In appropriate embodiments, surface modification of the particles can influence the dispersion properties of the particles as well as the solvents that are suitable for dispersing the particles. Some surface active agents, such as many surfactants, act through non-bonding interactions with the particle surfaces, and these processing agents are described further below. In some embodiments, desirable properties, especially dispersability in otherwise unavailable solvents, can be obtained through the use of surface modification agents that chemically bond to the particle surface. The surface chemistry of the particles influences the selection of surface modification agents. The use of surface modifying agents to alter the silicon particle surface properties is described further in published U.S. patent application 2008/0160265, now U.S. Pat. No. 8,632,702, to Hieslmair et al., entitled "Silicon/Germanium Particle Inks, Doped Particles, Printing, and Processes for Semiconductor Applications," incorporated herein by reference. Any composition for performing surface modification should be provided with appropriately low metal contamination to avoid any undesirable incorporation of metal contaminants into the ink.

While surface modified particles can be designed for use with particular solvents, it has been found that desirable inks can be formed with appropriate solvent selection and processing without surface modification at high particle concentrations and with good deliverability at least in some circumstances. The ability to form desired inks without surface modification can be useful for the formation of desired devices, especially semiconductor based devices, with a lower level of contamination.

The dispersions can be formulated for a selected application. The dispersions can be characterized with respect to composition as well as the characterization of the particles within the dispersions. In general, the term ink is used to describe a dispersion that is subsequently deposited using a coating or printing technique, and an ink may or may not include additional additives to modify the ink properties.

As used herein, stable dispersions have no settling without continuing mixing after one hour. In some embodiments, the dispersions exhibit no settling of particles without additional mixing after one day and in further embodiments after one week, and in additional embodiments after one month. In general, dispersions with well dispersed particles can be formed at concentrations of at least up to 30 weight percent inorganic particles. Generally, for some embodiments it is desirable to have dispersions with a particle concentration of at least about 0.05 weight percent, in other embodiments at least about 0.25 weight percent, in additional embodiments from about 0.2 weight percent to about 25 weight percent and in further embodiments from about 0.25 weight percent to about 15 weight percent. A person of ordinary skill in the art will recognize that additional ranges of stability times and concentrations within the explicit ranges above are contemplated and are within the present disclosure. Using the viscous polycyclic alcohols described herein, high viscosity and non-Newtonian nanoparticle pastes with good printing properties can be formulated with low nanoparticle concentrations, which provide for forming thin nanoparticle deposits.

The dispersions can include additional compositions besides the silicon based particles and the dispersing liquid or liquid blend to modify the properties of the dispersion to facilitate the particular application. Surprisingly, rheological properties can be effectively and conveniently adjusted using the viscous polycyclic alcohols described herein, in some embodiments without added polymer. In some embodiments, the inks comprise no more than about 5 weight percent polymers, in further embodiments no more than about 2 weight percent polymer, in other embodiments no more than about 1 weight percent polymer and in additional embodiments no more than 0.1 weight percent polymer. In particular, for screen printing pastes and other inks, the inks can have very good printing qualities without added polymer. Also, other property modifiers can be added to the dispersion to facilitate the deposition process or to influence the ink properties. The inks can be formulated to achieve extremely low metal contamination levels. Using well dispersed ink compositions with appropriately selected rheological properties, screen printing inks with viscous polycyclic alcohols can be formulated to inhibit screen clogging during multiple print cycles.

Viscous polycyclic alcohols can improve printing performance of the corresponding ink and can also provide desirable post-printing processing improvements. The viscous polycyclic alcohols can be obtained with very low metal contaminant levels. Blends of different viscous polycyclic alcohols can also be used in ink formulations to obtain desired properties. With respect to printing performance, the concept can be bifurcated into two concepts: (1) the performance of the ink relative to the printing apparatus (e.g. screen printer) and (2) the performance of the ink as a print element (e.g. a printed line, pattern, structure or the like) on a substrate. For printing apparatuses where the ink is transferred to a substrate with application of shear force, such as screen printing, it can be desirable to have a paste that has relatively high viscosity at lower shear rates (e.g. absolute viscosity) and relatively low viscosity at higher sheer rates. For example, with respect to screen printing, as the paste sits on the screen, prior to printing, high viscosities can help prevent the paste from dripping through the print screen prior to the application of shear force to print the ink through the screen. During printing, when a shear force is applied to the paste to force it through the screen, it can be desirable for the paste to have a lower viscosity to increase the amount of paste that is printed through the screen. The printed structure can also benefit from a paste that has desirably high static viscosity. In particular, higher low shear limit viscosities can help prevent spreading of the printed element after printing and can also help improve the definition of the printed element.

In general, the viscous polycyclic alcohols generally have at least one bridging ring, and in some embodiments the polycyclic alcohols have three or more rings with one bridging ring. The bridged ring structure can comprise a norboryl group structure, in which the norbornyl group involves a structure of norborane or bicyclo(2,2,1)heptane with a cyclohexane ring with a bridging methylene group at the 1, 4 positions of the cyclohexane. Vinylnorbornyl alcohol or 5- or 6-vinyl-2-hydrocymethylbicyclo[2.2.1]heptane is a viscous oily alcohol described in U.S. Pat. No. 4,693,844 to Inoue et al., entitled "Vinylnorbornyl Alcohol and Perfume Composition Containing the Same," incorporated herein by reference. C-8 substituted bridging rings are described in U.S. Pat. No. 4,582,945 to Brunke et al., entitled "C-8-Substituted 1,5-dimethyl-bicyclo[3,2,1]Octane-8-ols," incorporated herein by reference. The '945 patent specifically described C-8 substitutions with R—, where R can be ethyl, methyl, n-propyl, i-propyl, n-butyl, 1-methyl-propyl, 2-methyl-propyl, allyl, n-hexyl, 3-methylbutyl, cyclopentyl, or cyclohexyl, in which the product compositions are described as oils or solids with melting points slightly above room temperature.

A group of compounds of interest comprise a norbornyl bridging ring group with a third ring bonded to one carbon of the cyclohexane ring or the norbornyl group. In some embodiments, the compounds are unsaturated, i.e., do not include double bonded carbon-carbon bonds. Various cyclohexane alcohols or diols bonded to a substituted bicyclohexane with a bridging methyl group (isobornyl cyclohexane diol and norbornyl cyclohexane diol substituted with two methyl groups at the 2 position and one methyl group at the 3 position of the norbornyl cyclohexyl ring) is described in U.S. Pat. No. 4,061,686 to Hall et al. (the '686 patent), entitled "Cyclohexane Diol Composition," incorporated herein by reference. The '686 patent further describes some mono-alcohol compounds with isobornyl or isocamphanyl (e.g., trimethyl-2,2,3-norbornyl-5-)-3-cyclohexanol-1) groups associated with cyclohexanol in which the —OH group is adjacent the carbon bonded to the bridged ring, two carbons away or three carbons away and also references mono-alcohol compounds similar to the diols in Swiss patent 423 058 to Demole and U.S. Pat. No. 3,499,937 to Dorsky et al. The viscous polycyclic alcohols in the '668 patent have similarities to isobornyl cyclohexanol, i.e., 3-(5,5,6 trimethyl bicyclo[2.2.1]heptan-2-yl)cyclohexanol (isobornyl cyclohexanol), which is commercially available as are other similar viscous polycyclic alcohols. A viscous polycyclic alcohol, 11-hydroxy-2,13,13-trimethyl-tricyclo [6.4.0.1$^{2,5}$]tridecane, is described as a viscous oil in U.S. Pat. No. 3,499,937 to Dorsky et al., entitled "Polycyclic Alcohol, Compositions Containing Same and Process Therefor," incorporated herein by reference. Various viscous polycyclic alcohols formed as a condensation product of cyclohexanol and 2-ethylidene-5-norbornene are described in U.S. Pat. No. 4,604,488 to Fujikura et al., entitled "Cyclohexanol Derivatives and Fragrance Compositions Containing the Same," incorporated herein by reference. The alcohols described in the '488 patent involve a cyclohexanol ring bonded to a 2-ethylnorboryl ring structure at various positions, and the precise orientations of the functional groups were not completely identified.

The viscous polycyclic alcohols described herein can advantageously be incorporated into ink formulations to provide for ultimate inks with desirably non-Newtonian viscosities. In some embodiments, the viscous polycyclic alcohols can have non-Newtonian rheology themselves. The viscous polycyclic alcohols can have a viscosity at a shear rate of 2 s$^{-1}$ of at least about 1 Pa·s; in other embodiments, of at least about 5 Pa·s and in other embodiments of at least about 10 Pa·s. In some embodiments, the viscous polycyclic alcohols can have a viscosity at a shear rate of 1000 s$^{-1}$ of no more than about 90% of the viscosity at 2 s$^{-1}$, in other embodiments no more than about 87% and in further embodiments no more than about 85% of the viscosity at a shear of 2 s$^{-1}$. A person of ordinary skill in the art will recognized additional ranges of viscosities within the explicitly recited ranges are contemplated and within the present disclosure.

With respect to post-printing processing improvements, the printed inks, e.g. screen printing paste, can be processed to remove the viscous polycyclic alcohol component at conditions that can result in printed elements having relatively low carbon concentrations without the introduction of oxygen due to reasonable boiling points. Relatively low carbon concentrations can be desirable in certain application settings, for example, in silicon based materials in semiconductor applications. The viscous polycyclic alcohols described herein can have desirably low boiling points so that they can be substantially removed from printed elements at relatively low temperatures that avoid pyrolysis or decomposition of the alcohol. In some embodiments, the viscous polycyclic alcohols can have a boiling point of no more than about 450° C., in further embodiments no more than about 400° C. and in other embodiments no more than about 350° C. A person of ordinary skill in the art will recognize that additional ranges of boiling points within the explicit ranges above are contemplated and are within the present disclosure.

In general, the one or more viscous polycyclic alcohols can be selected to be compatible with the solvent system selected to stabilize the silicon nanoparticle dispersion, while providing desirable rheological properties. In some embodiments, the ink can have a concentration of viscous polycyclic alcohol from about 0.1 weight percent to about 80 weight percent, in other embodiments from about 0.5 weight percent to about 65 weight percent and in further embodiments from about 1 weight percent to about 50 weight percent. For the formation of pastes with non-Newtonian rheology, viscous polycyclic alcohol concentrations in the ink are generally from about 2 weight percent to about 75 weight percent, in further embodiments from about 5 weight percent to about 70 weight percent and in additional embodiments from about 7 weight percent to about 65 weight percent. For the formation of a Newtonian ink for suitable deposition, the viscous polycyclic alcohol concentrations can be from about 0.1 weight percent to about 20 weight percent, in further embodiments from about 0.25 weight percent to about 15 weight percent and in other embodiments from about 0.05 weight percent to about 12 weight percent. A person of ordinary skill in the art will recognize that additional ranges of polymer additive concentrations within the explicit ranges above are contemplated and are within the present disclosure.

Other potential additives include, for example, pH adjusting agents, antioxidants, UV absorbers, antiseptic agents and the like. These additional additives are generally present in amounts of no more than about 2 weight percent. A person of ordinary skill in the art will recognize that additional ranges of surfactant and additive concentrations within the explicit ranges herein are contemplated and are within the present disclosure.

For electronic applications, it can be desirable to remove organic components to the ink prior to or during certain processing steps such that the product materials are effectively free from carbon. The viscous polycyclic alcohols can be selected to have boiling points, for example, no more than about 450° C., in some embodiments no more than about 400° C. and in further embodiments from about 200° C. to about 350° C. A person of ordinary skill in the art will recognize that additional ranges of boiling points within the explicit ranges above are contemplated and are within the present disclosure. Based on these moderate boiling points, the viscous polycyclic alcohols can be evaporated following printing at appropriate temperatures to completely or substantially completely removed the alcohols without any combustion or pyrolysis of the alcohols. Thus, processing to remove the alcohols can be done at relatively low temperatures, and carbon contamination can be low. Furthermore, the material does not need to be subjected to an oxygen environment to facilitate removal of the carbon. Thus, the use of the viscous polycyclic alcohols can provide for desirable rheology control with desirable processing approaches.

The viscosity of the dispersion/ink is dependent on the silicon based nanoparticle concentration, the viscous polycyclic alcohol concentration, the nature of the other liquids as well as the presence of any other additives. Thus, there are several parameters that provide for adjustment of the viscosity, and these parameters can be adjusted together to obtain overall desired ink properties. In general, a selected coating or printing approach has an appropriate range of viscosity. Surface tension may also be a significant parameter for certain printing applications. For some desired ink formulations, the use of a solvent blend can provide for the rapid evaporation of a low boiling temperature solvent (boiling point approximately no more than about 165° C. and in other embodiments no more than about 160° C.) while using a higher boiling solvent (boiling point at least about 170° C. and in other embodiments at least about 175° C.) to control the viscosity. The high boiling solvent generally can be removed more slowly without excessive blurring of the printed image. After removal of the higher boiling temperature solvent, the printed silicon based nanoparticles can be further processed into the desired device. Suitable printing techniques represent a significant range of desired viscosities from relatively low viscosity for inkjet inks, to moderate viscosities for gravure printing inks and high viscosities for screen print pastes. The nanoparticle concentration and the concentration of the viscous polycyclic alcohols can be adjusted to achieve both desired rheological properties and amounts of nanoparticles deposited.

In general, increased concentrations of nanoparticles and/or increased concentrations of viscous polycyclic alcohol can each result in an increase of ink viscosity. A balance of these concentrations can be selected to achieve desired target properties of the deposited ink, although the tradeoffs are not completely commensurate. For example, for some applications it may be desirable to use somewhat lower nanoparticle concentrations as a way to control thicknesses of deposited material following removal of organics. Specifically, the obtain a thinner coating of deposited silicon-based nanoparticles, the ink can be made more dilute with respect to nanoparticles such that a lower coverage of silicon-based particles remains following deposition of a certain amount of ink and drying of the ink. Higher concentrations of viscous polycyclic alcohol can be used to correspondingly increase the ink viscosity, although adjustments of the solvents can also be used to tune the viscosity somewhat. So moderate nanoparticle concentrations can be effective for the deposition of sufficient quantities of silicon-based nanoparticles while maintaining desired rheology and not depositing a higher coverage of silicon based nanoparticles than desired. For example, with screen printing pastes, there are constraints on the printing process in terms of the viscosity of the pastes as well as the practical coating thicknesses. Thus, if a thinner silicon particle deposit is desired, the screen print paste can be made more dilute with nanoparticles so that after the other paste components are removed, the remaining silicon nanoparticle deposit can be thinner based on a smaller quantity of the nanoparticles deposited. The methods described herein can be used to maintain desirable low metal contaminations if the polymer concentration is increased. A relatively greater amount of nanoparticles relative to viscous polycyclic alcohol can be used to deposit a greater amount of nanoparticles from a quantity of ink with a certain viscosity, and conversely a relatively greater amount of viscous polycyclic alcohol relative to nanoparticles can be used to deposit a lesser amount of nanoparticles from a quantity of ink with a certain viscosity.

Desirable spin-coating ink viscosities and surface tensions can be selected with respect to the desired properties of the target film. Film properties include, but are not limited to, film homogeneity and thickness. For some spin-coating embodiments, the dispersion/ink can have a viscosity from about 0.5 centipoises (cP) to about 150 cP, in further embodiments from about 1 to about 100 cP and in additional embodiments from about 2 cP to about 75 cP. In some embodiments, spin-coating dispersions/inks can have a surface tension from about 20 to about 100 dynes/cm. For some spray coating inks, the viscosity can be from 0.1 cP (mPa·s) to about 100 cP, in other embodiments from about 0.5 cP to about 50 cP and in further embodiments from about 1 cP to about 30 cP. A person of ordinary skill in the art will recognize that additional ranges of viscosity and surface tension within the explicit ranges above are contemplated and are within the present disclosure.

To achieve the target fluid properties, the compositions of the fluids can be correspondingly adjusted. For spray coating inks, the silicon particle concentrations are generally at least about 0.25 weight percent, in further embodiments at least about 2.5 weight percent and in additional embodiments from about 1 weight percent to about 15 weight percent. In some embodiments, the spray coating inks can comprise an alcohol and a polar aprotic solvent. The alcohol can be a relatively low boiling point solvent, such as isopropanol, ethanol, methanol or combinations thereof. In some embodiments, suitable aprotic solvents include, for example, N-methyl pyrolidone, dimethylformamide, dimethylsulfoxide, methylethylketone, acetonitrile, ethylacetate and combinations thereof. In general, the ink can comprise from about 10 weight percent to about 70 weight percent alcohol and in further embodiments from about 20 weight percent to about 50 weight percent alcohol. Similarly, the ink can comprise from about 30 weight percent to about 80 weight percent polar aprotic solvent and in additional embodiments form about 40 weight percent to about 70 weight percent polar aprotic solvent. A person of ordinary skill in the art will recognize that additional concentration and property ranges within the explicit ranges above are contemplated and are within the present disclosure.

For screen printing, the formulations are prepared as a paste that can be delivered through the screen. The screens generally are reused repeatedly. The solvent systems for the paste should be selected to both provide desired printing properties and to be compatible with the screens to help avoid screen damaged and/or clogging by the paste. Suitable lower boiling point solvents with boiling points of no more than about 165° C. include, for example, isopropyl alcohol, cyclohexanone, dimethylformamide, acetone or combinations thereof. Suitable higher boiling point solvents with boiling points of at least about 170° C. and generally below about 400° C. include, for examples, ethylene glycol, propylene glycol, N-methyl pyrrolidone, terpineols, such as α-terpineol, 2-(2-ethoxyethoxy)ethanol (Carbitol), glycol ethers, e.g., butyl cellosolve, or combinations thereof. Reference to higher boiling solvents exclude the distinct viscous polycyclic alcohols as specified above. The screen printing paste can further include a surfactant and/or a viscosity modifier.

In general, the screen printable ink or paste have a high viscosity at low shear and are non-Newtonian. In particular, the pastes have a high viscosity at low shear and a significantly decreased viscosity at high shear. This non-Newtonian behavior can be used effectively to control the printing process since the paste can be stable on the screen between print cycles and printed with the application of higher shear to deliver the ink through the screen to a substrate.

In some embodiments, the elemental silicon screen printing pastes can have an average viscosity at a shear of $2\ s^{-1}$, from about 1 Pa·s (Poise) to about 450 Pa·s, in further embodiments from about 2 Pa·s to about 350 Pa·s and in additional embodiments from about 3 Pa·s to about 300 Pa·s. Furthermore, the pastes can have an average viscosity at a shear of $1000\ s^{-1}$, of no more than about 5 Pa·s, in other embodiments from about 0.001 Pa·s to about 4 Pa·s, in further embodiments from about 0.01 Pa·s to about 3.5 Pa·s, and in additional embodiments from about 0.02 to about 3 Pa·s. The ratio of low shear to high shear average viscosities is also significant since the screen printing process relies on the change in viscosity. The ratio of low shear average viscosity to high shear average viscosity can be in some embodiments from about 1.55 to about 500, in further embodiments from about 2 to about 100 and in other embodiments from about 2.5 to about 50. A person of ordinary skill in the art will recognize that additional ranges of paste rheology parameters within the explicit ranges above are contemplated and are within the present disclosure.

The screen printable inks generally can have a silicon particle concentration from about 0.1 weight percent to about 25 weight percent silicon particles, in further embodiments from about 0.25 weight percent to about 20 weight percent silicon particles, in additional embodiments from about 0.5 weight percent to about 18 weight percent and in other embodiments from about 0.75 weight percent to about 15 weight percent silicon particles. It has been found that with pastes comprising the viscous polycyclic alcohols, lower nanoparticle concentrations can be used while still obtaining good screen printing properties. Also, the screen printable inks can have from 0 to about 10 weight percent lower boiling solvent, in further embodiments from about 0.5 to about 8 and in other embodiments from about 1 to about 7 weight percent lower boiling solvent as well as in some embodiments from about 45 weight percent to about 97 weight percent higher boiling solvent, in further embodiments from about 50 weight percent to about 95 weight percent, and in other embodiments from about 55 weight percent to about 90 weight percent high boiling solvent. Viscous polycyclic alcohol concentrations for non-Newtonian pastes are given above. A person of ordinary skill in the art will recognize that additional ranges of composition for silicon pastes within the explicit ranges above are contemplated and are within the present disclosure.

The property ranges of inks suitable for gravure printing are intermediate between the properties of inkjet inks and screen printing pastes. The properties of gravure inks are described further in the '905 application cited above.

The silicon based nanoparticle inks can have iron, chromium, copper or nickel contamination individually of no more than about 250 parts-per-billion by weight (ppb), in further embodiments no more than about 150 ppb, in additional embodiments no more than about 100 ppb, in other embodiments no more than about 50 ppb and in some embodiments no more than about 25 ppb. In addition, the silicon based nanoparticle inks can have a contamination level for each metal of no more than about 500 ppb, in further embodiments no more than about 400 ppb, in other embodiments no more than about 300 ppb, in additional embodiments no more than about 200 ppb and in some embodiments no more than about 100 ppb. Also, the pastes can have a total transition metal contamination level of no more than about 750 ppb, in additional embodiments no more than about 500 ppb, in further embodiments no more than about 250 ppb, in some embodiments no more than about 200 ppb and in other embodiments no more than about 100 ppb. A person of ordinary skill in the art will recognize that additional ranges of contamination levels in the inks within the explicit ranges above are contemplated and are within the present disclosure.

While the inks can comprise heavily doped silicon based particles, it can be desirable to further include a liquid dopant source in the ink. Suitable liquid dopant sources include, for example, organophosphorus compounds (for example, phosphonates, such as etidronic acid and dimethyl methyl phosphonate, organophosphine oxide, organophosphanes, such as diphenylphosphine, or organophosphates, such as trioctyl phosphate), organoboron compounds (tetraphenylborate or triphenylboron), phosphoric acid, boric acid, combinations thereof or the like. In general, an ink can comprise no more than about 10 weight percent liquid dopant composition as well as any and all subranges within this explicit range.

For dopant drive in applications, it can be desirable to include further components to the ink to facilitate the dopant drive in process. In particular, the ink can comprise a silicon oxide precursor, such as tetraethyl orthosilicate (TEOS). TEOS can be converted to silica in a hydrolysis reaction with water at an appropriate pH. A silica glass can facilitate dopant drive in from highly doped silicon particles into a silicon substrate through the at least partial isolation of the dopants from the vapor phase above the deposited particles and/or to increase solid-phase diffusion pathways to the wafer surface. The alternative or additional use of spin on glasses and silica sol-gels in silicon inks is described in published U.S. patent application 2012/0193769 to Liu et al. (the '769 application), entitled "Silicon Substrates With Doped Surface Contacts Formed From Doped Silicon Inks and Corresponding Processes." incorporated herein by reference.

Also, an elemental silicon nanoparticle ink can further comprise a silica etching agent. A traditional silica wet etching agent comprises an aqueous solution of hydrogen fluoride (HF), which can be buffered with ammonium bifluoride ($NH_4HF_2$) and/or ammonium fluoride ($NH_4F$). Hydrogen fluoride is soluble in alcohols, and ammonium fluoride is slightly soluble in alcohols. The concentrations of HF, and optionally of ammonium fluoride, can be selected to achieve the desired silica etching rate for the silicon ink. Note that the silica etching compositions can also be effective at etching thin layers of silicon nitride and silicon oxynitride. When the etching composition is referenced herein, it will be understood that the composition can be effective at these other etching functions even if not specifically mentioned in the context. In some embodiments, the ink can comprise at least about 1 weight percent silica etching agent. The silicon particle concentrations and concentrations of other ink components generally can be selected as described herein for other inks as appropriate for a particular deposition approach. For more rapid etching, the ink can comprise a saturated HF solution. Other useful etchants include, for example, ammonium fluoride, ammonium bifluoride, ethylenediamine-pyrocatechol, ethanolamine-gallic acid, tetraalkyl ammonium hydroxide and combinations thereof.

The silicon nanoparticle inks with the silica etchant can be used to apply doped or undoped silicon nanoparticle deposits onto a silicon substrate where the silicon substrate has an oxide layer, generally silicon oxide. Thus, a separate etching step may be eliminated. The silica etchant can etch through the oxide layer to expose the silicon surface under the oxide layer to the ink. In general, the inks can be deposited using the various coating and printing approaches described herein, such as screen printing, inkjet printing, spin coating, knife edge coating or the like. During further processing, the silica etching agents generally evaporate or decompose into gaseous components with heating to moderate temperatures. Therefore, the compositions can be used to etch through oxide layers and then heated to moderate temperatures to leave a silicon particle coating while evaporating the solvent and correspondingly removing the etchant. In some embodiments, the deposited inks can be heated to temperatures form about 50° C. to about 300° C. to evaporate the solvent and to remove the silica etchant.

Following the drying of the material, a silicon based nanoparticle coating remains that can be used for dopant delivery and/or, for silicon nanoparticles, to form a silicon mass on a substrate similar to the silicon inks without a silica etchant. Thus, the ink materials with the combination of silica etchant and the silicon nanoparticles can be used to effectively etch through silicon oxide coatings to expose a silicon underlayer that is then in contact with the silicon nanoparticle deposit following drying of the as deposited material. The silicon nanoparticle deposits that remain after drying the ink deposits can be further processed to fuse the silicon nanoparticles and/or drive dopant atoms into the silicon substrate. Further processing to fuse the silicon atoms can be performed generally at a temperature from about 700° C. to about 1200° C.

In other embodiments, silica nanoparticles are combined with the silicon nanoparticles in the ink/dispersion. The relative amounts of silicon nanoparticles and silica nanoparticles can be selected based on the particular application of the ink, and the overall ranges of silicon nanoparticle concentrations described elsewhere herein can apply equally to these blended particle inks. In some embodiments, the ink can comprise at least about 0.01 weight percent silica, in further embodiments from about 0.025 to about 10 weight percent and in other embodiments from about 0.05 to about 5 weight percent silica. In some embodiments, the weight ratio of silica nanoparticles to silicon nanoparticles can be at least about 0.01, in further embodiments from about 0.025 to about 1.5 and in additional embodiments from about 0.05 to about 1. A person of ordinary skill in the art will recognize that additional ranges of silica concentrations and silica to silicon ratios within the explicit ranges above are contemplated and are within the present disclosure. The silicon nanoparticles, the silica nanoparticles, both the silicon nanoparticles and the silica nanoparticles or a portion thereof may be doped. The silica nanoparticles can be used to increase the viscosity of the inks as well as to assist with the formation of a more densely packed deposit that can facilitate dopant drive in.

As described herein, silicon based nanoparticle inks can be formulated for suitable printing processes for commercial applications. In some embodiments, the ability to form good dispersions without chemical modification of the silicon nanoparticle surfaces with an organic compound simplifies processing of the particles after printing. Processing techniques for the inks into corresponding devices can be selected based on the particular application. The ability to form inks with very low metal contaminant levels can in some embodiments directly improve performance of devices formed with the inks. Thus, the availability of the low metal contaminant silicon based nanoparticle inks provides for the applicability of the inks for a broader range of applications.

Processing to Form Silicon Based Nanoparticle Inks

The processing to form the silicon based nanoparticle inks with a viscous polycyclic alcohol component can be designed to both achieve desired deposition properties as well as to form an ink with very low metal contamination levels. The formation of desirable inks with improved deposition properties can comprise the initial formation of a nanoparticle dispersion that can comprise a strong mixing step, e.g. a sonication step, and an optional centrifugation step, and in some embodiments, a plurality of one or both of these steps. In some embodiments, the supernatant of a first centrifugation step can be centrifuged a second time with the second supernatant used to form the nanoparticle ink, and the centrifugation process can be repeated a third time or more if desired. Formation of a good initial dispersion of the nanoparticles prior to further processing to form the ink, such as addition of the polymer, can facilitate the subsequent processing steps and can desirably affect the properties of the target ink. The initial dispersion of the as-synthesized particles generally comprises the selection of a solvent that is relatively compatible with the particles based on the surface chemistry of the particles.

In general, it is desirable to have a strong mixing step to facilitate forming a good dispersion of the nanoparticles. In some embodiments, a strong mixing step can be used in combination with a centrifugation step, which may be effective both to remove metal contaminants and to remove a portion of the nanoparticles resistant to dispersion. In general, there should be significant mixing prior to performance of the centrifugation so that the centrifugation can be effective. Furthermore, additional mixing can be performed after a centrifugation step. There can be a plurality of mixing steps and/or centrifugation steps that are performed in a selected order. Depending on the particle properties, particular particle processing order can be selected to achieve desired dispersion properties. A general discussion of appropriate processing follows. Further discussion directed to processing for forming elemental silicon nanoparticle spin coating inks and screen printing pastes with polymers is found in published U.S. patent application serial number 2013/0189831 to Li et al. (the '831 application), entitled "Silicon/Germanium Nanoparticle Inks and Methods of Forming Inks With Desired Printing Properties," incorporated herein by reference.

Initial mixing can include mechanical mixing and/or sonication mixing. Mechanical mixing can include, but is not limited to, beating, stirring, and/or centrifugal planetary mixing. In some embodiments, centrifugal planetary mixing has been shown to be particularly effective as a mechanical mixing approach in reducing particle agglomeration, although other initial mixing methods can also desirably reduce particle agglomeration. The procedure for performing the initial mixing can significantly influence the concentration of the resulting ink. In particular, the initial mixing step influences the amount of particulates that remain suspended following a subsequent centrifugation step. Initial mixing can comprise a plurality of distinct mixing steps, which may or may not be similar in quality.

In centrifugal planetary mixing, the material to be mixed is placed in a container that is rotated about its own axis and the container itself rotates around another axis of the mixer to generate a spiral convection to mix the contents of the container. The mixer provides strong mixing conditions without the application of strong shear, such as in a twin screw extruder. Centrifugal planetary mixers are available from commercial sources such as THINKY USA, Inc. (Laguna Hills, Calif.). In some embodiments, a mixture of as-synthesized particles and solvent is initially mixed in a centrifugal planetary mixer at between about 200 rpm to about 10,000 and, in other embodiment, from about 500 rpm to about 8000 rpm. In some embodiments, a mixture as as-synthesized particles initially mixed in a centrifugal planetary mixer, for example, for up to about an hour and, in other embodiments, from about 1 min. to about 30 min. A person of ordinary skill in the art will recognize that additional ranges of centrifugation frequencies and times are within the explicit ranges herein are contemplated and are within the present disclosure.

Sonication generally can include, but is not limited to, bath sonication, probe sonication, ultrasonic cavitation mixing, combinations thereof or the like. Sonication processes involve the propagation of sound waves, generally at ultrasonic frequencies, that result in cavity formation in the liquid and the violent collapse of the resulting bubbles. A range of commercial sonication devices are available. Bath and probe sonication can also allow for convenient temperature control during initial mixing by controlling the temperature of the surrounding bath, such as performing the sonication at reduced temperatures. In some embodiments, a mixture is sonicated for no more than about 20 hrs, in other embodiments for no more than about 5 hrs, and in further embodiments from about 5 min. to about 30 min. A person of ordinary skill in the art will recognize that additional ranges of sonication times are within the explicit ranges herein are contemplated and are within the present disclosure.

In general, the dispersion can be centrifuged to improve the properties of the dispersion. It has been found that centrifugation of nanoparticle dispersions can be useful for the formation of the highly pure dispersions with very low metal contamination described herein. The centrifugation parameters can be selected such that at least a reasonable fraction of the silicon based nanoparticles remain dispersed, but contaminants and more poorly dispersed solid components settle to the bottom of the centrifuge container.

To obtain greater improvement in the dispersion properties, centrifugation can comprise multiple centrifugation steps, with each subsequent step performed with the same or different centrifugation parameters as the preceding step. In some embodiments, after each centrifugation step, the supernatant can be decanted or similarly separated from the settled contaminants and subsequently centrifuged in the subsequent centrifugation step. Additional mixing or other processing steps can be performed between centrifugation steps for embodiments involving multiple centrifugation steps. After centrifugation for further processing or use of the inks, the supernatant can be decanted or similarly separated from the settled contaminants for further processing. In some embodiments, a dispersion is centrifuged at 3000 revolutions per minute (rpm) to 15000 rpm, in further embodiments from about 4000 rpm to about 14000 rpm and in other embodiments form about 5000 rpm to about 13000 rpm. In some embodiments, a dispersion is centrifuged for about 5 minutes to about 2 hours, in further embodiments from about 10 minutes to about 1.75 hours and in other embodiments from about 15 minutes to about 1.5 hours. A person of ordinary skill in the art will recognize that additional ranges of centrifugation frequencies and times are within the explicit ranges herein are contemplated and are within the present disclosure.

After centrifugation, it can be desirable to further subject the dispersion to a post-centrifugation sonication. It has been found that sonication after centrifugation can aid in formation of a higher quality ink for some silicon based nanoparticles. Post-centrifugation sonication can comprise one or more selected forms of sonication as described above. With respect to post-centrifugation bath sonication, in some embodiments a dispersion is sonicated for no more than about 5 hr., in other embodiments from about 5 min. to about 3.5 hr, in further embodiments from about 10 min. to about 2 hr., and in yet other embodiments, from about 15 minutes to about 1.5 hr. A person of ordinary skill in the art will recognize that additional ranges within the explicit ranges above are contemplated and are within the present disclosure. Post-centrifugation sonication can be performed at the temperature ranges and with sonication frequencies as discussed above. Whether or not the ink is subjected to post-centrifugation sonication, the ink can be subjected to centrifugal planetary mixing or the like to homogenize the sample.

The particular additives can be added in an appropriate order to maintain the stability of the particle dispersion. In general, the additives can be added after centrifuging the silicon nanoparticle dispersion. Some mixing is performed to disburse the additive through the ink composition. A person of ordinary skill in the art can select the additives and mixing conditions empirically based on the teachings herein.

In general, dry nanoparticles can be added to a liquid and then subjected to strong mixing conditions. To facilitate processing, the viscous polycyclic alcohol can be added to a nanoparticle dispersion formed with other selected solvents. After adding the viscous polycyclic alcohol to the nanoparticle dispersion suitable mixing can be applied.

For particular applications, there may be fairly specific target properties of the inks as well as the corresponding liquids used in formulating the inks. At an appropriate stage in the dispersion process, it can be desirable to change the solvent in the dispersion. It can also be desirable to increase the particle concentration of a dispersion/ink relative to an initial concentration used to form a good dispersion.

Solvent compositions can be generally changed at any convenient point in the processing as well as at multiple points in the overall processing. For example, in some embodiments, a solvent blend at a selected concentration can be formed after the initial mixing step. Also, additional mixing steps can be included in combination with the solvent changes, and solvent modification can be performed between multiple centrifugation steps. One approach for changing solvents involves the addition of a liquid that destabilizes the dispersion. The liquid blend then can be substantially separated from the particles through decanting or the like. The particles are then re-dispersed in the newly selected liquid. This approach for changing solvents is discussed in published U.S. patent application 2008/0160265, now U.S. Pat. No. 8,632,702, to Hieslmair et al., entitled "Silicon/Germanium Particle Inks, Doped Particles, Printing and Processes for Semiconductor Applications," incorporated herein by reference.

With respect to the increase of particle concentration, solvent can be removed through evaporation to increase the concentration. This solvent removal generally can be done appropriately without destabilizing the dispersion. A lower boiling solvent component can be removed preferentially through evaporation. A combination of evaporation and further solvent addition can be used to obtain a target solvent blend. Solvent blends can be particularly useful for the formation of ink compositions since the blends can have multiple liquids that each contribute desirable properties to the ink. In some embodiments, a low boiling temperature solvent component can evaporate relatively quickly after printing to stabilize the printed ink prior to further processing and curing. A higher temperature solvent component can be used to adjust the viscosity to limit spreading after printing. Thus, for many printing applications, solvent blends are desirable. The overall solvent composition can be adjusted to yield desired ink properties and particle concentrations.

For appropriate embodiments, the design of a solvent blend can be based on the ability to maintain a good dispersion after the initial formation of the dispersion. Thus, a desirable approach for the formation of inks with desired properties is to form a good dispersion of the particles and to maintain the good dispersion of the particles through the blending of solvents. The blend of solvents is selected such that the different liquids combine to form a single phase through the miscibility or solubility of the liquids with respect to each other. In some embodiments, it can be desirable to form dispersions by initially dispersing the as-synthesized particles in a blend of solvents. In some embodiments, an additional solvent can be added to the dispersion after initial mixing. Generally, a solvent can be added to a dispersion without destabilizing the dispersion. However, it can also be desirable to further mix a dispersion after addition of a solvent. Similarly, the viscous polycyclic alcohol can be added to the dispersed nanoparticles with appropriate to form the desired ink/paste composition.

Ink Deposition and Processing

The silicon based nanoparticle inks can be deposited using a selected approach that achieves a desired distribution of the dispersion on a substrate. The inks of particular interest comprise a viscous polycyclic alcohol, and silicon based nanoparticle pastes are of particular interest. In general, various coating and printing techniques can be used to apply the ink to a surface. Coating methods can be particularly efficient for uniformly covering large surface areas with an ink in a relatively short amount of time. Using selected printing approaches, patterns can be formed with moderate resolution. In some embodiments, coating and/or printing processes can be repeated to obtain a thicker deposit of ink and/or to form overlapping patterns. Suitable substrates include, for example, polymers, such as polysiloxanes, polyamides, polyimides, polyethylenes, polycarbonates, polyesters, combinations thereof, and the like, ceramic substrates, such as silica glass, and semiconductor substrates, such as silicon or germanium substrates. The composition of the substrates influences the appropriate range of processing options following deposition of the dispersion/ink as well as the suitable application for the resulting structure. Following deposition, the deposited material can be further processed into a desired device or state.

For many applications it is desirable to use a silicon substrate. Suitable silicon substrates include, for example, silicon wafers, which can be cut from silicon ingots, or other silicon structures, such as those known in the art. Silicon wafers are commercially available. In other embodiments, suitable substrates include, for example, various thin sheets of silicon/germanium such as foils, as described in published U.S. Patent application 2007/0212510A to Hieslmair et al., entitled "Thin Silicon or Germanium Sheets and Photovoltaics Formed From Thin Sheets," incorporated herein by reference.

Each printing/coating step may or may not involve a patterning. The ink may or may not be dried or partially dried between the respective coating and/or printing steps. Sequential patterned printing steps generally involve the deposition onto an initially deposited ink material. The subsequent deposits may or may not approximately align with the initially deposited material, and further subsequently deposited patterns of material may or may not approximately align with the previously deposited layers. Thus, multiple layers can be present only at a subset of the ink deposit. To obtain desired thickness of deposited inks, a coating or printing process can be repeated to form multiple layers of the ink with a corresponding greater thickness. In some embodiments, the printing/coating can be repeated for a total of two printing/coating steps, three printing/coating steps, four printing/coating steps or more than four printing/coating steps. However, polymers can be used to form an ink with a reduced nanoparticle loading to reduce the thickness of a printed deposit following drying and the removal of organic components.

Suitable coating approaches for the application of the dispersions include, for example, spin coatings, dip coating, spray coating, knife-edge coating, extrusion or the like. In general, any suitable coating thickness can be applied, although in embodiments of particular interest, average coating thickness can range from about 10 nm to about 500 microns, in some embodiments from about 25 nm to about 400 microns and in further embodiments from about 50 nm to about 250 microns. In some embodiments, suitable electronic properties can be achieved with low average coating thickness, which can save on material use and corresponding cost. In some embodiments, average coating thickness can be from about 100 nm to about 1.5 microns, in further embodiments from about 125 nm to about 1 micron, in additional embodiments from about 150 nm to about 700 nm. A person of ordinary skill in the art will recognize that additional ranges of thicknesses within the particular ranges above are contemplated and are within the present disclosure. The ranges of thicknesses similarly can be applied using printing techniques that may only cover a portion of a substrate.

Spin coatings involves the deposition of an ink onto at least a portion of substrate and spinning the substrate to coat the substrate surface with the deposited ink. The rotational frequency of the substrate as well as the spin coating time can be selected with reference to the ink viscosity as well as the desired uniformity and thickness of the resulting coating. The substrate can be spun at a single rotational frequency or it can be spun at successively different frequencies for the same or for a different amount of time.

In knife-edge coating, a substrate is coated by depositing an ink onto the substrate surface with a selected thickness such that the dried and/or further processed coating has an ultimate desired thickness of the coating. The inks for knife edge coating can be relatively viscous, and the inks comprising polymers described herein can be useful for knife edge coating application. A sharp edge is suspended over the substrate so that distance between the edge of the knife and the substrate surface corresponds to the selected initial thickness of the coating. The substrate is then moved relative to the knife such that as the substrate moves past the blade, the deposited ink is reduced to the desired thickness. Substrate movement rates can be selected based upon the desired quality of the formed film as well as on ink characteristics. For example, a coating rate that is too high can undesirably affect the formed coating due to an undesirable increase in ink pressure as it passes under the knife edge. Slower coating rates result in longer residence time of the ink on the surface and can lead to undesirable evaporation of solvent from ink prior to moving passed the knife edge. The selection of the substrate movement rate is based upon a balance of these and other factors, including but not limited to, desired coating thickness, ink viscosity, and knife blade geometry.

Similarly, a range of printing techniques can be used to print the dispersion/link into a pattern on a substrate. Suitable printing techniques include, for example, screen printing, inkjet printing, lithographic printing, gravure printing and the like. The selection of the printing technique can be influenced by a range of factors including, for example, capital costs, ease of incorporation into an overall production process, processing costs, resolution of the printed structure, printing time and the like. The inks comprising a polymer as described herein are particularly effective for screen printing pastes.

Screen printing can offer desirable features for printing silicon inks for some applications. Screen printing apparatuses are commercially available and are widely used for various applications involving moderate resolution. The silicon based particles and processes described herein are suitable for forming good quality pastes for screen printing as demonstrated in the examples below. In a screen printing process, the screen printing paste generally has a high low shear viscosity. Thus, the paste is stable in a reservoir between printing steps. During a printing step high shear is applied to force the paste through the screen for printing. With the application of high shear, the non-Newtonian paste has a significantly reduced viscosity so that the paste can effectively flow through the screen. At the end of the printing process, the paste rests again without the application of shear.

In general, following deposition, the liquid evaporates to leave the silicon based nanoparticles and any other non-volatile components of the inks remaining. For some embodiments with suitable substrates that tolerates suitable temperatures and with organic ink additives, if the additives have been properly selected, the additives can be removed through the addition of heat in an appropriate atmosphere to remove the additives, as described above. Once the solvent and optional additives are removed, the silicon based particles can then be processed further to achieve desired structures from the particles. The viscous polycyclic alcohols are convenient for the removal of the organics through evaporation in an inert atmosphere. Thus, inks with viscous polycyclic alcohols generally can be dried to form nanoparticle deposits with low levels of oxidation, due to drying without an oxygen atmosphere if desired, as well as a low carbon contamination level since evaporation can be an effective and efficient approach to remove the viscous polycyclic alcohols along with other organic solvents.

For example, if the silicon based nanoparticles comprise elemental silicon, the deposited nanoparticles can be melted to form a cohesive mass of the silicon deposited at the selected locations. If a heat treatment is performed with reasonable control over the conditions, the deposited mass does not migrate significantly from the deposition location, and the fused mass can be further processed into a desired device. The approach used to sinter the silicon particles can be selected to be consistent with the substrate structure to avoid significant damage to the substrate during silicon particle processing. For example, laser sintering or oven based thermal heating can be used in some embodiments. Laser sintering and thermal sintering of silicon nanoparticles is described further in published U.S. patent application 2011/0120537 to Liu et al., entitled "Silicon Inks for Thin Film Solar Cell Formation, Corresponding Methods and Solar Cell Structures," incorporated herein by reference. The use of highly doped silicon nanoparticles for dopant drive in applications is described further below.

Annealing and Dopant Drive-In

The doped silicon based nanoparticles can be used as a dopant source that can then provide dopant elements for driving into an adjacent surface, such as a silicon substrate. For doped silicon nanoparticle deposits, the annealed silicon structure formed during the drive in process can be used to form a portion of the ultimate device. Dopant drive in can be improved, especially for phosphorous dopants, through the use of a capping layer to limit dopant evaporation during the drive in process. Suitable capping layers can range from physical covers, a substrate placed adjacent and over the drive in surface and various coatings as a capping layer. With the use of a capping layer, effective dopant drive in can be performed using a nanoparticle deposit source.

A capping layer based on a physical covering or a dielectric coating has been described to cover a doped silicon nanoparticle ink to facilitate dopant drive-in. See, the '769 application cited above. The capping layer as described in the '769 application can be a dielectric material that does not substantially penetrate into the silicon nanoparticle layer. For example, the capping layer can be formed from a spin-on glass. Desirable results have been obtained with an amorphous silicon capping layer. For example, an amorphous silicon capping layer can be efficiently deposited using a chemical vapor deposition (CVD) approach, such as low pressure CVD. An initial anneal step can be performed to densify the composite of the nanoparticles and the amorphous silicon prior to a higher temperature dopant drive in step. After an anneal process, the resulting material can be a dense nanocrystalline silicon material. The use of an amorphous silicon capping layer is described further in published U.S. patent application 2013/0105806 to Liu et al. (the '806 application), entitled "Structures Incorporating Silicon Nanoparticle Inks, Densified Silicon Materials From Nanoparticle Silicon Deposits And Corresponding Methods," incorporated herein by reference.

Following dopant drive in, for embodiments with a silicon substrate, dopant concentrations remain relatively constant through the entire thickness of the nanocrystalline-Si layer and then elevated concentrations extend into the silicon substrate. The dopant profile indicates a dopant concentration in the nanocrystalline surface layer that transitions into a dopant profile extending into the silicon substrate. In some embodiments, dopant concentration decreases gradually with depth below the substrate surface. The dopant profile can have a shape approximating a Gaussian function indicating a decrease in dopant concentration extending into the silicon wafer surface until the background concentration is reached. In other embodiments, processing conditions can be selected to reduce dopant drive-in, the dopant concentration drops sharply from an elevated level to a background concentration at depths below the substrate surface at the interface between the nanocrystalline layer and the substrate. The dopant profile then has an approximately rectangular shape forming a sharp junction. Assuming that the substrate has a set low dopant concentration, the sharp junction can be a p/n junction or a high/low dopant concentration junction depending on whether opposite types or alike types of dopants are introduced into the substrate and the nanocrystalline layer. Sharp junctions have an electric field of relatively greater strength in comparison with diffusion-derived junctions having Gaussian type profiles. The characteristics of the dopant profiles described herein and achieved in the examples are suitable for the formation of efficient solar cells.

The characteristics of the dopant profile generally depend on the characteristics of the silicon nanoparticle layer and the amorphous silicon capping layer, as deposited, as well as the processing conditions. The dopant profile can be measured using Secondary Ion Mass Spectrometry (SIMS) to evaluate the elemental composition along with sputtering or other etching to sample different depths from the surface. If good ohmic contact is desired at the surface such as with a metal current collector, it can be desirable for the surface doping to be relatively large, such as from about $5 \times 10^{19}$ dopant atoms per cubic centimeter (atoms/cc) to about $5 \times 10^{21}$ atoms/cc and in some embodiment from $7 \times 10^{19}$ atoms/cc to about $2 \times 10^{21}$ atoms/cc to provide for good ohmic contact while maintaining low surface recombination. A plateau region in the dopant profile generally can be observed with a relatively flat slope of log concentration as a function of depth below the surface and generally no more than about log(concentration)/depth of no more than about 0.5 [log(atm/cc)/micron] and in some embodiments no more than about 0.5 [log(atm/cc)/micron] and a depth of the plateau from about 0.1 to about 0.8 microns and in further embodiments from about 0.15 to about 0.6 microns. A person of ordinary skill in the art will recognize that additional ranges within the explicit ranges above of surface dopant characteristics are contemplated and are within the present disclosure. These surface dopant parameters are generally applicable whether or not there is good dopant drive in into the silicon substrate.

To characterize the overall dopant profile into the silicon substrate following dopant drive-in used to drive dopant into the silicon substrate surface, we use an additional parameter, the depth at a dopant concentration of $1 \times 10^{19}$ atoms/cc. With respect to depth, the dopant profile can have a depth at a dopant concentration of $1 \times 10^{19}$ from about 0.5 microns to about 2.5 microns, in further embodiments from about 0.6 microns to about 2 microns and in other embodiments from about 0.7 microns to about 1.8 microns. For embodiments with limited dopant drive in, the depth from the edge of the surface plateau region to a dopant concentration of $1 \times 10^{18}$ atoms/cc can be no more than about 0.3 microns. A person of ordinary skill in the art will recognize that additional ranges of dopant profile parameters within the explicit ranges above are contemplated and are within the present disclosure.

Following dopant drive-in, the resulting silicon sheet can be characterized with a sheet resistance. The sheet resistance can be measured with a 4-point probe. Measurements with the 4-point probe can then be scaled according to the geometric parameters to obtain the sheet resistance. Based on the doping using doped silicon nanoparticles and the dopant drive-in process as described herein, sheet resistances can be obtained of no more than about 120 Ω/□, in further embodiments from about 100 Ω/□ to about 1 Ω/□, in additional embodiments from about 60 Ω/□ to about 5 Ω/□, and in other embodiments from about 50 Ω/□ to about 10 Ω/□. A person of ordinary skill in the art will recognize that additional ranges of sheet resistance within the explicit ranges above are contemplated and are within the present disclosure.

The dopant drive-in generally can be performed at a temperature from about 700° C. to about 1400° C., in further embodiments from about 725° C. to about 1200° C., and in other embodiments from about 750° C. to about 1100° C. The dopant drive-in can be performed for about 5 minutes to about 6 hours, in further embodiments for about 10 minutes to about 3 hours and in additional embodiments for about 15 minutes to about 2 hours. A person of ordinary skill in the art will recognize that additional ranges of dopant processing temperatures and times within the explicit ranges above are contemplated and are within the present disclosure. If desired, an initial heating step at a lower temperature can be used to stabilize the composite prior to performing the anneal step. The dopant profile within the substrate surface may depend to some degree on the dopant drive-in parameters and the selection of the processing parameters may be influenced by the target dopant profile after the dopant drive-in.

In additional or alternative embodiments, the silicon nanoparticles can be effectively and rapidly annealed and/or subjected to dopant drive in with a rapid thermal process. For example, the annealing of the silicon composite can be accomplished with a heat lamp, such as a xenon heat lamp. The radiation from the heat lamp can be irradiated over the surface of in other embodiments scanned relatively rapidly across the substrate surface to anneal the silicon. The intensity and irradiation times can be selected to anneal the silicon deposits and in appropriate embodiments to drive the dopant into a silicon substrate, without otherwise significantly affecting the silicon substrate.

In addition to thermally driven dopant drive in, effective dopant drive in can be driven by a collimated energy beam, such as a laser beam. For example, if a laser beam is directed at a doped silicon nanoparticle deposit, the energy from the laser can provide local heating to correspondingly drive the dopant into the substrate. Laser dopant drive in is described further in U.S. Pat. No. 8,409,976 to Hieslmair, entitled "Solar Cell Structures, Photovoltaic Panels, and Corresponding Processes," and published U.S. patent application 2010/0294349 to Srinivasan et al., entitled "Back Contact Solar Cells with Effective and Efficient Designs and Corresponding Patterning Processes." both of which are incorporated herein by reference. Suitable laser frequencies can be selected, such as green lasers, infrared lasers and/or ultraviolet lasers.

It may be desirable to perform a silicon oxide etch after the annealing and/or dopant drive-in to remove any silicon oxide that may have formed along the surface of the material during processing and prior to further processing to form a product. If oxygen is aggressively kept from the material through the entire process, the silicon oxide etch may not be used. Silicon oxide etch can be performed with a buffered hydrogen fluoride solution or other appropriate solution. Similarly, a plasma etch or other dry etching process can be similarly used. A buffered oxide etch, can be performed for a few minutes to several hours, although a person of ordinary skill in the art will appreciate that all subranges within this range of times are contemplated. Incorporation of a silica etchant into the ink is described in the '831 application cited above.

As an alternative to a wet etch, a dry etch can be performed to remove a thin surface layer to remove any surface contaminants, such as on the order of a nanometer of thickness. Dry etching is generally performed in an evacuated chamber. A plasma is generally used to perform the dry etch, and ions of elements such as argon can be used as an inert etchant.

After performing the dopant drive-in and any densification and/or etching steps, the substrate with the annealed silicon coating can be assembled into a desired device, such as a solar cell, thin film transistor or other device. Representative application devices are described further below.

Semiconductor Applications

The silicon based nanoparticle inks are well suited for a range of applications in which low metal contamination is significant, such as formation of solar cell components, electronic circuit components or the like. In some embodiments, the ability to deliver highly doped elemental silicon with a low contamination level provides the ability to form components with good electrical properties with moderate resolution. In particular, doped inks can be used to form doped contacts for crystalline silicon solar cells. Similarly, the inks can be used to form components of thin film transistors. Upon deposition and drying of the inks, the resulting nanoparticle deposits can be processed into densified silicon structures. Other silicon nanoparticle compositions can be used for dopant delivery and/or for dielectric components in similar types of applications in which metal contamination is undesirable.

For solar cell, thin film transistor and other semiconductor applications, silicon particles can be used to form structures, such as doped elements, that can form a portion of a particular device. For particular applications, patterning or no patterning can be used as desired for a particular application. In some embodiments, the inks can be used to form layers or the like of doped or intrinsic silicon. The formation of silicon layers can be useful for formation or thin film semiconductor elements, such as on a polymer film for display, layers for thin film solar cells or other applications, or patterned elements, which can be highly doped for the introduction of desired functionality for thin film transistors, solar cell contacts or the like. In particular, doped silicon inks are suitable for printing to form doped contacts and emitters for crystalline silicon based solar cells, such as for selective emitter, local back surface field contacts, or back contact solar cell structures.

The formation of a solar cell junction can be performed, for example, using the screen printing of an elemental silicon ink with thermal densification in which the processing steps are folded into an overall processing scheme. In some embodiments, doped silicon particles can be used as a dopant source that provides a dopant that is subsequently driven into the underlying substrate to for a doped region extending into the silicon material. Following dopant drive-in, the silicon particles may or may not be removed. Thus, the doped silicon particles can be used to form doped contacts for solar cells. The use of doped silicon particles for dopant drive-in is described further in the '''769 application cited above.

For crystalline silicon based solar cells, doped silicon based inks can be used to provide dopants for the formation of doped contacts, such as and emitters along both surfaces of the cell or along the back surface of the cell, i.e., back contact solar cells. The doped contacts can form local diode junctions that drive collection of a photocurrent. Suitable patterning can be accomplished with the inks. Some specific embodiments of photovoltaic cells using thin semiconductor foils and back surface contact processing is described further in published U.S. patent application 2008/0202576 to Hieslmair (the '576 application), entitled "Solar Cell Structures, Photovoltaic Panels, and Corresponding Processes," incorporated herein by reference.

Figure 2:
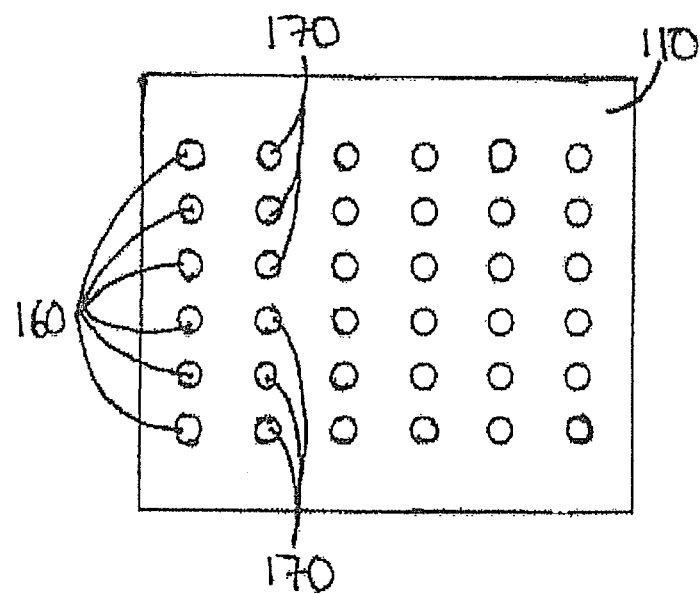
FIG. 2 is a bottom view of the back contact photovoltaic cell depicted in FIG. 1, showing only the semiconducting layer with doped islands deposited thereon.

Referring to FIGS. 1 and 2, a representative embodiment of an individual photovoltaic cell is shown. The photovoltaic cell in these figures is a back contact only cell, although the inks described herein can be effectively used for other photovoltaic cell designs. Photovoltaic cell 100 comprises a semiconductor layer 110, a front surface passivation layer 120, a rear surface passivation layer 130, negative current collector 140, and positive current collector 150. FIG. 2 is a bottom-view of photovoltaic cell 100, showing only semiconducting layer 110 with deposited n-doped islands 160 and p-doped islands 170. For clarity, only the first two columns of doped islands are labeled, however successive columns are analogously doped with alternating dopant type. Collector 140 generally is in electrical contact with n-doped islands 160. Collector 150 generally is in electrical contact with p-doped islands 170. Holes can be created through rear surface passivation layer 130 in alignment with the doped islands 150, 160 and filed with current collector material to make electrical contact between doped islands 160, 170 and corresponding current collectors 140, 150. Each current collector has sections along opposite edges of the cell to connect the columns and to provide for connection of the current collectors. Other selected patterns can be used for the doped contacts in which the pattern provides for connections of commonly doped contacts with non-overlapping current collectors.

The '576 application describes forming shallow doped regions in some embodiments. These shallow doped regions can be conveniently formed by printing the doped silicon and using heat and/or light, such as from a laser or flash lamp, to fuse the doped silicon into corresponding doped contacts. This processing can further lead to dopant drive-in to supply dopant in the initial silicon material. Also, the doped silicon particles described herein can be also used to deliver the dopant atoms to the underlying silicon substrate. Also, other similar solar cell elements can be formed on other silicon or other semiconducting substrates for solar cell applications. Dopant drive-in and silicon particle fusing is described further in the '769 application cited above. If the silicon based nanoparticles are used solely as a dopant source, some or all of the remains of the particles can be removed following processing if desired. Nanoparticles can be removed following processing using, for example, suitable etching agents, which are known in the art.

The inks can be effectively used to form thin film solar cells. In particular, nanocrystalline silicon can absorb significantly more visible light for a given thickness of material compared with highly crystalline silicon. In particular, for thin film solar cells, a stack with layers of p-type and n-type silicon are deposited, optionally with an intrinsic silicon layer between the doped layers to form a p-(i)-n diode junction across the cell. A plurality of stacks can be used if desired. The silicon inks described herein can be used to form one or more of the layers or portions thereof. The formation of thin film solar cells with silicon inks is described further in published U.S. patent application 2011/0120537 to Liu et al., entitled "Silicon Inks for Thin Film Solar Cell Formation. Corresponding Methods and Solar Cell Structures," incorporated herein by reference.

The silicon based inks can also be used for the formation of integrated circuits for certain applications. Thin film transistors (TFTs) can be used to gate new display structures including, for example, active matrix liquid crystal displays, electrophoretic displays, and organic light emitting diode displays (OLED). Appropriate elements of the transistors can be printed with silicon based inks using conventional photolithographic approaches or for moderate resolution using screen printing or other suitable printing techniques. The substrates can be selected to be compatible with the processing temperatures for the ink. TFTs comprise doped semiconductor elements and corresponding interfaces. For example, thin film transistors used as electronic gates for a range of active matrix displays are described further in Published U.S. Patent Application number 2003/0222315A to Amundson et al., entitled "Backplanes for Display Applications, and Components for use Therein," incorporated herein by reference. Similarly, the use of a plurality of TFTs in a display device is described in U.S. Pat. No. 8,188,991 to Ohhashi et al., entitled "Display Device and Driving Method Thereof," incorporated herein by reference.

To form a device component from the silicon based nanoparticle deposit, the material can be heated. For example, the structure can be placed into an oven or the like with the temperature set to soften the particles such that fuse into a mass. This can be done, for example, by heating the substrate in an oven to relatively high temperatures, such as about 750° C. to 1250° C. to obtain a solid mass from the particles in intimate contact with the substrate surface. The time and temperature can be adjusted to yield a desired fusing and corresponding electrical properties of the fused mass. Appropriate approaches can be used to heat the surface of the substrate with the deposit. The heating of a silicon wafer with silicon based nanoparticle ink coating in an oven or with a laser to form a fused mass is described further in the '769 application cited above. In alternative embodiments, a flash lamp, infrared lamp or the like can be used to provide rapid thermal processing of deposited silicon based nanoparticles. Thermal and light based fusing of silicon particles is described further in the '905 patent application cited above.

EXAMPLES

Example 1

Paste Formation-Phosphorous Doped Nanoparticles

This example describes formation and demonstrates purity of silicon nanoparticle pastes based on viscous alcohols, which are described below in further examples with respect to properties and performance of silicon nanoparticle pastes.

The pastes were formed from concentrated dispersions comprising phosphorous doped silicon nanoparticles, a viscous polycyclic alcohol, and a solvent or solvent blend. The doped silicon nanoparticles were formed using laser pyrolysis essentially as described in Example 2 of published U.S. patent application 2011/0318905 to Chiruvolu et al., entitled "Silicon/Germanium Nanoparticle Inks, Laser Pyrolysis Reactors for the Synthesis of Nanoparticles and Associated Methods." incorporated herein by reference. The silicon particles had an average primary particle diameter of about 20 nm and comprised 2-4 atomic percent phosphorous dopant (100×P/(Si+P)).

For each paste sample, a slurry was first formed by adding an appropriate amount of nanoparticle silicon powder to a volume of isopropyl alcohol ("IPA"). The mixture was then mixed by sonication to form a dispersion. The dispersion was then rotovaped to partially remove IPA and concentrate the dispersion to some extent. Subsequently, a volume of propylene glycol ("PG") was added to the concentrated dispersion and the resulting mixture was sonicated. The sonicated mixture was then placed in the rotavap to further remove IPA until no further condensation observed, to form a base paste. It is noted that completely removing IPA from the Si dispersion system is not practically possible by rotavap and small residue of IPA definitely can stay. Unless specified, the base pastes were prepared based on the same starting ratio of Si/IPA. Thus, small portion of IPA residue in final pastes is not listed as a component or a variable for discussion.

Subsequently, a mixture was formed by adding a non-Newtonian viscous polycyclic alcohol (VPA) to the base paste at a weight ratio 1-7 parts VPA to 1 parts base paste and the mixture was homogenized using a mechanical mixer (Thinky USA, Inc., California). The VPA was obtained from a commercial supplier in purified form. The homogenized mixture was then placed in a sample jar for testing.

To demonstrate purity, a paste sample was formed as described above with a weight ratio of 2 parts VPA to 1 part base paste. The paste sample and VPA used to form the paste sample were then analyzed using inductively couple plasma-mass spectrometry (ICP-MS) to measure the metal concentrations therein. Table 1 displays the metal concentrations in parts per billion (ppb) by weight.

TABLE 1

| | ICP-MS Metal Impurity (ppb) | | | |
|---|---|---|---|---|
| Elements | Detection Limit | In VPA | Detection Limit | In Paste |
| Al | 2 | 5.4 | 0.5 | 2.8 |
| Sb | | | 0.5 | <0.5 |
| As | | | 1 | <1 |
| Ba | 0.5 | 0.52 | 0.1 | <0.1 |
| Be | 2 | <2 | 0.5 | <0.5 |
| Bi | 2 | <2 | 0.5 | <0.5 |
| B | | | 1 | 3.0 |
| Cd | 0.5 | <0.5 | 0.1 | <0.1 |
| Ca | 5 | 10 | 1 | 48 |
| Cr | 5 | <5 | 0.5 | 21 |
| Co | 2 | <2 | 0.1 | <0.1 |
| Cu | 2 | <2 | 0.5 | <0.5 |
| Ga | 0.5 | <0.5 | 0.1 | 1.8 |
| Ge | | | 0.5 | 1.7 |
| Au | | | 1 | <1 |
| Fe | 5 | <5 | 1 | 10 |
| Pb | 1 | <1 | 0.5 | <0.5 |
| Li | 1 | <1 | 0.5 | <0.5 |
| Mg | 2 | <2 | 0.5 | 9.0 |
| Mn | 1 | <1 | 0.5 | 0.67 |
| Mo | 1 | <1 | 0.5 | <0.5 |
| Ni | 2 | <2 | 0.5 | <0.5 |
| Nb | | | 0.5 | <0.5 |
| P | | | 10 | 1,400,000 |
| K | 5 | <5 | 1 | 24 |
| Ag | | | 0.5 | <0.5 |
| Na | 5 | <5 | 1 | 22 |
| Sr | 0.5 | <0.5 | 0.1 | <0.1 |
| Ta | | | 0.5 | <0.5 |
| Tl | 1 | <1 | 0.5 | <0.5 |
| Sn | 2 | <2 | 0.5 | <0.5 |
| Ti | 2 | <2 | 0.5 | 2.8 |
| V | | | 0.5 | <0.5 |
| Zn | 2 | <2 | 0.5 | 42 |
| Zr | 2 | <2 | 0.1 | 1.1 |

Table 1 demonstrates VPA has low metal contamination with a 10 ppb measurement for Ca being the largest and most other metals are under 2 ppb level. All measured transition metals were below the detection limit. Similarly, the impurity data of processed Si nanoparticle paste with VPA shows that majority metals have less than 2 ppb and the highest concentration is from Ca 48 ppb. The largest transition metal contamination concentration was zinc at 42 ppb, and iron was at 10 ppb. Overall, the paste impurity level is low.

Example 2

Rheology and Printing Performance of Silicon Nanoparticle Pastes

This Example demonstrates the effect of paste characteristics on paste rheology and the printing performance of nanoparticle pastes. With respect to paste characteristics, this Example demonstrates the effects of solvent type, solvent composition, and nanoparticle concentration on the rheology of nanoparticle pastes.

For these paste formulations, metal contamination levels for the pastes are presented in Table 2.

TABLE 2

| Concentration | Phosphorous 2xP | | Boron 1xB | | |
|---|---|---|---|---|---|
| in ppb | 64-G00 | 67-10-1 | 64-G00 | 65-G00 | 67-1 |
| Chromium | 2.3 | 0.76 | 1.4 | 1.0 | 1.2 |
| Copper | 0.98 | 1.1 | <0.5 | <0.5 | <0.5 |
| Iron | 9.5 | 3.0 | 5.0 | 6.3 | 5.6 |
| Lead | <0.5 | <0.5 | <0.5 | <0.5 | <0.5 |
| Molybdenum | <0.5 | <0.5 | 0.63 | 0.61 | <0.5 |
| Nickel | 1.6 | 1.1 | 1.9 | 2.2 | <0.5 |
| Titanium | 0.71 | 1.9 | 3.2 | 3.7 | 1.1 |
| Zinc | 13 | 35 | 53 | 32 | 44 |
| Calcium | 17 | 50 | 20 | 21 | 33 |
| Magnesium | 2.1 | 14 | 2.7 | 3.0 | 10 |
| Potassium | 12 | 35 | 13 | 10 | 7.3 |
| Sodium | 18 | 37 | 12 | 10 | 7.6 |
| Aluminum | 1.8 | 5.5 | 4.8 | 3.7 | 2.2 |

Effect of Paste Composition on Rheology

All the rheology measurements were performed using a rheometer (Brookfield R/S-CPS+) at a temperature of 25° C. over a range of shear rate of (0 $s^{-1}$ to at least 1800 $s^{-1}$) except for pure VPA sample. The pure VPA sample was measured using the same equipment but at higher temperature 40° C. to reduce the viscosity to allow available spindle to be used.

Figure 3:
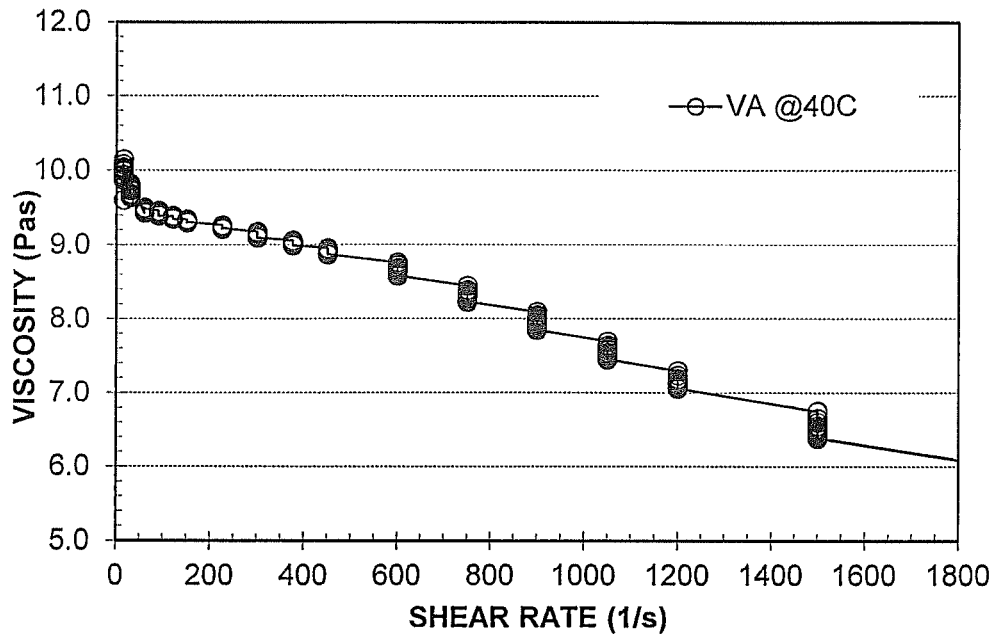
FIG. 3 is a plot of viscosity versus shear rate for a viscous polycyclic alcohol.

To demonstrate the effect of solvent composition on the rheology of nanoparticle pastes, the rheology of the pure solvent first investigated. Rheological measurements on the solvents showed that propylene glycol and terpineol were Newtonian over the range of shear rates tested and had viscosities of 0.049 Pascal-seconds (Pa·s) and 0.037 Pa·s, respectively. On the other hand, the rheological measurements on VPA showed the solvent to be non-Newtonian, i.e. with a shear dependent viscosity, specifically shear thinning. The room temperature viscosity of the VPA was believed to be roughly 50-90 Pa·s. FIG. 3 is a plot of viscosity versus shear rate for VPA. Additionally, the viscosities of VPA where significantly higher than viscosities of propylene glycol and terpineol over the range shear rates tested.

To demonstrate the effect of adding silicon nanoparticles to the solvents, 5 paste samples (samples 1-5) were formed with phosphorous doped nanoparticles as described in Example 1. Samples 1 and 2 where formed with VPA as described above. Sample 1 was formed 66.7 wt % VPA relative to paste weight. Paste sample 2 was formed with 83.1 wt % VPA relative to the paste weight. Besides different VPA concentration, these two samples also have different Si nanoparticle concentration (5 wt % in sample 1 and 1.9 wt % in sample 2) and propylene glycol concentration (28.3 wt % in sample 1 and 15 wt % in sample 2). Samples 3-5 pastes were formed similarly as above described method but with modification. In particular, samples 3 and 4 were formed without VPA and comprised only propylene glycol as a solvent. Similarly, sample 5 was also formed without VPA but comprised terpineol as a solvent. Sample 3 comprised 5 wt % silicon nanoparticles and samples 4 and 5 comprised 15 wt % silicon nanoparticles. After formation, the rheological characters of the samples were measured.

Figure 4:
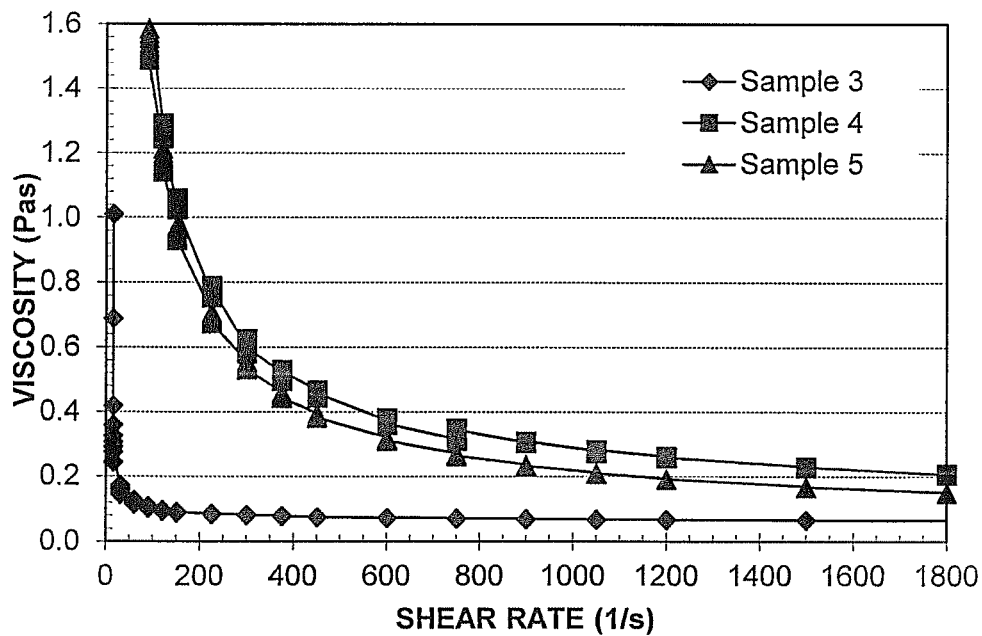
FIG. 4 is a graph containing plots of viscosity versus shear rate for two pastes comprising 5 weight percent and 15 weight percent silicon nanoparticles in propylene glycol and for one paste comprising 15 weight percent silicon nanoparticles in terpineol.

FIG. 4 is a graph displaying plots of viscosity versus shear rate for samples 3-5. The plots demonstrate that, for the samples tested, the addition of silicon nanoparticles to the solvent can significantly affect the rheology of the resulting pastes, relative to the corresponding pure solvents. In particular, the paste samples comprising only propylene glycol or terpineol solvents (samples 3-5) were non-Newtonian, in contrast with the pure solvent measurements. FIG. 4 indicates that the paste samples were non-Newtonian. Notably, the addition of the silicon particles the propylene glycol and terpineol solvents to form paste samples 3 and 4 and paste sample 5, respectively, qualitatively changed the rheology of the corresponding Newtonian solvents.

Furthermore comparison of the viscosities of samples 3 and 4 displayed in FIG. 4 demonstrates that for the samples tested, increased nanoparticle concentration resulted in a greater change in rheology relative to the corresponding pure solvent. In particular, the viscosity of sample 3 (5 wt % nanoparticles) was significantly shear dependent viscosity below shear rates of about 200 $s^{-1}$. Above about 200 $s^{-1}$, the viscosity was only weakly dependent on shear rate and relatively quickly approached the viscosity of pure propylene glycol. On the other hand, the viscosity of sample 4 (15 wt % nanoparticles) was significantly dependent on shear rate over the entire range tested, and the viscosities were also significantly increased relative to pure propylene glycol over the tested range of shear rates. Comparison of the viscosities of samples 4 and 5 in FIG. 4 demonstrates that the paste comprising propylene glycol solvent (sample 4) had slightly increased viscosities over the range of tested shear rates relative to the paste comprising terpineol solvent (sample 5). These results are consistent with the viscosities of the corresponding pure solvents above.

Figure 5:
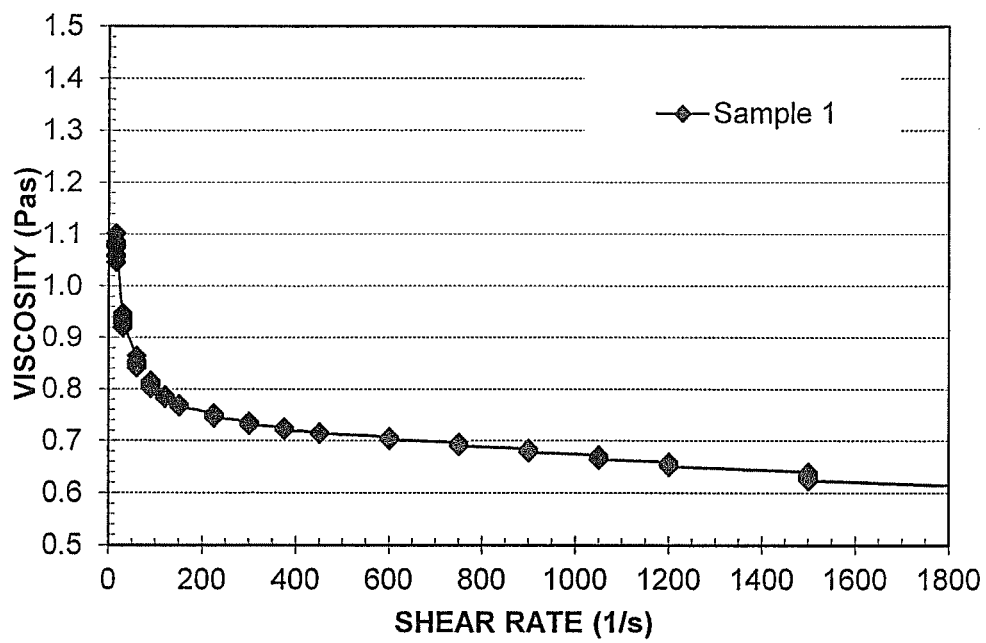
FIG. 5 is a plot of viscosity versus shear rate for a nanoparticle paste comprising 66 weight percent viscous polycyclic alcohol (VPA).
Figure 6:
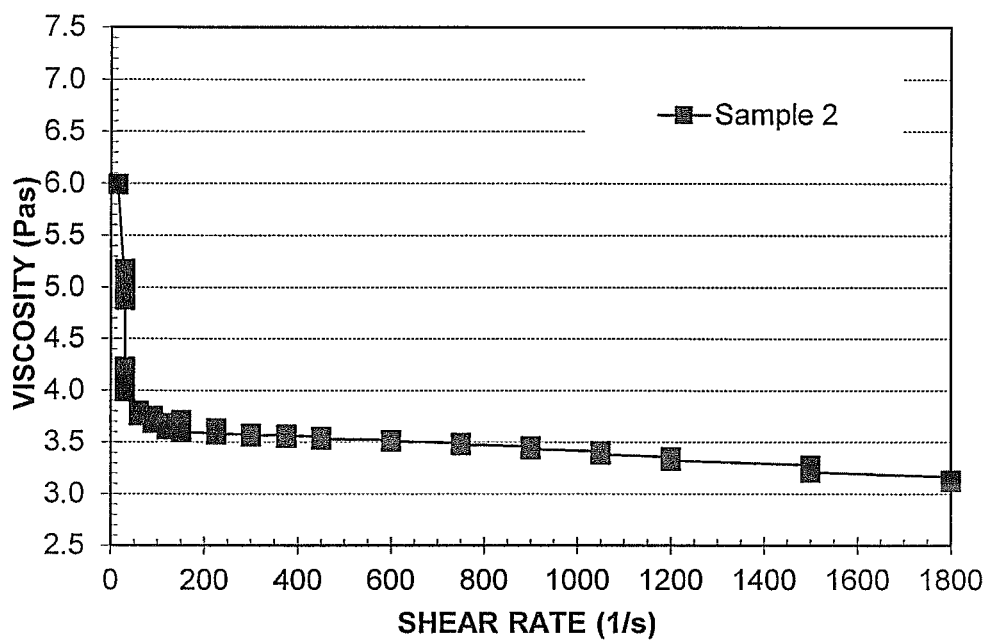
FIG. 6 is a plot of viscosity versus shear rate for a nanoparticle paste comprising 83.1 weight percent VPA.

FIGS. 5 and 6 are plots of viscosity versus shear rate for samples 1 and 2 (both comprising propylene glycol and VPA). Comparison of FIG. 3 with FIGS. 5 and 6 demonstrates the addition of nanoparticles and propylene glycol to the VPA can significantly change the rheology of the corresponding paste. In particular, FIGS. 5 and 6 show that samples 1 and 2 had significantly lower viscosities over the tested range of shear rates and the shear dependent viscosities were also qualitatively different behavior relative to pure VPA. Comparison between FIGS. 5 and 6 demonstrate the rheology of the samples could be adjusted by changing the ratio of paste components alone.

Similar formulations were made with boron doped paste at boron concentrations from 2-4 atomic percent, and the doped nanoparticles were produced as described in Example 1 for the phosphorous doped nanoparticles. Seven pastes were formed with selected solvent formulations and particle concentrations. Viscosities were measured at shear rates of 150 $s^{-1}$. The results are presented in Table 3. These results again demonstrate the ability to form desirable paste formulations with boron doped particles and VPA.

TABLE 3

| Sample | Type | Si (wt %) | Ethyl Cellulose (wt %) | Terpineol (wt %) | Propylene Glycol (wt %) | VPA (wt %) | Measured Viscosity at 150 s$^{-1}$ (PaS) | TGA Measured Si (wt %) |
|---|---|---|---|---|---|---|---|---|
| B-1 | P++ | 5.00% | 5.00% | 60% | 30% | 0 | 5.62 | 6.31 |
| B-2 | P++ | 5.00% | 0 | 0% | 30% | 65% | 0.56 | 6.1 |
| B-3 | P++ | 2.5% | 0 | 0% | 17.5% | 80% | 1.37 | 3.02 |
| B-4 | P++ | 3.3 | 0 | 0 | 18.7% | 78% | 1.17 | 4.3 |
| B-5 | P++ | 2.5% | 0 | 14.2% | 3.3% | 80% | 3.5 | 2.46 |
| B-6 | P++ | 2.0% | 0 | 23% | 0% | 75% | 3.36 | 2.05 |
| B-7 | P++ | 2.0% | 0 | 33% | 0% | 65% | 1.49 | 2.09 |

Screen Printing Performance of Si Nanoparticle Pastes—P Doped

The non-VPA containing pastes including samples 3-5, even with 15% of Si, the viscosity was too low at high shear rate (e.g. 1000-1800/s) to avoid significant spreading. In addition, PG and TP only base pastes both clogged screen even with 5% Si. To demonstrate printing performance of VPA containing paste samples, two VPA containing paste samples (paste samples 6 and 1) were formed as described above. In particular, paste sample 6 comprised 50 wt % VPA, 42.5 wt % PG, and 7.5 wt % Si relative to the paste whereas sample 1 as described above had 66.7% VPA. Paste samples 1 and 6 were then screen printed (HMI semi automatic screen printer) onto texturized, p-doped silicon wafer substrates to form lines having a target width of 200 μm and 300 μm, and dots having target diameter of 200 μm. Following screen printing, the screen printed paste was cured by heating the printed substrate in a stepwise process to 250° C. in air for 5 min. The cured wafer samples were labeled as sample 1-250a and sample 6-250a, which were printed from paste sample 1 and sample 6, respectively. Optical microscopy was used for printed feature characterization.

Figure 7:
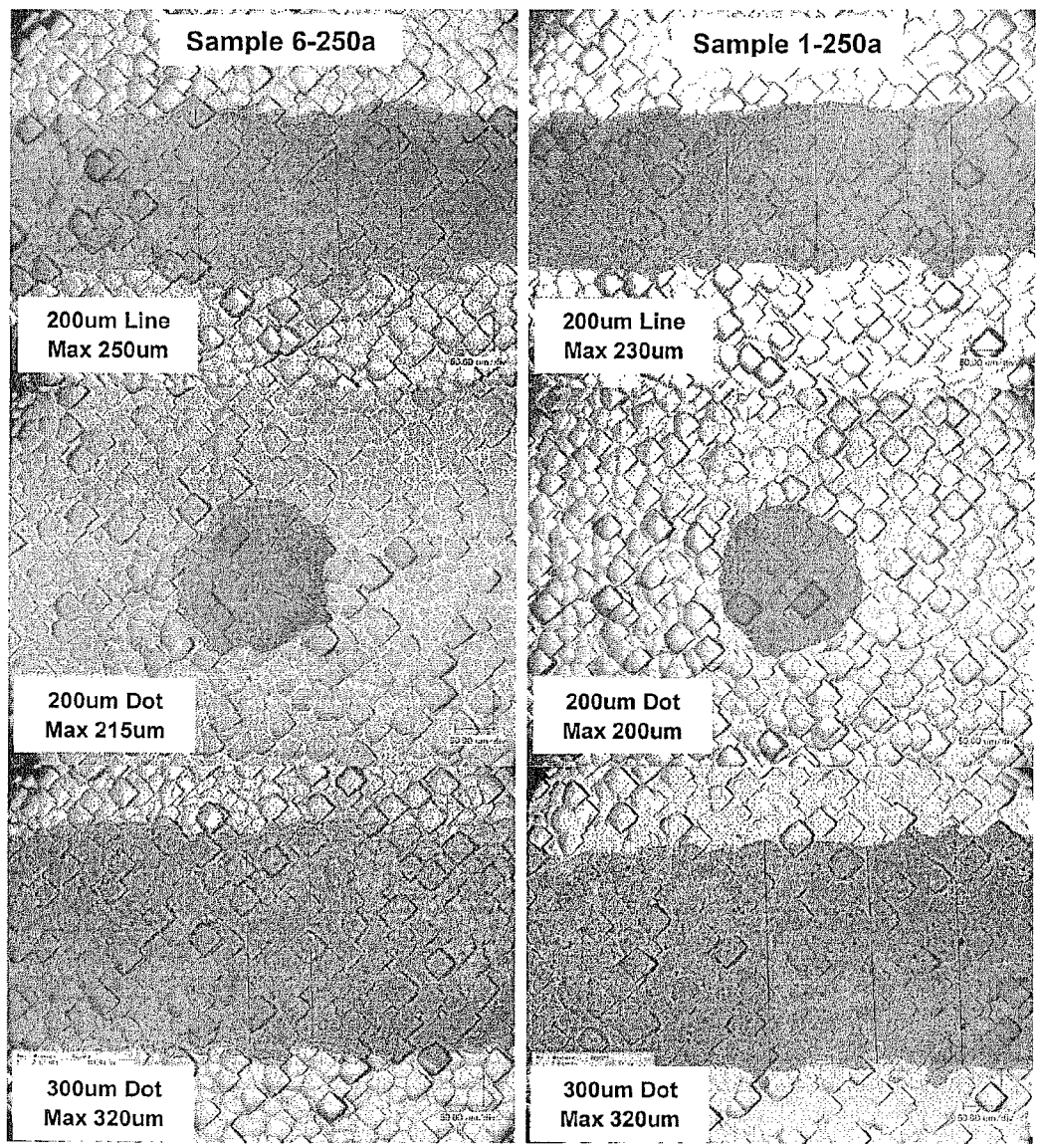
FIG. 7 is a composite of optical microscopy images of lines having a target width of 200 μm (top panels) and 300 μm (bottom panels) and a dot (middle panels) having a target width of 200 μm, screen printed with a nanoparticle pastes comprising 50 wt % VPA (left panels) and 66.7 wt % VPA (right panels).

FIG. 7 left and right columns are composites of optical microscopy images of printed films following curing from sample 6-250a and 1-250a, respectively. The top, middle and bottom panels show the printed line having a target width of 200 μm, the printed dot having a target diameter of 200 μm and the printed line having a target width of 300 μm, respectively. Generally, comparison of the images from these two samples demonstrates that paste sample 1 with increased VPA concentration had improved printing performance with respect to limiting of spreading for 200 μm structures and similar printing performance for 300 μm structures, relative to paste sample 6 having a lower VPA concentration. In particular, comparison of the top panels of FIG. 7 shows that for the lines printed with a target width of 200 μm, the line printed with paste sample 6 (50 wt % VPA) had a maximum width of 250 μm while the line printed with sample 1 (66.7 wt % VPA) had a maximum width of 230 μm. Similarly, comparison of the middle panels of FIG. 7 shows that for the dots printed with a target diameter of 200 m, the dot printed with sample 6 had a maximum diameter of 215 μm and the dot printed with sample 1 had a maximum diameter of 200 μm. With respect to the 300 μm structures, comparison of the bottom panels of FIG. 7 shows that for the lines printed with a target diameter of 300 μm, the lines printed with paste samples 6 and 1 both had a maximum width of 320 μm. In any case, all samples screen printed with VPA containing pastes had good screen printing performance.

To demonstrate the physical characteristics of the printed paste layers, in addition to paste sample 1, samples 7, 8, and 9 were also formulated. Sample 7 had the same Si and PG percentages as sample 1 except that it had 66.7 wt % of polymer ethyl cellulose (EC) instead of VPA. Si nanoparticle pastes formed with ethyl cellulose are described further in the '831 application cited above. Sample 8 was similar to sample 1 but with different ratio of components, in particular a lower concentration of nanoparticles, to achieve lower thickness of 250 nanometers (nm). In addition, the formulation of samples 1, 7 and 8 was also targeted at limiting the spreading of printed 200 μm line to 15%. Sample 9 was spin-coatable Si nanoparticle ink in IPA solvent/dispersant, which was prepared using the initial dispersion step of paste formation as described in Example 1. It was formulated to achieve 250 nm thick film under an appropriate spin-coating condition. After samples 1, 7, and 8 were screen-printed, and sample 9 was spin-coated on the same type of textured p-wafers, all the wafers were then cured for 5 min. at an elevated temperature of 540° C. in N$_2$ to remove organic residues. The cured film characteristics of the spin on coatings were similar to the characteristics of the deposits formed with the screen printing pastes with the VPA, which can be desirable for some applications of the pastes. Adding small amounts of VPA can be added to the spin coating inks to control the viscosity, and the VPA would not be expected to negatively influence the properties of the corresponding coatings.

The cured samples are labeled as samples 1-540n, 7-540n, 8-540n, and 9-540n, corresponding to paste samples 1, 7, 8, and ink sample 9, respectively. It should be mentioned that the removal of organic chemicals in the films made from samples 1, 8, and 9 in fact does not necessarily require high temperature 540° C. due to relatively low boiling-point nature of the alcohols (IPA, PG, and VPA) in these samples. The selection of 540° C. was only based on the consideration of EC removal. Nevertheless, one more wafer (sample 1-250n) was printed from sample 1 and cured at lower temperature 250° C. in N$_2$ for 5 min to demonstrate possibility of low-temperature curing. Scanning electron microscopy (SEM) images of cross sections and top views of cured films were obtained.

Figure 8:
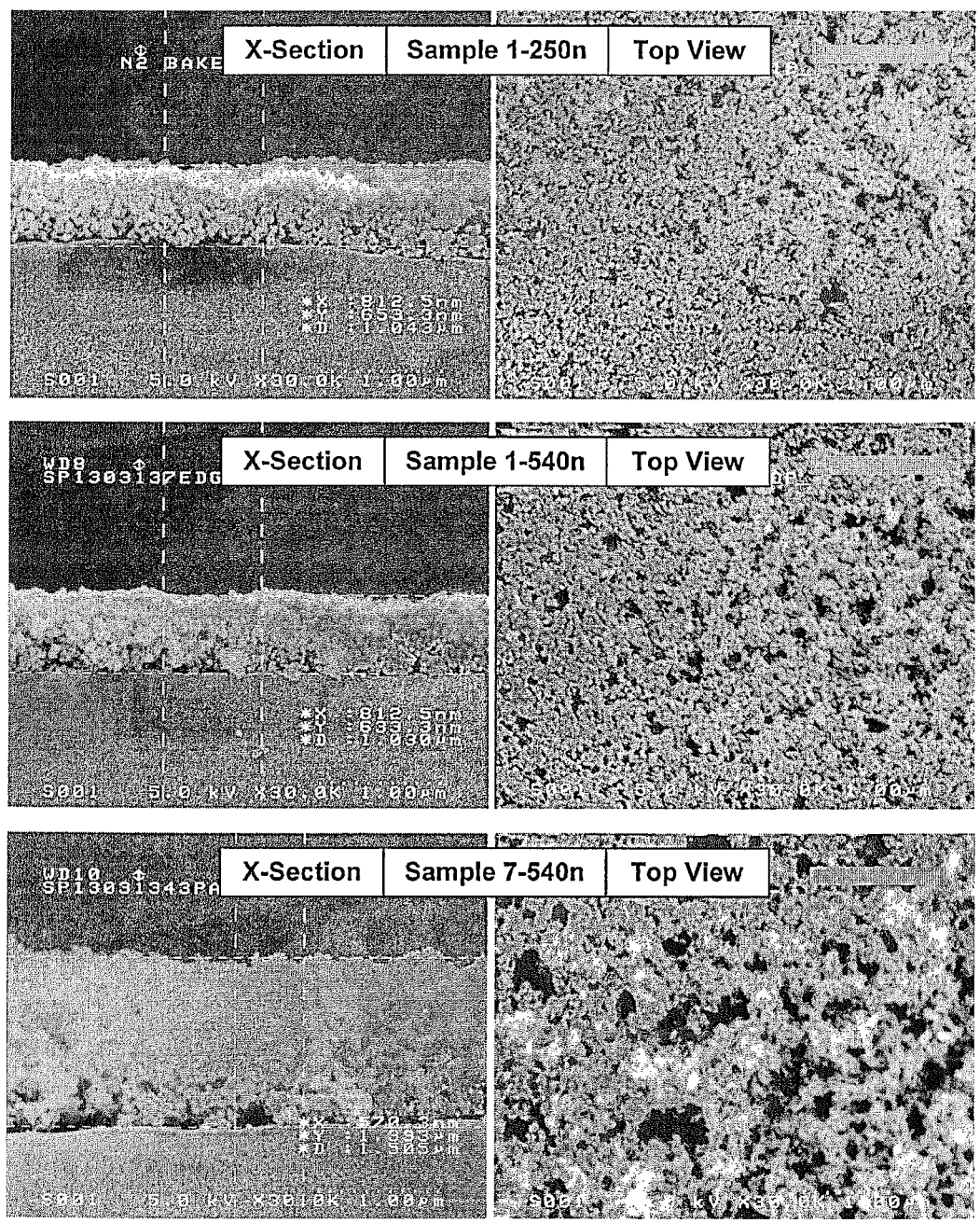
FIG. 8 is a composite of SEM images of cross sections (left column) and top views (right column) of coated wafers comprising a cured nanoparticle paste layer formed from a paste comprising VPA and cured at 250° C. (top row) and 540° C. (middle row) in nitrogen and from a paste comprising ethyl cellulose (bottom row) cured at 540° C. in nitrogen.

FIG. 8 top, middle, and bottom rows are SEM images of the wafer samples 1-250n, 1-540n and 7-540n, respectively. Comparison of images of samples 1-250n and 1-540n, similar structure was observed. In particular, cross-section thicknesses of 653 nm (sample 1-250n) and 633 nm (sample 1-540n) are considered the same within uniformity and measurement error and top-view surface morphology also qualitatively reflects the similar level of density. More characterizations and comparisons will be exemplified to demonstrate the possibility of low temperature curing without compromising diffusion capability and electric properties in Example 3.

Further comparison of sample 1-540n and 7-540n shows that although prints from paste sample 1 and paste sample 7 had similar edge definition (<15% spreading, images are not shown), printed paste sample comprising VPA (paste sample 1) had a smaller thickness (633 nm) relative to the printed paste sample comprising ethyl cellulose (paste sample 7), 1.39 μm. Moreover, comparison of top-view images of these two samples indicates printed feature based on paste sample 1 had relatively denser or less porous film than the one printed from paste sample 7. The different thickness and porosity results are mainly due to the significantly different chemistry nature of EC and VPA. For example, EC has polymer nature with large molecular weight and high burning-off temperature whereas VPA has smaller molecular size possessing general alcohol characteristics and easier to be removed. Thus, the quality of Si dispersion and binder/Si mixing in the paste could be substantially affected by different properties of these two binders.

Figure 9:
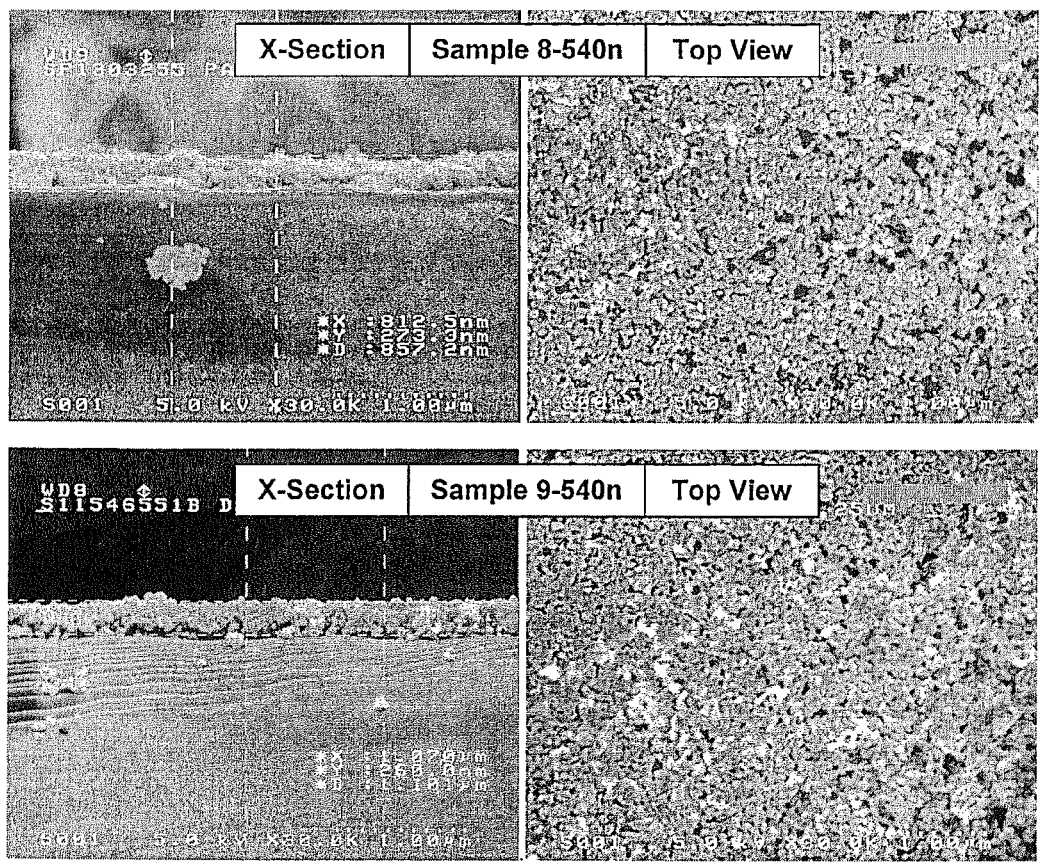
FIG. 9 is a composite of SEM images of cross sections (left column) and top views (right column) of a coated wafers comprising a cured nanoparticle paste layer formed from a paste comprising VPA (top row) and from an spin-coating ink comprising IPA and solvent.

More experiments were carried out to explore the advantages of VPA. FIG. 9, top and bottom rows are SEM images from samples 8-540n and 9-540n, respectively. Comparison of FIG. 9 images shows that both samples have films with quantitatively compatible thickness and qualitatively similar density. It is also noted that attempted formulations of polymer EC based paste have not met above properties of both low thickness and <15% of spreading requirement, or both high density and <15% of spreading requirement. It is expected that the spin-coating quality of nanoparticle inks comprising VPA can provide several advantages including increased particle packing density, reduced film thickness, lowered surface roughness, and reduced film defects.

Screen Printing Performance of Si Nanoparticle Pastes—B Doped

Screen printer pastes formed with VPA and boron doped silicon nanoparticles as described above were screen printed to evaluate the printing results. The screen printing pastes were printed as 350 micron width line (FIG. 10) and 200 micron width lines (FIGS. 11-13). Optical micrographs are shown for three printed lines with an average width of 350 micron (FIG. 10), 200 micron (FIG. 1), 225 micron, (FIG. 12), and 198 micron (FIG. 13). All of the inks demonstrated good printing properties.

Figure 14:
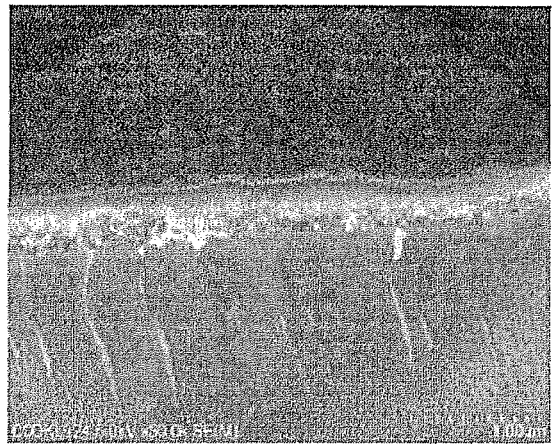
FIG. 14 is an SEM cross sectional view of a silicon wafer with a silicon nanoparticle line printed on the wafer with an average thickness of 250 nm with the view showing a thickness of 251 nm.
Figure 15:
FIG. 15 is an SEM cross sectional view of a silicon wafer of FIG. 14 with a silicon nanoparticle line printed on the wafer with an average thickness of 250 nm with the view showing a thickness of 549 nm.
Figure 16:
FIG. 16 is an SEM cross sectional view of a silicon wafer of FIG. 14 with a silicon nanoparticle line printed on the wafer with an average thickness of 250 nm with the view showing a thickness ranging from 103 nm to 178 nm.

To evaluate the uniformity of the lines, cross sectional micrographs were obtained for thickness variation measurements with different locations for a sample with an average thickness of 250 nm. Referring to FIGS. 14-16 showing thicknesses of 251 nm (FIG. 14), 549 nm (FIG. 15) and ranges from 103 nm to 178 nm (FIG. 16). This gives the range of thickness for this value of average thickness for substrates having the flatness used to obtain the measurements.

For these pastes, there was no noticeable spreading for 200 micron width lines and less than 15% width increase of the printed line relative to the screen. Thickness variation can be further improved upon adjustment of the ink formulations.

Figure 17:
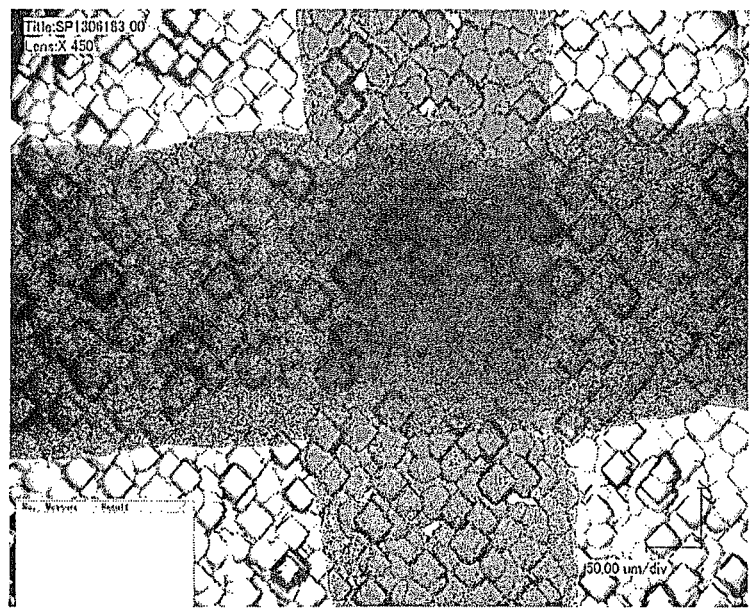
FIG. 17 is an optical image of a silicon wafer having a 200 micron line of phosphorous doped silicon nanoparticles printed to cross a 200 micron wide line of boron doped silicon nanoparticles.

To further test the printing properties, crossing lines of phosphorous doped paste and boron doped paste was performed. Sequentially printed crossing lines of phosphorous doped paste followed by boron doped paste are shown in FIG. 17. The crossing line printing exaggerates printing complexity. Some loss of material was observed upon subsequent printing at screen/wafer valleys.

Example 3

Dopant Drive-In Performance of Silicon Nanoparticle Pastes with VPA

This Example demonstrates the dopant drive-in performance of doped silicon nanoparticles pastes comprising VPA in which the dopant is driven into a silicon wafer surface. Dopant drive-in performance was demonstrated in terms of sheet resistance and substrate concentration profiles, following dopant drive-in.

To demonstrate doping performance, four wafers were screen printed from paste sample 1 onto textured, HF cleaned, n-type Si substrates, and the printed samples were cured in an oven at 250° C. or 540° C. in an air or nitrogen atmosphere for 5 min. Samples 1-250a, 1-250n, 1-540a, and 1-540n were prepared with 250° C. air, 250° C. nitrogen, 540° C. air, and 540° C. nitrogen curing conditions, respectively. Dopant drive-in was then performed by heating the coated wafers in a diffusion furnace at 1000° C. for 1 hour under a nitrogen atmosphere to form the final wafer samples, which were labeled as samples 1-250ad, 1-250nd, 1-540ad, and 1-540nd originated from samples 1-250a, 1-250n, 1-540a, and 1-540n, respectively. Dopant drive-in was performed using a Neytech Qex furnace. It is noted that although the furnace was supplied with continuous flow of $N_2$, it was not 100% $O_2$ free due to the design of the furnace. Thus, all the samples were subjected to the same low-level of oxidation during drive-in. The percentage $O_2$ was not quantified but it should not affect the relative comparison of this study.

During drive-in all coated wafers were assembled in a double wafer stack configuration (DWS). In the DWS configuration, one wafer without film (bare wafer) used as cover was stacked on top of a coated wafer in such a way that the paste layer of each wafer was in contact with the bare wafer. Both stacked wafers (coated and non-coated) were then secured by being sandwiched between two relatively heavy quartz plates. Subsequently, after dopant drive-in, the nanoparticle layer on the wafer samples were removed using buffered oxide etch (BOE). It should be noted that the exact original wafer surface cannot be practically exposed by etching process because certain thickness of Si film has to be retained to avoid accidental over-etch of underneath doped layer, which should be part of wafer substrate. The sheet resistances of the wafer samples were measured using a four point probe (4PP). All sampling points of 4PP measurement were uniformly taken within 1.5-inch diameter circular area located in the center region of wafers. For each sample, at least five measurements were made on each side of the wafer: film side and corresponding non-film side (back side). The same method was also used for bare wafer sheet resistance measurements. The wafer surface doping concentration and doping depth profile were measured by Second Ion Mass Spectrometry (SIMS).

Table 4 displays the sheet resistances (Rsh) and dopant drive-in processing parameters for the wafer samples. The data in the Table were collected from measuring film-side of the wafers. The Table demonstrates that wafers printed with VPA involved doped Si nanoparticle pastes can be doped with appropriate thermal treatment conditions. In general, the doping capability of the paste indicated by Rsh values shows several characteristics. Firstly, the doping capability is curing atmosphere dependent. In particular, both samples cured at 250° C. and 540° C. in nitrogen (sample 1-250nd and 1-540nd) had much lower Rsh values than samples cured in air (sample 1-250ad and 1-540ad). For example, sample 1-250ad had a Rsh of 121.4 ohm/sq, which is almost double of the value of sample 1-250nd (71.3 ohm/sq). Secondly, the doping capability also shows curing temperature dependency for samples cured in air. In particular, sample 1-250ad cured in air at 250° C. had a Rsh value of 121.4 ohm/sq, which is almost half of the Rsh (207.7 ohm/sq) of sample 1-540ad cured in air at 540° C. Most of the film area of sample 1-540ad even covered by bare wafer including the center of the film had much more oxidation than sample 1-250ad (data not shown). Because the oxidation contribution during drive-in step was limited and fixed for all the samples, the extra oxidation in sample 1-540ad can be caused during curing step due to increased temperature. Above doping properties reveal the important role of oxygen in the final doping capability of silicon paste. The exact reasons and mechanism for the oxygen impact are under investigation. Also, the doping capability does not show noticeable curing temperature dependency for samples cured in nitrogen. In particular, sample 1-540nd, which was cured at 540° C. in $N_2$ had a compatible Rsh (73 ohm/sq) as that of sample 1-250nd, which was cured at 250° C. in $N_2$.

Figure 18:
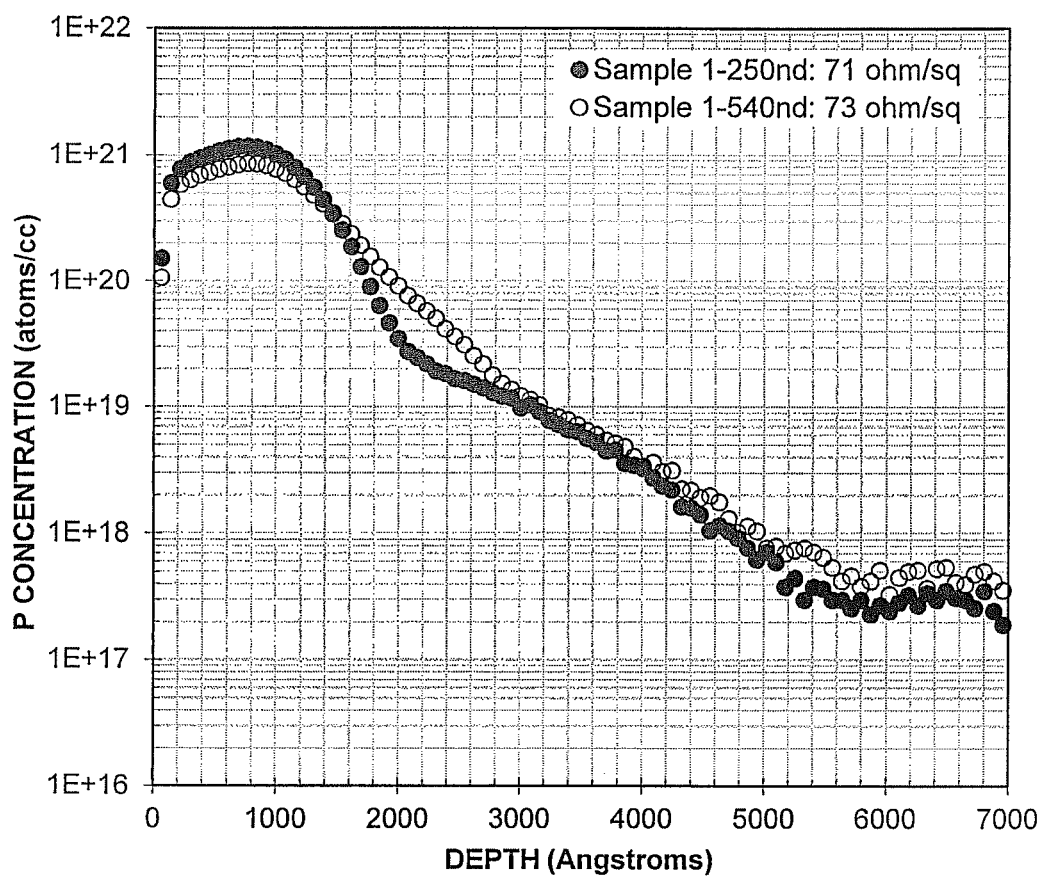
FIG. 18 is a graph containing plots of phosphorous concentration as function of depth from a wafer surface after performing dopant drive-in on nanoparticle paste coated wafers cured at 250° C. and 540° C.

Overall, VPA based Si paste shows similar curing condition dependency of Rsh as what EC based Si paste does except the last character, where in contrary, EC based Si paste showed curing temperature dependency of Rsh in nitrogen. The difference could be understood based on different thermal behaviors of polymer EC and solvent VPA. The thermal removal of EC is mainly driven by the depolymerization and oxidation based decomposition mechanism while the removal process of VPA is molecule evaporation driven. Thus, lower temperature cure especially in $N_2$ could cause more EC and/or carbon residue in the sample, which became difficult to be removed even at drive-in temperature due to DSW configuration induced sealing effect. The polymer associated residues could eventually have negative impact on dopant drive-in property. In contrast, for VPA involved Si paste, because VPA can evaporate at relatively lower temperature, residue of VPA including carbon can be negligible. Unless there is Si oxidation issue, the curing temperature dependency of Rsh thus can be neglected. In addition to DSW method, more diffusion experiments are being carried out including method of utilizing amorphous Si for further evaluation of Si/VPA paste samples.

displayed in FIG. 18, both samples showed typical doping curves with slightly more diffusion in sample 1-540ad, which although did not show lower Rsh. In addition, both samples had similar doping depth, which is less than 0.5 microns. The diffusion profile data further confirms that drive-in behavior is not curing temperature dependency if samples are cured in $N_2$.

Example 4

Effects of Dopant Drive-In on Silicon Nanoparticle Pastes

This Example demonstrates the effects of dopant drive-in on the structure and composition of silicon nanoparticle pastes comprising VA.

To demonstrate the effects of dopant drive-in on the structure and composition of nanoparticle pastes, 4 wafer samples from above experiments (1-250n, 1-540n, 1-250nd, and 1-540nd) were used for further analysis. The wafer samples 1-250nd and 1-540nd were formed respectively from samples 1-250n and 1-540n followed dopant diffusion. For reference purpose, the wafer samples 1-250n and 1-540n were again prepared as previously described. After preparation, all the film samples were not BOE wet-etched and particle film layers were retained for characterization. Scanning electron microscopy (SEM) and X-ray Photoelectron Spectroscopy (XPS) were performed to characterize structure and composition of these samples. Before data collection, the particle film layer was dry-etched in XPS vacuum chamber to remove the very top layer of the film. In particular. Ar plasma with energy of 2 keV was applied for 1-min etching to remove a thin layer (<1 nm) so that impact of post-experimental contamination of O and C was reduced. Therefore, the surface composition of Si particles located within top layers of Si particulate film was analysis.

TABLE 4

| Film ID | Sample 1-540ad | | Sample 1-250ad | | Sample 1-540nd | | Sample 1-250nd | |
| --- | --- | --- | --- | --- | --- | --- | --- | --- |
| Paste | Sample 1 (P-doped Si paste) | | | | | | | |
| Substrate | n-Type Si wafer | | | | | | | |
| Curing Parameters | 540° C. × 5 min Air | | 250° C. × 5 min Air | | 540° C. × 5 min $N_2$ | | 250° C. × 5 min $N_2$ | |
| Drive-In Parameters | 1000° C. × 1 hr in $N_2$ with Neytech Qex furnace | | | | | | | |
| DWS Wafer Configuration | Film Center | Top Bare Wafer | Film Center | Top Bare Wafer | Film Center | Top Bare Wafer | Film Center | Top Bare Wafer |
| 4PP (ohm) | 47 | 58 | 28 | 21 | 16 | 18 | 16 | 17 |
|  | 47 | 65 | 29 | 29 | 17 | 18 | 16 | 17 |
|  | 47 | 56 | 27 | 25 | 16 | 19 | 16 | 17 |
|  | 50 | 53 | 26 | 26 | 17 | 17 | 17 | 17 |
|  | 45 | 64 | 28 | 29 | 17 | 18 | 16 | 18 |
| 4PP average (ohm) | 47.2 | 59.2 | 27.6 | 26 | 16.6 | 18 | 16.2 | 17.2 |
| 4PP standard deviation | 1.8 | 5.2 | 1.1 | 3.3 | 0.5 | 0.7 | 0.4 | 0.4 |
| Rsh (ohm/sq) | 207.7 | 260.5 | 121.4 | 114.4 | 73 | 79.2 | 71.3 | 75.7 |

Figure 19:
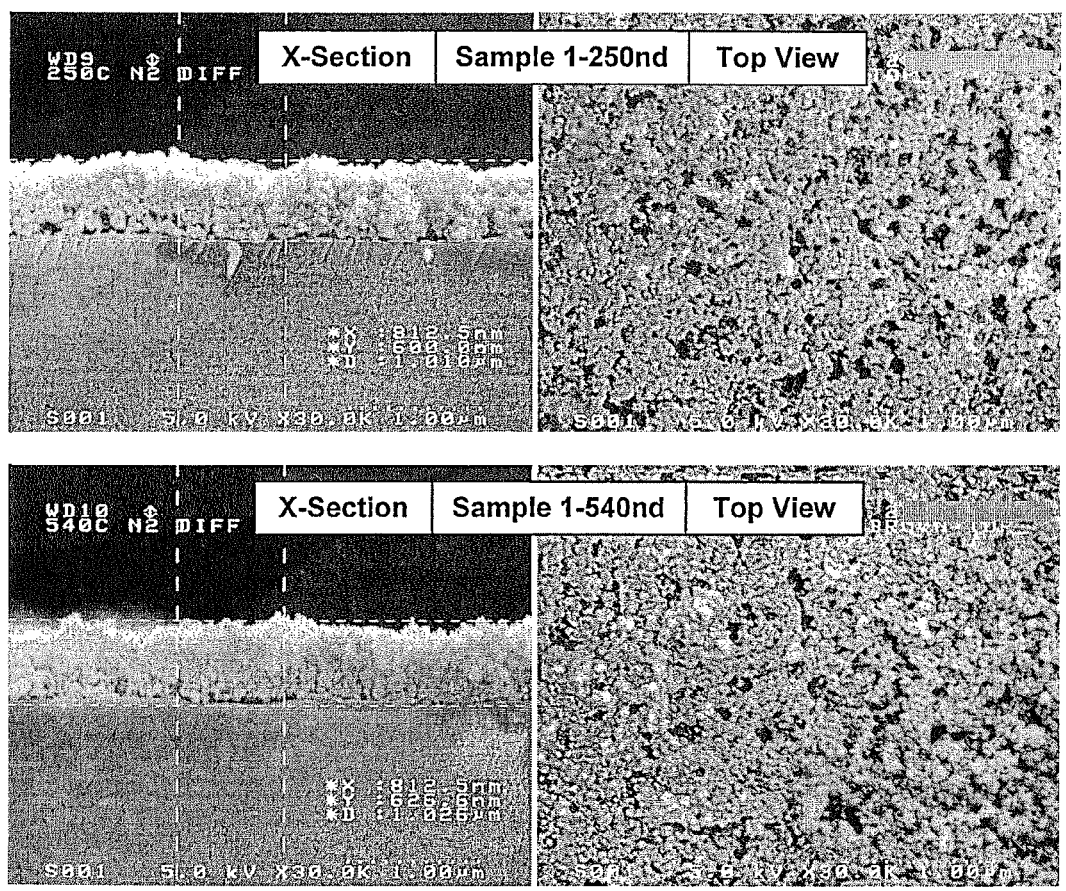
FIG. 19 is a composite of SEM images of cross sections (left column) and top views (right column) of a nanoparticle paste coated wafer taken after dopant drive-in on the cured, coated wafers depicted in the top two rows of FIG. 8.

FIG. 18 is SIMS graph showing plots of phosphorous concentration (dopant profile) versus depth from the silicon wafer surface for wafer samples 1-250nd and 1-540nd. As mentioned above, due to the difficulty to pin-point the exact original wafer surface, only rough estimation based on dopant concentration change was applied for determination of doping depth and wafer surface dopant concentration. The surface resistance of wafer samples 1-250nd and 1-540nd were both about 70 ohm/sq., as measured using a four point probe shown in Table 4. Referring to the dopant profiles FIG. 19 top and bottom rows are composites of SEM cross-section and top-view images of wafer samples 1-250nd and 1-540nd, respectively, obtained after dopant drive-in. Comparison of images of sample 1-250n (FIG. 8) and sample 1-250nd (FIG. 19) or sample 1-540n (FIG. 8) and sample 1-540nd (FIG. 19) does not reveal significant difference of film thickness and porosity after high-temperature drive-in process. Although sample 1-250nd slightly had thickness reduction (~50 nm) compared with sample 1-250n, the difference can be neglected within the uniformity variation (reference: one Si particle is 20 nm). However, more characterizations including high-resolution transmission electron microscopy are being carried out to reveal other possible film structure difference such as change of Si particle size and interface morphology between particle layer and wafer substrate. Interestingly, comparison between images of samples 1-250nd and 1-540nd in FIG. 19 does not show curing temperature impact on Si particulate films, which is consistent with the results in the previous examples. In particular, from cross-section images, two samples had similar thickness 600 nm (sample 1-250nd) and 626 nm (sample 1-540n), within uniformity and measurement error. Similarly, top-view images also do not show much difference of top morphology and film porosity. The results are likely attributed by the easiness of VPA removal meaning majority of VPA can be removed at low temperature such as 250° C. From this aspect, curing at higher temperature such as 540° C. is unnecessary.

TABLE 5

| Line and Line Assignment | | Sample 1-250nd | | Sample 1-540nd | |
|---|---|---|---|---|---|
| | | BE (eV) | AC (at %) | BE (eV) | AC (at %) |
| C 1s | Si—C | 283.6 | 2.09 | 283.6 | 2.09 |
| | C—C, H | 285.2 | 2.02 | 285.1 | 2.07 |
| | C—O | 286.9 | 0.61 | 286.8 | 0.64 |
| O 1s | Si—O | 533.1 | 40.45 | 533.0 | 38.5 |
| Si 2p3/2 | Si | 99.8 | 30.83 | 99.8 | 32.8 |
| | Si—C, P, N | 100.7 | 3.08 | 100.7 | 4.54 |
| | Si—O | 102.0 | 4.31 | 102.1 | 4.6 |
| | SiO2 | 103.8 | 15.96 | 103.8 | 14.31 |
| P 2p3/2 | Si—P, P(0) | 129.4 | 0.65 | 129.4 | 0.44 |

Table 5 has the XPS results displaying the main composition of nanoparticle layers. In the Table, "BE" refers to the binding energy and "AC" refers element atomic percentage. Comparison of sample 1-250nd and 1-540nd shows that for the wafer samples tested, total carbon concentration of nanoparticles layers is relatively independent of cure temperature. In particular, both sample 1-250nd (250° C. cure in $N_2$ plus drive-in) and sample 1-540nd (540° C. cure in $N_2$ plus drive-in) had carbon concentration on Si nanoparticle surface about 4 at %. Similarly, data from O(1 s) and Si(2 p) also shows independence of curing temperature within experimental error. It is noted that P concentration in sample 1-250nd (0.65 at %) is slightly higher than that in sample 1-540nd (0.44 at %). The difference is consistent with SIMS data shown in FIG. 18, which showed sample 1-540nd had slightly more dopant on the wafer surface. Nevertheless, similar Rsh values were achieved from these two samples.

Example 5

Dopant Drive-In Performance of Silicon Nanoparticle Pastes with VPA with Capping Layers This Example demonstrates the doping performance of VPA inks with an amorphous silicon capping layer.

To demonstrate dopant drive in performance, coated wafers were prepared with capping layers. Doped silicon nanoparticle pastes were prepared as described above in Example 1 with both phosphorous and boron dopants. Two different ink types were tested. A first ink type ("Type I") and a second ink type ("Type II") were specifically formulated for print performance with an average thickness of roughly 300 nm to 500 nm with the Type I ink comprising somewhat lower nanoparticle concentration with a phosphorous or boron dopant. The Type I ink consisted of 80 wt % VPA, 17.5 wt % PG, and 2.5 wt % doped silicon nanoparticles relative to the paste. The Type II ink consisted of 65 wt % VPA, 30 wt % PG and 5 wt % doped silicon nanoparticles relative to the paste. The Type I and Type II pastes had viscosities of 1.37 Pa·S and 0.56 Pa·S at 150 s$^{-1}$, respectively. The silicon nanoparticles had an average primary particle diameter of about 20 nm and 2 to 4 atomic percent dopant. The inks were screen print on silicon wafer substrates, and the ink layers were then cured by heating the ink coated wafers in an oven in an air or nitrogen atmosphere at 400° C. for 5 minutes. The thickness of the ink layers were estimated by using screen print recipes known to produce ink layers with the target thicknesses as measured using a profilometer (α-Step™ 300, KLA Tencore) and SEM. In particular, in order to obtain thickness measurements, a given ink recipe was used to form a dried ink layer on a polished wafer substrate. A stylus in contact with the dried ink layer was then scanned horizontally over a distance of about 0.5 mm to about 1 mm on the dried ink layer and the vertical displacement of the stylus was recorded. A scribe was performed to create a step.

Following drying, for some samples, an amorphous silicon capping layer was deposited on the dried ink layers using low pressure chemical vapor deposition (LPCVD). LPCVD was used to deposit an amorphous silicon matrix around the particles in the ink layers of ink coated substrates. The LPCVD process was performed at a commercial vendor and comprised depositing amorphous silicon on the surface of the ink coated substrate under an atmosphere of silane at flow rate of 150 standard cubic centimeters per minute (sccm) and 200 mTorr pressure in a horizontal quartz tube furnace at a temperature of 525° C. for 90 min. Growth rate of amorphous silicon in these conditions is approximately 1 nm/min, corresponding to 90 nm of amorphous silicon on polished wafers and 80-100 nm on top of ink layer based on cross section SEM. The amorphous silicon capping layers were deposited to have a target thickness of 50 nm or 100 nm on top of the ink layer. Deposition of the amorphous silicon capping layer and subsequent processing is further described in the '806 application cited above.

Figure 20:
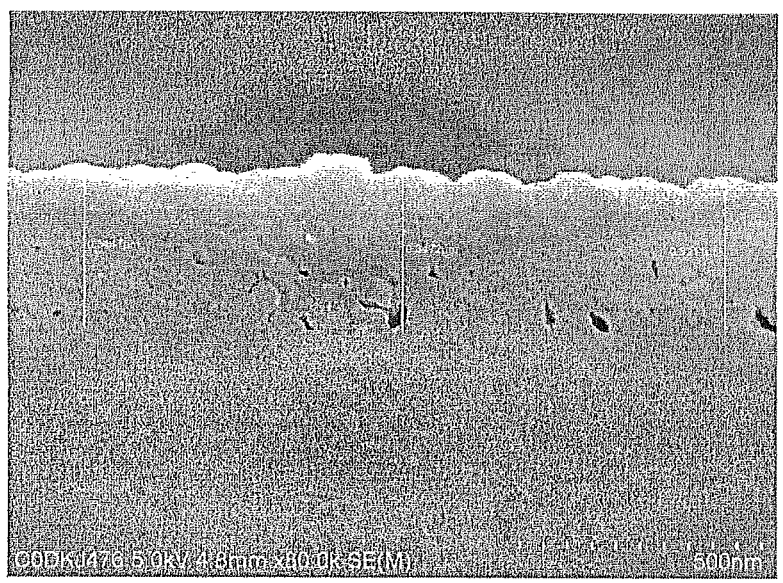
FIG. 20 is an SEM micrograph of a cross sectional view of printed nanoparticle paste following annealing of the nanoparticles with an amorphous silicon cap in which the paste forming the initial printed line had 2.5 wt % boron doped nanoparticles.
Figure 21:
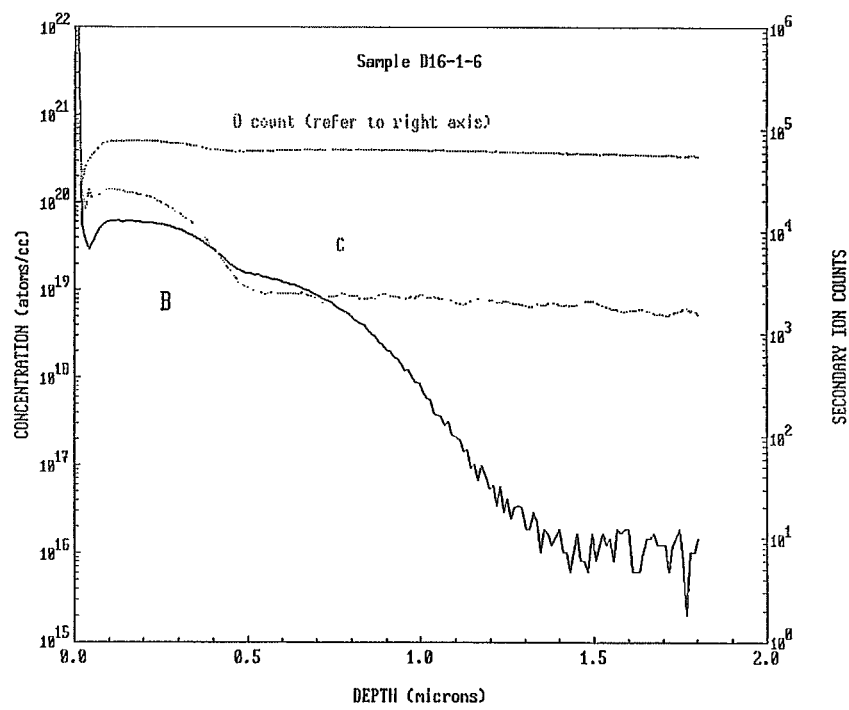
FIG. 21 is a plot of SIMS data used to obtain the dopant depth of the annealed doped line of FIG. 20 with relative amounts of carbon and oxygen as a function of depth plotted on the right axis.
Figure 22:
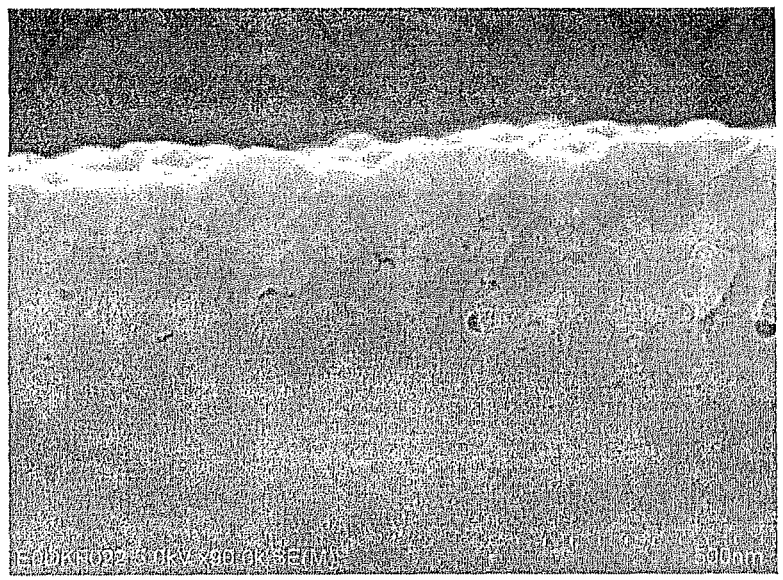
FIG. 22 is an SEM micrograph of a cross sectional view of printed nanoparticle paste following annealing of the nanoparticles with an amorphous silicon cap in which the paste forming the initial printed line had 5 wt % boron doped nanoparticles.
Figure 23:
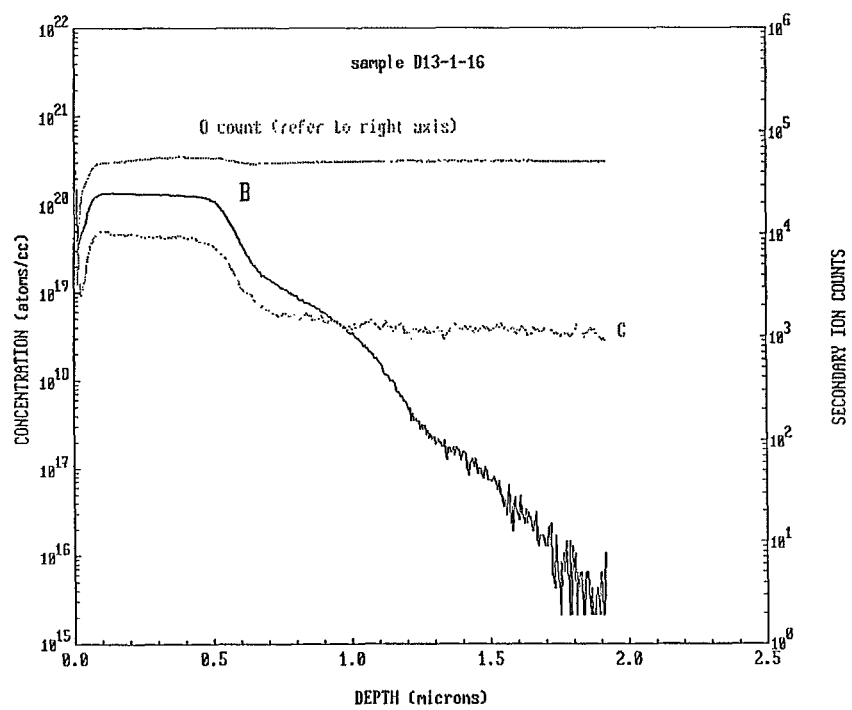
FIG. 23 is a plot of SIMS data used to obtain the dopant depth of the annealed doped line of FIG. 22 with relative amounts of carbon and oxygen as a function of depth plotted on the right axis.
Figure 24:
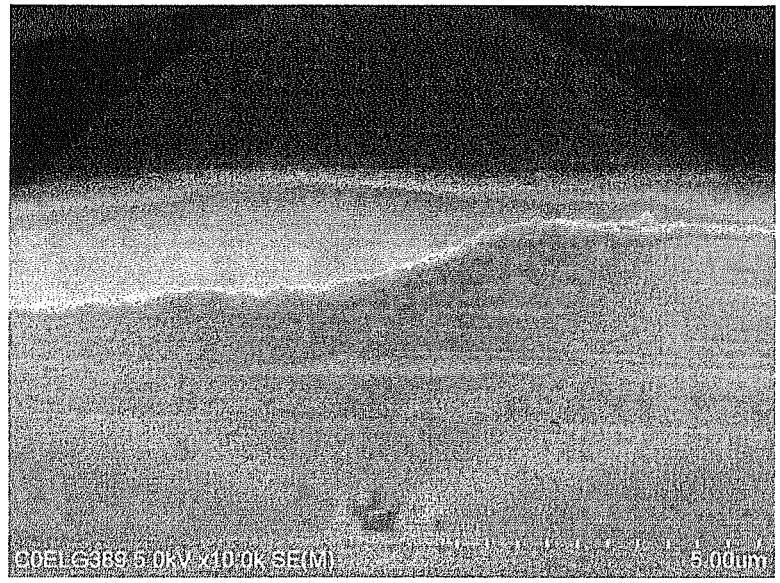
FIG. 24 is an SEM micrograph of a cross sectional view of printed nanoparticle paste following annealing of the nanoparticles with an amorphous silicon cap in which the paste forming the initial printed line had 2.5 wt % phosphorous doped nanoparticles.
Figure 25:
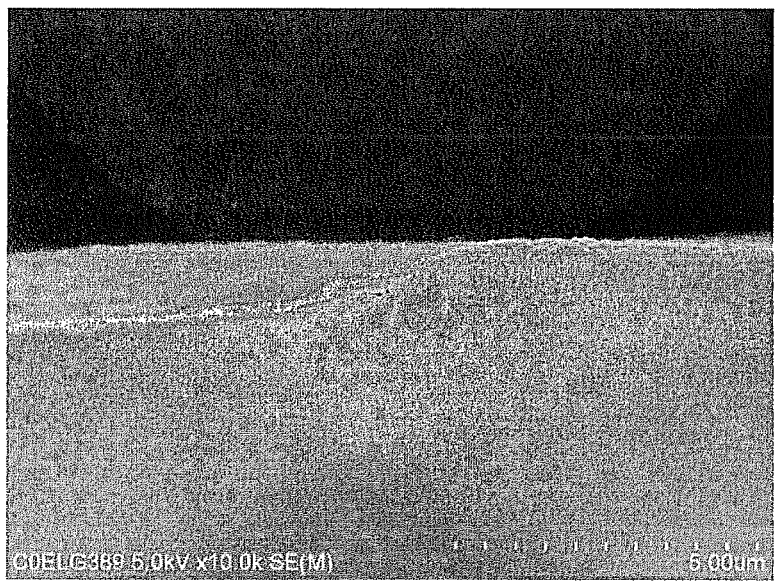
FIG. 25 is an SEM micrograph of a cross sectional view of printed nanoparticle paste following annealing of the nanoparticles with an amorphous silicon cap in which the paste forming the initial printed line had 5 wt % phosphorous doped nanoparticles.
Figure 26:
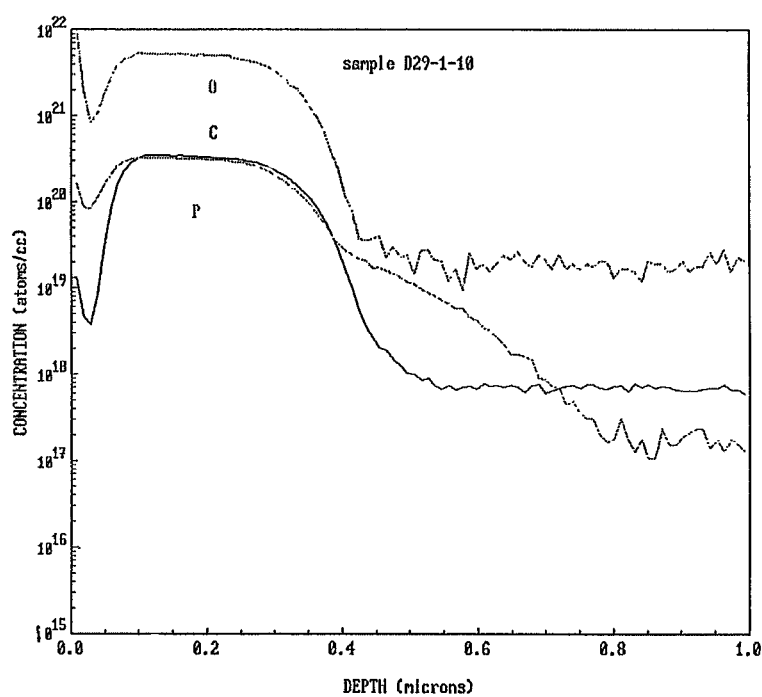
FIG. 26 is a plot of SIMS data used to obtain the dopant depth of the annealed doped line of FIG. 25 with relative amounts of carbon and oxygen as a function of depth plotted on the right axis.

Sample wafers with an amorphous Si capping layer were subjected to heating in an oven to perform dopant drive in as described in Example 3. For boron doped inks, SEM micrographs of cross sections of the wafers as well as SIMS data of dopant drive in are shown in FIGS. 20-21 (Type I ink) and 22-23 (Type II ink). Both inks formed a uniform layer on the wafer surface, and some voids were present in the fused films after the dopant drive in. The Type II inks resulted in a decrease in carbon and an increase in dopant drive in as well as a greater surface dopant concentration. For phosphorous doped inks, SEM micrographs of cross sections of the wafers as well as SIMS data of dopant drive in for the Type II inks are shown in FIG. 24 (Type I ink) and FIGS. 25-26 (Type II ink).

Sample wafers with boron doped inks and amorphous silicon capping layers where subjected to dopant drive-in under varying conditions with heating in an oven to test resulting sheet resistance values. Nanoparticle inks had either 2.5 wt percent nanoparticles (Type II ink) or 5 wt % nanoparticles (Type III ink). The inks were processed as generally described above in Example 3 except that the wafers were not stacked. An initial bake at 400° C. was performed either in air or under nitrogen, a capping layer of 50 nm or 100 nm was used, and anneal times at 1000° C. were performed for 15 minutes or 60 minutes.

Following dopant drive-in, Rsh measurements were taken, as described in Example 3. The Rsh values were measured at different locations along the surface. Sheet resistances for films formed with the Type III inks obtained with a 50 nm capping layer and 60 minute anneal times generally had sheet resistances from roughly 33 ohm/sq to 36 ohm/sq. Results were obtained for the Type II inks over a wider range of conditions. All of the films formed with the Type 11 inks had sheet resistances from 48 ohm/sq. to 34 ohm/sq with no significant differences with films baked in ambient air versus nitrogen, 100 nm cap versus 50 nm cap or 15 min anneal versus 60 min anneal. Other samples for comparison were subjected to the processing without the initial heating step to condense the samples, although a three minute bake at 85° C. was used to dry the sample. The sheet resistances for these samples were from 66 ohms/sq to 83 ohms/sq, and the results were not particularly sensitive to the time of the anneal step or the thickness of the amorphous silicon cap.

The specific embodiments above are intended to be illustrative and not limiting. Additional embodiments are within the broad concepts described herein. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A nanoparticle ink comprising from about 0.001 weight percent to about 30 weight percent silicon/germanium based nanoparticles, at least about 10 weight percent of a viscous polycyclic alcohol, wherein the viscous polycyclic alcohol has a boiling point of no more than about 450° C. and non-Newtonian rheology.

2. The nanoparticle ink of claim 1 wherein the viscous polycyclic alcohol has 7-25 carbon atoms.

3. The nanoparticle ink of claim 1 wherein the viscous polycyclic alcohol comprises a norbornyl bicyclo moiety.

4. The nanoparticle ink of claim 1 wherein the viscous polycyclic alcohol is selected from the group consisting of vinylnorbornyl alcohol, C-8 substituted 1,5-dimethyl-bicyclo[3.2.1]octane-8-ols with ethyl, methyl, n-propyl, i-propyl, n-butyl, 1-methyl-propyl, 2-methyl-propyl, allyl, n-hexyl, 3-methyl butyl, cyclopentyl or cyclohexyl substitutions, isobornyl cyclohexane diol, trimethyl-2,2,3-norbornyl-5-(-3-cyclohexanol-1), 3-(5,5,6 trimethyl bicyclo[6.4.0.1]heptan-2-yl)cyclohexanol, 11-hydroxy-2,13,13-trimethyl-tricyclo[6.4.0.1$^{2,5}$]tridecane and combinations thereof.

5. The nanoparticle ink of claim 1 further comprising no more than about 0.1 weight percent polymer.

6. The nanoparticle ink of claim 1 further comprising no more than about 100 ppb transition metal contamination.

7. The nanoparticle ink of claim I wherein the silicon/germanium based nanoparticles comprise doped elemental silicon nanoparticles having an average primary particle size of no more than about 50 nm.

8. The nanoparticle ink of claim 1 comprising at least about 0.5 weight percent elemental silicon nanoparticles and having a viscosity of at least about 1 Pa·s at a shear of 2 s$^{-1}$.

9. The nanoparticle ink of claim 1 wherein the nanoparticles have a dopant level of at least about 0.5 atomic percent.

10. The nanoparticle ink of claim 1 comprising vinylnorbornyl alcohol, C-8 substituted 1,5-dimethyl-bicyclo[3.2.1]octane-8-ols with ethyl, methyl, n-propyl, i-propyl, n-butyl, 1-methyl-propyl, 2-methyl-propyl, allyl, n-hexyl, 3-methyl butyl, cyclopentyl or cyclohexyl substitutions, isobornyl cyclohexane diol, trimethyl-2,2,3-norbornyl-5-(-3-cyclohexanol-1), 3-(5,5,6 trimethyl bicyclo[6.4.0.1]heptan-2-yl) cyclohexanol, 11-hydroxy-2,13,13-trimethyl-tricyclo[6.4.0.1$^{2,5}$]tridecane and combinations thereof and having a transition metal contamination of no more than about 100 ppb.

11. The nanoparticle ink of claim 1 having from about 0.1 weight percent to about 20 weight percent silicon nanoparticles.

12. The nanoparticle ink of claim I having from about 20 weight percent to about 80 weight percent polycyclic alcohol.

13. The nanoparticle ink of claim 1 having from about 30 weight percent to about 80 weight percent polycyclic alcohol.

14. The nanoparticle ink of claim 13 further comprising terpineol.

15. The nanoparticle ink of claim 1 further comprising terpineol.

16. The nanoparticle ink of claim 1 further comprising no more than about 0.1 weight percent solvent boiling below 165° C.

17. The nanoparticle ink of claim 1 having a ratio of the viscosity at a shear of 2 s$^{-1}$ to the viscosity at a shear of 1000 s$^{-1}$ from about 2.5 to about 50.

* * * * *

UNITED STATES PATENT AND TRADEMARK OFFICE
CERTIFICATE OF CORRECTION

PATENT NO. : 9,475,695 B2  
APPLICATION NO. : 14/282216  
DATED : October 25, 2016  
INVENTOR(S) : Weidong Li et al.

Page 1 of 1

It is certified that error appears in the above-identified patent and that said Letters Patent is hereby corrected as shown below:

In the Claims

Column 52, Claim 7, Line 8, please delete "claim I" and insert --claim 1--.

Column 52, Claim 10, Line 23, please delete "norbomyl" and insert --norbonyl--.

Column 52, Claim 12, Line 32, please delete "claim I" and insert --claim 1--.

Signed and Sealed this  
Twenty-fourth Day of October, 2017

Joseph Matal  
*Performing the Functions and Duties of the*  
*Under Secretary of Commerce for Intellectual Property and*  
*Director of the United States Patent and Trademark Office*